(12) United States Patent
Iwata et al.

(10) Patent No.: US 7,035,137 B2
(45) Date of Patent: Apr. 25, 2006

(54) SEMICONDUCTOR MEMORY DEVICE HAVING MEMORY CELLS INCLUDING FERROMAGNETIC FILMS AND CONTROL METHOD THEREOF

(75) Inventors: Yoshihisa Iwata, Yokohama (JP); Kentaro Nakajima, Tokyo (JP); Masayuki Sagoi, Yokohama (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 10/807,454

(22) Filed: Mar. 24, 2004

(65) Prior Publication Data
US 2005/0036362 A1  Feb. 17, 2005

(30) Foreign Application Priority Data
Mar. 24, 2003 (JP) ............................. 2003-080587

(51) Int. Cl.
  *G11C 11/00* (2006.01)
  *G11C 7/04* (2006.01)
(52) U.S. Cl. ...................................... 365/158; 365/211
(58) Field of Classification Search ................ 365/158, 365/171, 173, 211
See application file for complete search history.

(56) References Cited

U.S. PATENT DOCUMENTS

| | | |
|---|---|---|
| 5,940,319 A | 8/1999 | Durlam et al. |
| 5,946,228 A | 8/1999 | Abraham et al. |
| 5,956,267 A | 9/1999 | Hurst et al. |
| 6,005,800 A | 12/1999 | Koch et al. |
| 6,072,718 A | 6/2000 | Abraham et al. |
| 6,104,633 A | 8/2000 | Abraham et al. |
| 6,314,020 B1 | 11/2001 | Hansen et al. |
| 6,459,627 B1 | 10/2002 | Sakamoto et al. |
| 6,476,753 B1 | 11/2002 | Hansen et al. |

(Continued)

FOREIGN PATENT DOCUMENTS

JP  8-306014  11/1996

(Continued)

OTHER PUBLICATIONS

Manoj Bhattacharyya, et al., "Thermal Variations in Switching Fields for Sub-Micron MRAM Cells" IEEE Transactions on Magentics, vol. 37, No. 4, Jul. 2001, pp. 1970-1972.

(Continued)

*Primary Examiner*—Trong Phan
(74) *Attorney, Agent, or Firm*—Oblon, Spivak, McClelland, Maier & Neustadt, P.C.

(57) ABSTRACT

A semiconductor memory device comprises word lines, bit lines, memory cells, a row decoder, a column decoder, and a write circuit. The word lines are formed along a first direction. The bit lines are formed along a second direction. Memory cells include magneto-resistive elements and are arranged at intersections of the word lines and the bit lines. The row decoder selects at least one of the word lines. The column decoder selects at least one of the bit lines. The write circuit supplies first and second write currents to a selected word line and selected bit line respectively and writes data into a selected memory cell arranged at the intersection of the selected word line and the selected bit line. The write circuit changes the current values of the first and second write currents according to a temperature change.

21 Claims, 43 Drawing Sheets

U.S. PATENT DOCUMENTS

| | | | |
|---|---|---|---|
| 6,577,549 B1 * | 6/2003 | Tran et al. | 365/211 |
| 6,603,678 B1 * | 8/2003 | Nickel et al. | 365/171 |
| 6,606,262 B1 * | 8/2003 | Perner | 365/158 |
| 6,611,454 B1 * | 8/2003 | Hidaka | 365/171 |
| 6,657,889 B1 * | 12/2003 | Subramanian et al. | 365/158 |
| 6,687,178 B1 * | 2/2004 | Qi et al. | 365/211 |

FOREIGN PATENT DOCUMENTS

| | | |
|---|---|---|
| JP | 2003-173672 | 6/2003 |
| JP | 2003-257175 | 6/2003 |
| WO | WO 00/10172 | 2/2000 |

OTHER PUBLICATIONS

Takeshi Honda, et al. "MRAM-Writing Circultry to Compensate for Thermal-Varation of Magnetization-Reversal Current", 2002 Symposium on VLSI Circuits Digest of Technical Papers, Jun. 2002, pp. 156-157.

U.S. Appl. No. 10/807,454, filed Mar. 24, 2004, Iwata et al.

U.S. Appl. No. 11/052,810, filed Feb. 9, 2005, Iwata.

U.S. Appl. No. 10/465,616, filed Jun. 20, 2003, Iwata et al.

U.S. Appl. No. 10/702,662, filed Nov. 7, 2003, Iwata.

U.S. Appl. No. 10/728,917, filed Dec. 8, 2003, Shimizu et al.

U.S. Appl. No. 10/765,131, filed Jan. 28, 2004, Iwata et al.

Takeshi Honda et al., "MRAM-Writing Circuitry to Compensate for Therml-Variation of Magnetization-Reversal Current", 2002 Symposium On VLSI Circuits Digest of Technical Papers, IEEE Jun. 2002, pp. 156-157.

R. Scheuberlein, et al., 2000 IEEE International Solid-State Circuits Conference, Sesssion 7, TD: Emerging Memory & Device Technologies, paper TA 7.2, pp. 128-129, "A 10NS Read and Write Non-Volatile Memory Array Using a Magnetic Tunnel Junction and FET Switch in each cell", Feb. 2000.

K. Inomata, et al., Jpn. J. Appl. Phys., vol. 36, part 2, No. 108, pp. L 1380-L1383, "Spin-Dependent Tunneling Between a Soft Ferromagnetic Layer and Hard Magnetic Nanosize Particles", Oct. 15, 1997.

M. Sato, et al., Jpn. J. Appl. Phys., vol. 36, part 2, No. 28, pp. L 200-L 201, "Spin-Valve-Like Properties of Ferromagnetic Tunnel Junctions", Feb. 15, 1997.

M. Sato, et al., IEEE Transactions on Magnetics, vol. 33, No. 5, pp. 3553-3555, "Spin-Valve-Like Properties and Annealing Effect in Ferromagnetic Tunnel Junctions", Sep. 1997.

* cited by examiner

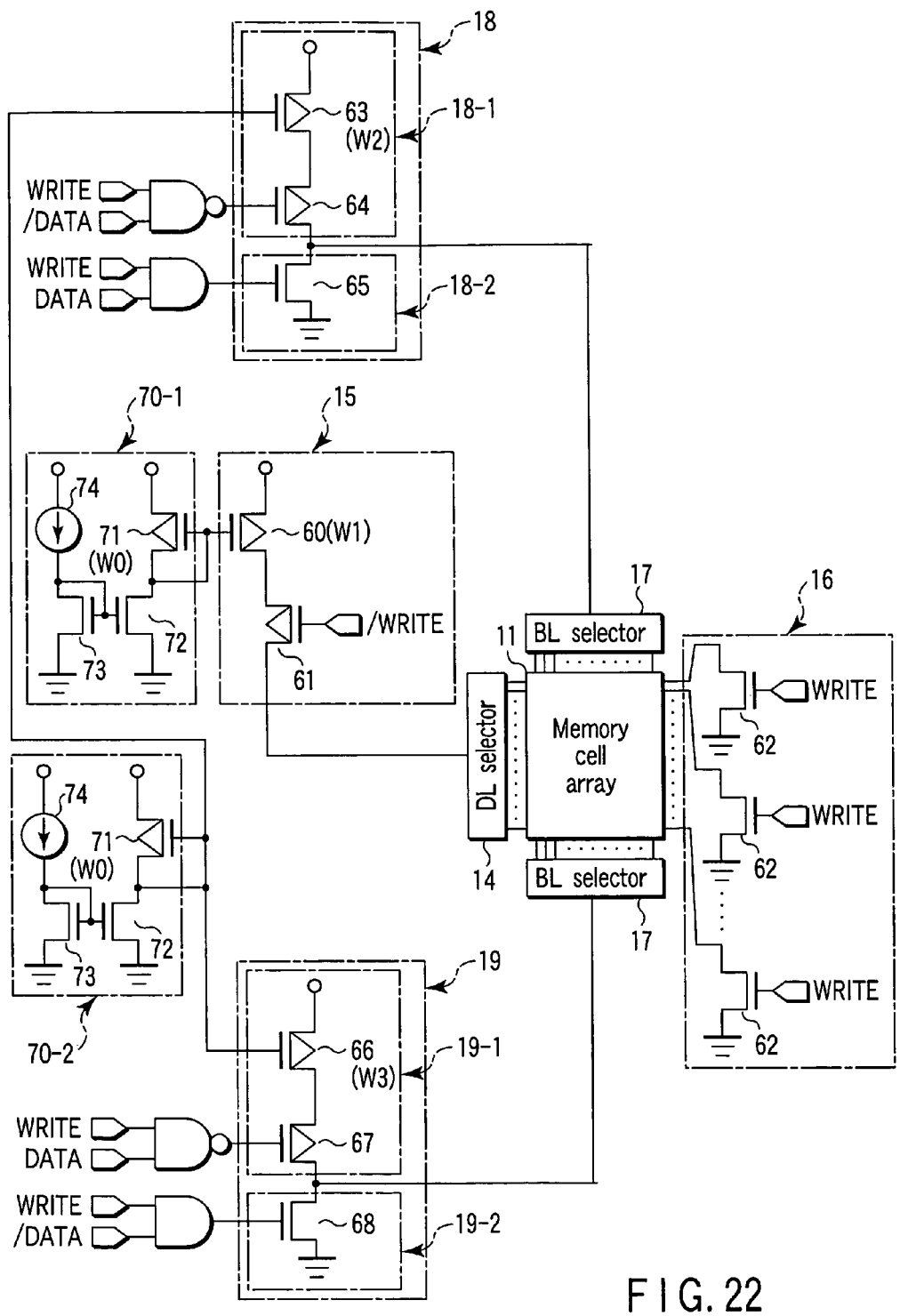
F I G. 22

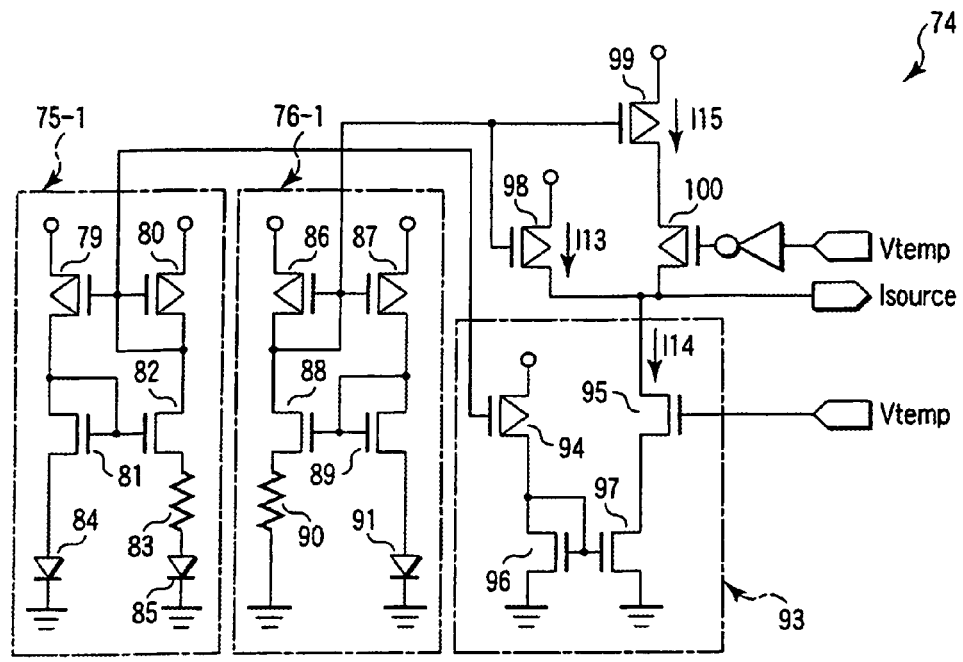
F I G. 28
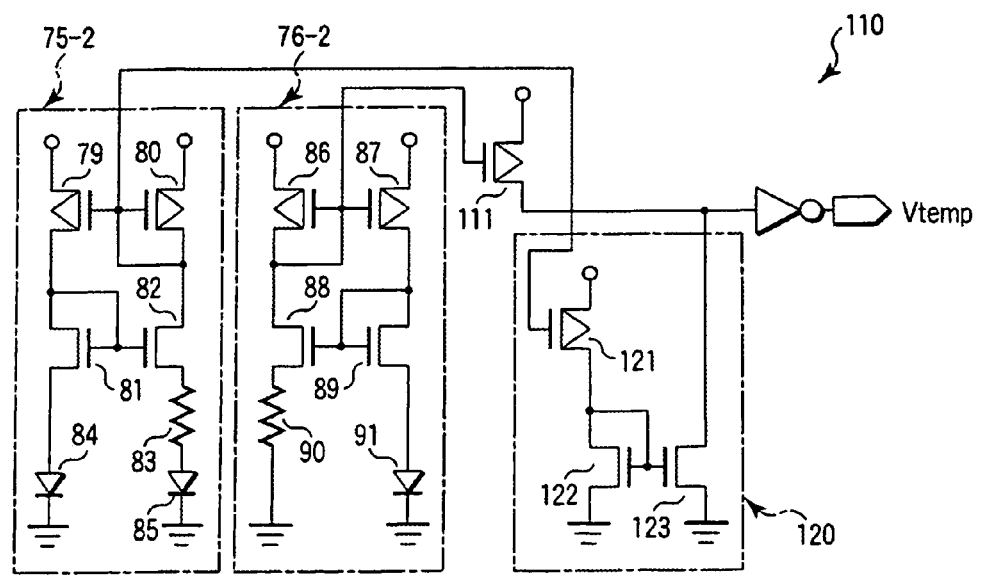
F I G. 29

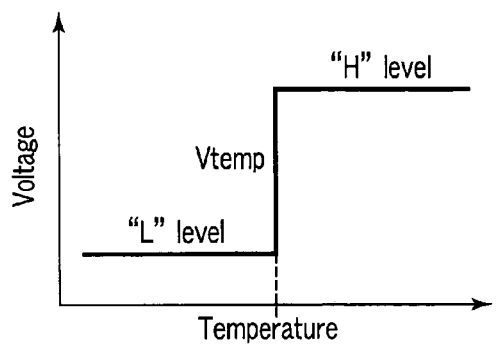
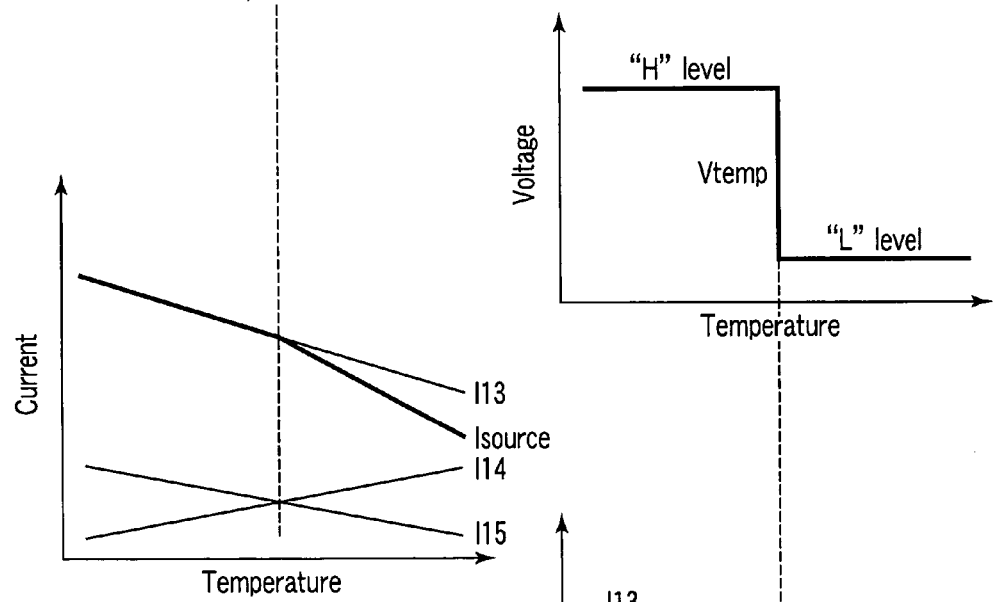
FIG. 30
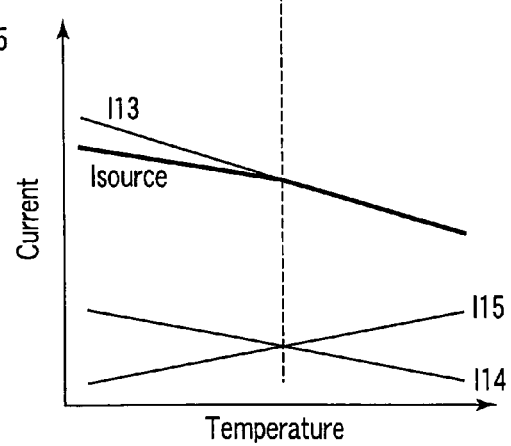
FIG. 33

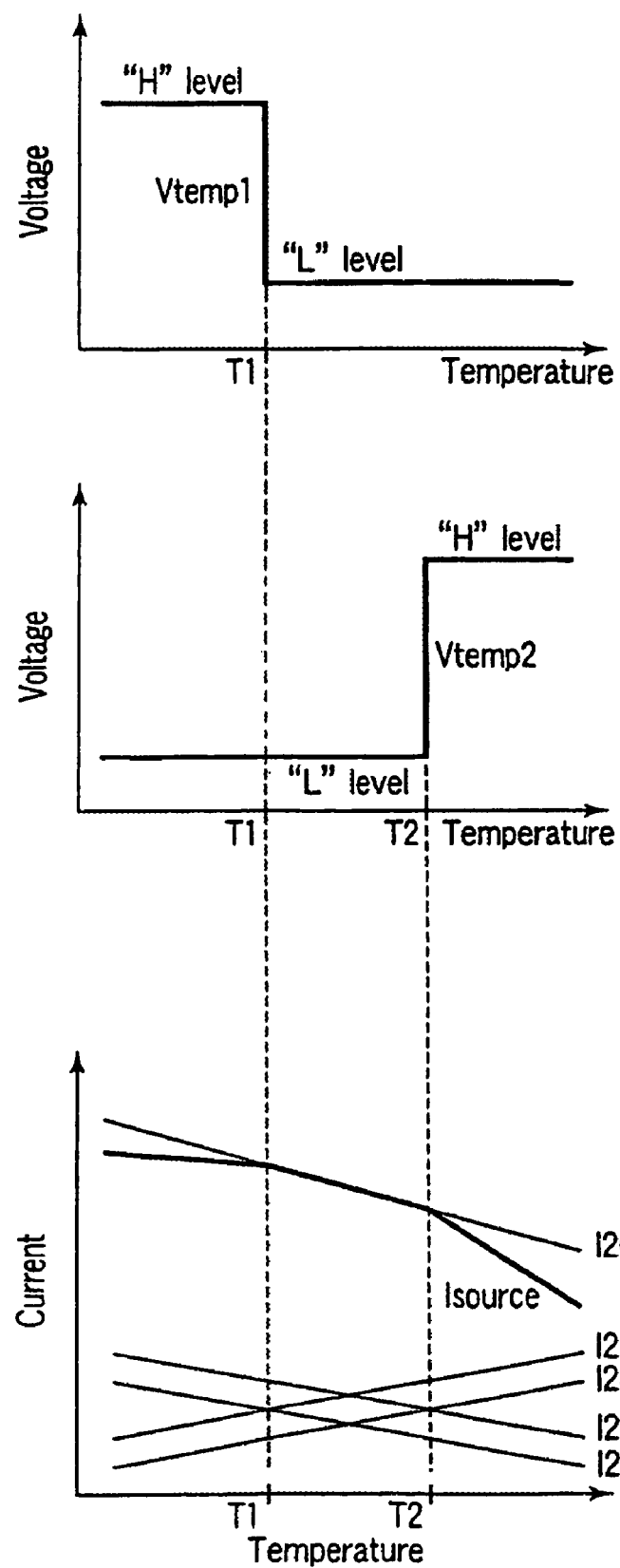
F I G. 37

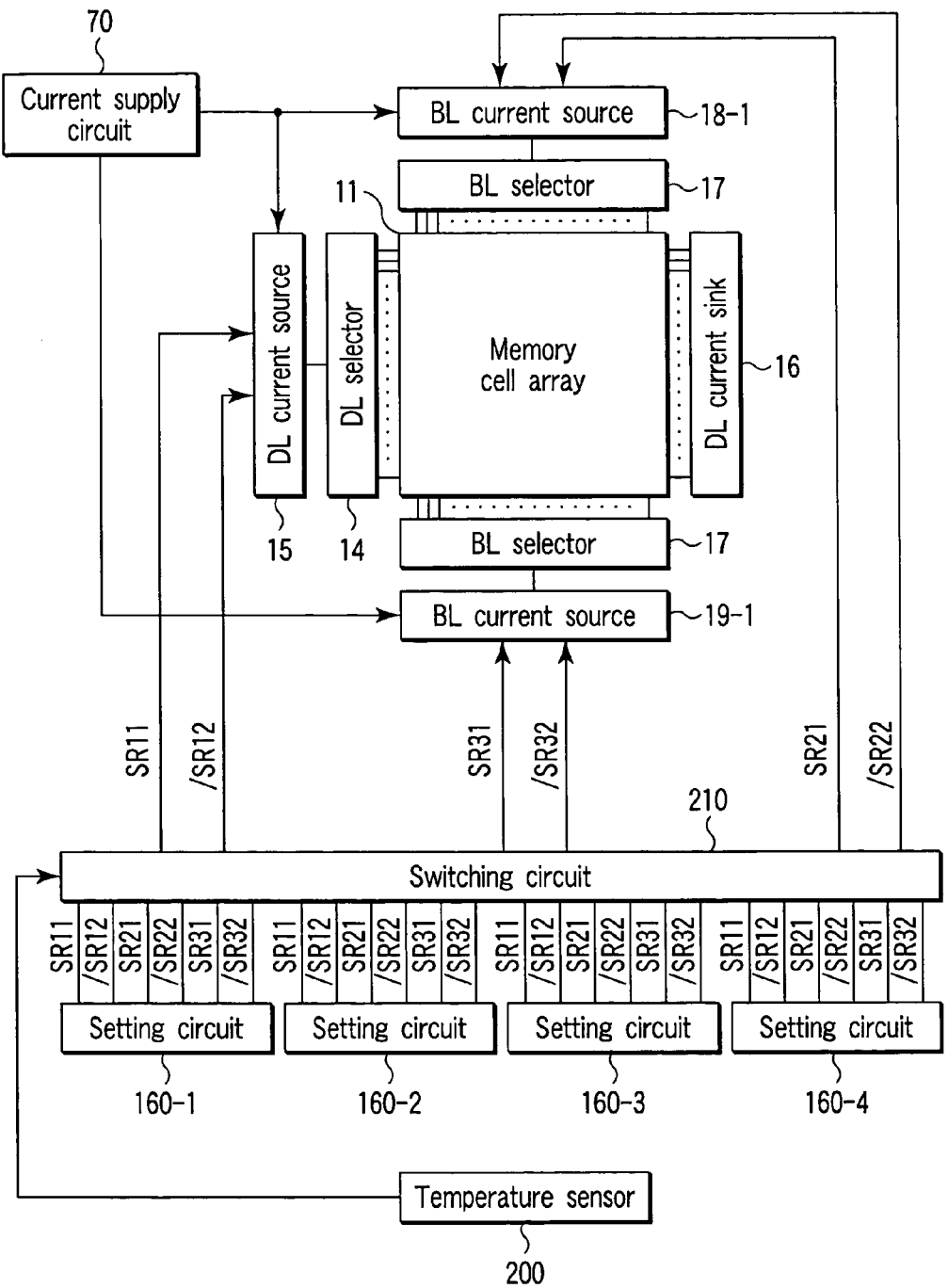
F I G. 44

| Temperature range | l1 | l2 |
|---|---|---|
| T1~T2 | lw1 | lb1 |
| T2~T3 | lw2 | lb2 |
| T3~T4 | lw3 | lb3 |
| T4~T5 | lw4 | lb4 |

FIG. 47

| Temperature range | l1 | l1/l2 |
|---|---|---|
| T1~T2 | lw1 | c10 |
| T2~T3 | lw2 | c20 |
| T3~T4 | lw3 | c30 |
| T4~T5 | lw4 | c40 |

FIG. 49

| Temperature range | l1 | l2("0" data) | l2("1" data) |
|---|---|---|---|
| T1~T2 | lw1 | lb10 | lb11 |
| T2~T3 | lw2 | lb20 | lb21 |
| T3~T4 | lw3 | lb30 | lb31 |
| T4~T5 | lw4 | lb40 | lb41 |

FIG. 48

| Temperature range | l1 | l1/l2("0" data) | l1/l2("1" data) |
|---|---|---|---|
| T1~T2 | lw1 | c11 | c12 |
| T2~T3 | lw2 | c21 | c22 |
| T3~T4 | lw3 | c31 | c32 |
| T4~T5 | lw4 | c41 | c42 |

FIG. 50

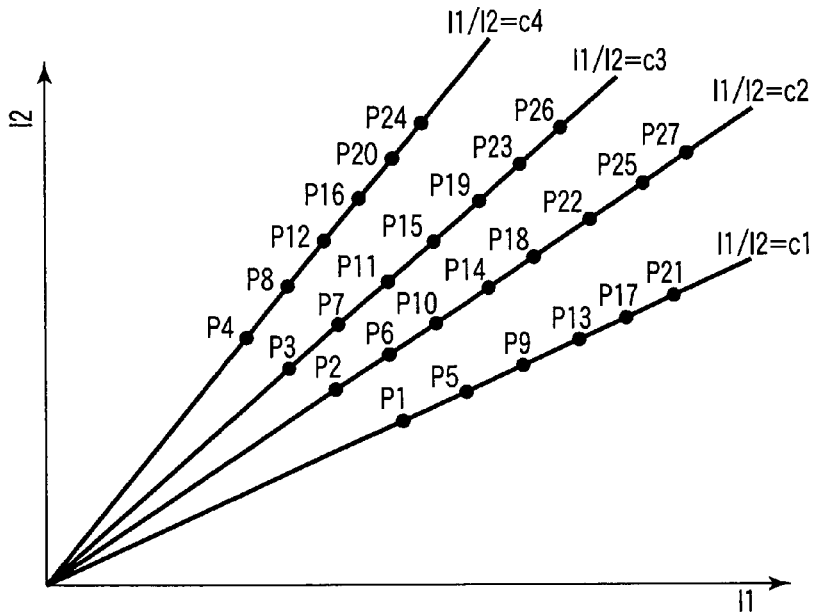
FIG. 52
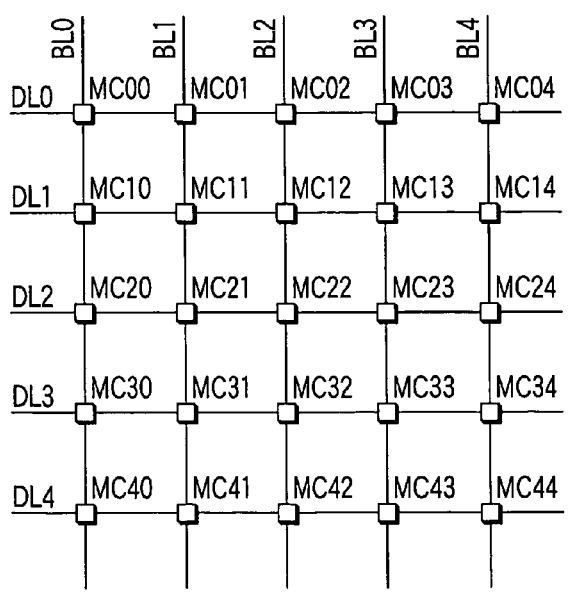
FIG. 53
| DL \ BL | 0 | 1 | 2 | 3 | 4 |
|---|---|---|---|---|---|
| 0 | "1" | "0" | "1" | "0" | "1" |
| 1 | "0" | "1" | "0" | "1" | "0" |
| 2 | "1" | "0" | "1" | "0" | "1" |
| 3 | "0" | "1" | "0" | "1" | "0" |
| 4 | "1" | "0" | "1" | "0" | "1" |
FIG. 54

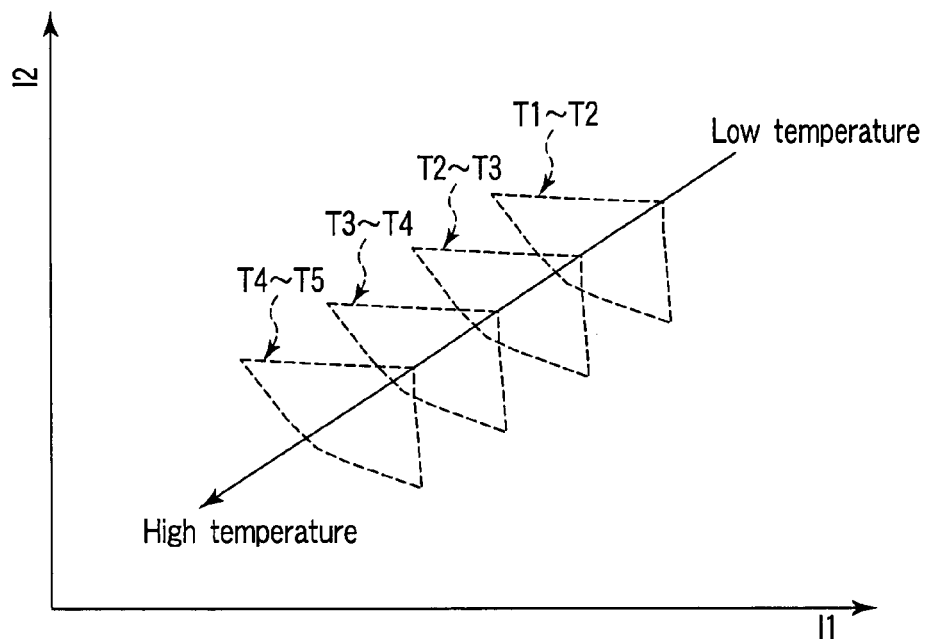
F I G. 57
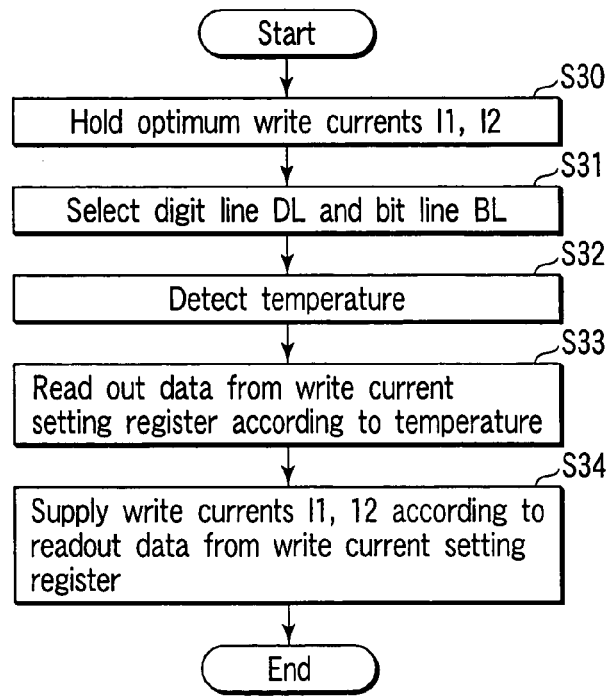
F I G. 58

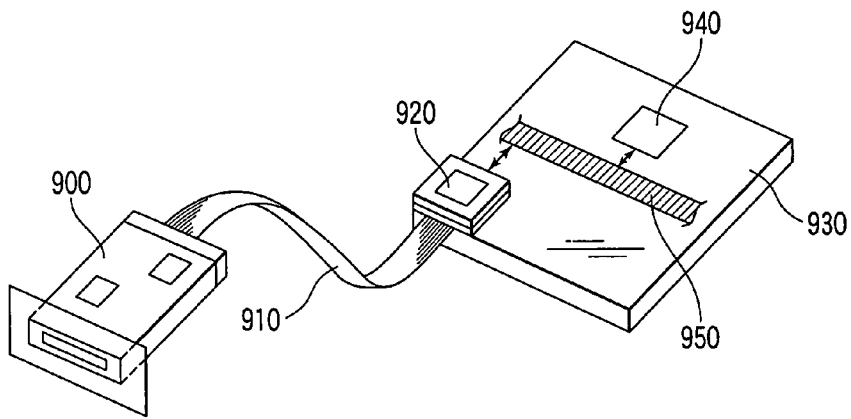
FIG. 76
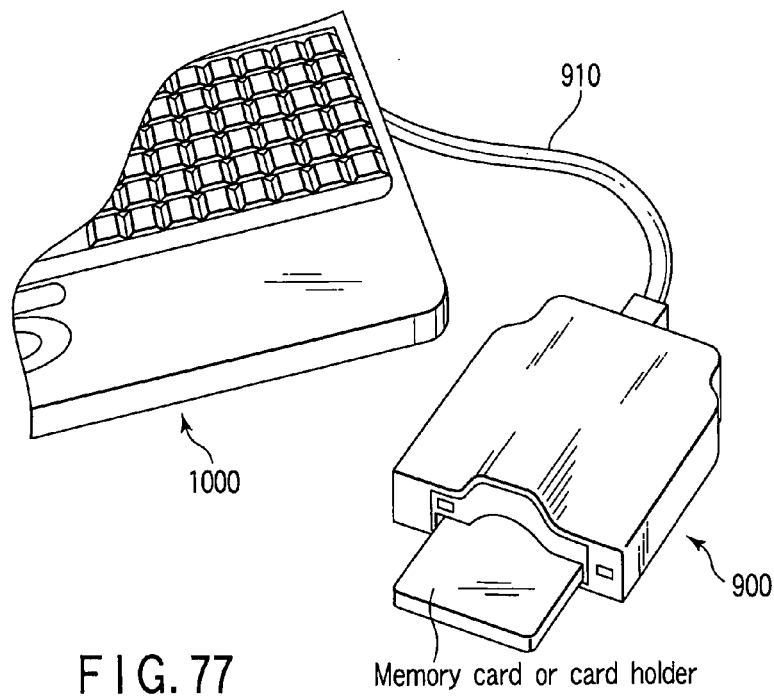
FIG. 77     Memory card or card holder

SEMICONDUCTOR MEMORY DEVICE HAVING MEMORY CELLS INCLUDING FERROMAGNETIC FILMS AND CONTROL METHOD THEREOF

CROSS-REFERENCE TO RELATED APPLICATIONS

This application is based upon and claims the benefit of priority from prior Japanese Patent Application No. 2003-080587, filed Mar. 24, 2003, the entire contents of which are incorporated herein by reference.

BACKGROUND OF THE INVENTION

1. Field of the Invention

This invention relates to a semiconductor memory device having memory cells including ferromagnetic films and a control method thereof. For example, this invention relates to a read operation of a magnetic random access memory (MRAM: Magneto resistive Random Access Memory).

2. Description of the Related Art

An MRAM is a device which performs a memory operation by selectively storing "1" or "0" information by use of the magneto-resistive effect. The MRAM has a nonvolatile property, high integration density, high reliability and high operation speed and is seen as a memory device which can be used instead of a conventional DRAM (Dynamic Random Access Memory), EEPROM (Electrically Erasable and Programmable Read Only Memory) or the like.

A memory cell in an MRAM has a structure which is formed by laminating a plurality of ferromagnetic films. Information is stored by setting binary information items to correspond to parallel or anti-parallel relative directions of magnetization of a plurality of ferromagnetic films configuring the memory cell. The write operation of the MRAM is performed by reversing the magnetization direction of the ferromagnetic films of each cell by use of a current magnetic field caused by passing a current through write lines arranged in a cross-stripe form. The MRAM is a nonvolatile memory in which the power consumption at the stored information holding state is zero in principle and the stored information holding operation is performed even if the power supply is turned OFF. The read operation of recorded information is performed by use of a phenomenon that the electrical resistance of the memory cell varies depending on a relative angle between the magnetization direction of the ferromagnetic film of the cell and the sense current or a relative angle between the magnetization directions of a plurality of ferromagnetic layers. The phenomenon is called the magneto-resistive effect.

For example, an MRAM has the following advantages if the function thereof is compared with that of the conventional semiconductor memory using a dielectric film.

(1) It is completely nonvolatile and $10^{15}$ or more rewrite operations can be attained.

(2) A nondestructive read operation can be performed and the restore operation is not required. Therefore, it is possible to shorten the readout cycle.

(3) It is highly resistant to radioactive radiation in comparison with a charge storage memory cell.

It is expected that the integration density per unit area of the MRAM and the write/read time thereof are approximately equal to those of the DRAM. Therefore, it is expected to apply the MRAM to external memory devices of portable instruments, use the same in a embedded form on an LSI or apply the same to main memories of personal computers by utilizing the nonvolatile property thereof.

In the MRAM which is being now studied for practical use, an element which exhibits a tunnel magneto-resistive effect (which is hereinafter referred to as a TMR effect) is used for the memory cell and it is described in "IEEE International Solid-State Circuits Conference 2000 Digest of Technical Papers" TA7.2, for example. The element which exhibits the TMR effect is configured by a three-layered film mainly including a ferromagnetic layer/insulating layer/ferromagnetic layer and a current tunnels and passes through the insulating layer. The tunnel resistance varies in proportion to the cosine of a relative angle between the magnetization directions of the two ferromagnetic metal layers and becomes maximum when the magnetization directions are anti-parallel. For example, in the case of the NiFe/Co/Al$_2$O$_3$/Co/NiFe tunneling junction (MTJ: Magneto Tunneling Junction), the magneto-resistive change rate of 25% or more in the low magnetic field of 50 Oe or less is detected. This is described in "IEEE Transactions on Magnetics", 1997, No. 33, p. 3553, for example.

Further, various proposals have been made so as to improve the characteristics of the MRAM using the MTJ element. For example, an MTJ structure in which an anti-ferromagnetic layer is arranged adjacent to one ferromagnetic layer and the magnetization direction is fixed so as to improve the magnetic field sensitivity is proposed in "Japanese Journal of Applied Physics" 1997, No. 36, p. 200. The MTJ structure is called a spin valve structure. Further, an MTJ structure having double tunnel barriers so as to improve the bias-dependency of the magneto-resistive change rate is proposed in "Japanese Journal of Applied Physics" 1997, No. 36, p. 1380. Further, a structure having a keeper layer or yoke structure which is formed of a magnetic material with high permeability around the wirings is proposed in U.S. Pat. Nos. 5,940,319, 5,956,267, European Patent Specification No. 00/10172 and Jpn. Pat. Appln. KOKAI Publication No. 8-306014. The structure is made to concentrate the magnetic field in a portion near the MTJ and reduce a write current by converging the magnetic flux in the keeper layer or yoke structure. Also, a structure in which the arrangement of wirings and MTJ are changed so as to reduce the write current is disclosed in U.S. Pat. Nos. 5,946,228, 6,072,718, 6,104,633 and 6,005,800. Further, the fact that the write threshold value of the magneto-resistive element has temperature dependency is described in "IEEE Transactions on Magnetics" 2001, No. 37, p. 1970 and "2002 Symposium on VLSI Circuit Digest of Technical Papers", 12-3.

As described above, conventionally, the MRAM is being actively studied as a next-generation memory device. However, the conventional MRAM has problems caused by interference between adjacent cells when the data is written into the memory cell.

In the conventional MRAM, a plurality of write lines are arranged to substantially intersect with one another and each MTJ element is arranged at an intersection of two write lines. Currents are supplied to two write lines connected to a selected memory cell at the write time. As a result, data is written into the selected memory cell by an influence of the resultant magnetic field due to the currents flowing in the two write lines. At this time, data may be written into a non-selected memory cell which is adjacent to the selected memory cell by an influence of the magnetic field applied to the selected memory cell in some cases.

BRIEF SUMMARY OF THE INVENTION

A semiconductor memory device according to an aspect of the present invention includes: word lines formed along a first direction; bit lines formed along a second direction which intersects the first direction; memory cells including magneto-resistive elements and arranged at intersections of the word lines and the bit lines; a row decoder which selects at least one of the word lines; a column decoder which selects at least one of the bit lines; and a write circuit which supplies first and second write currents to a selected word line and selected bit line selected by the row decoder and column decoder respectively and writes data into a selected memory cell arranged at the intersection of the selected word line and the selected bit line, the write circuit including first and second current sources whose supply currents have different temperature dependencies, the first and second current sources being set to be one of an enable state and a disable state in accordance with an ambient temperature, at least one of current values of the first and second write currents being controlled in accordance with the supply currents of the first and second current sources.

A control method of a semiconductor memory device according to an aspect of the present invention comprises:

holding data relating to optimum values of first and second write currents respectively supplied to one of a plurality of word lines formed along a first direction and one of a plurality of bit lines formed along a second direction which intersects the first direction to write data into one of memory cells which includes magneto-resistive elements and are respectively arranged at intersections of the word lines and the bit lines in a holding section according to temperatures;

detecting a temperature at a write time;

reading out data corresponding to the detected temperature from the holding section; and writing data into the memory cell by causing a word line current source and bit line current source to respectively supply first and second write currents of optimum values to the word line and bit line according to the data read out from the holding section.

A memory card according to an aspect of the present invention includes at least one semiconductor memory cell block, the semiconductor memory cell block including: word lines formed along a first direction; bit lines formed along a second direction which intersects the first direction; memory cells including magneto-resistive elements and arranged at intersections of the word lines and the bit lines; a row decoder which selects at least one of the word lines; a column decoder which selects at least one of the bit lines; and a write circuit which supplies first and second write currents to a selected word line and selected bit line selected by the row decoder and column decoder respectively and writes data into a selected memory cell arranged at the intersection of the selected word line and the selected bit line, the write circuit including first and second current sources whose supply currents have different temperature dependencies, the first and second current sources being set to be one of an enable state and a disable state in accordance with an ambient temperature, at least one of current values of the first and second write currents being controlled in accordance with supply currents of the first and second current sources.

BRIEF DESCRIPTION OF THE SEVERAL VIEWS OF THE DRAWING

FIG. 22 is a circuit diagram of a partial region of an MRAM according to a modification of the third embodiment of this invention;

FIG. 28 is a circuit diagram of a current source provided in an MRAM according to a fifth embodiment of this invention;

FIG. 29 is a circuit diagram of a temperature sensor provided in the MRAM according to the fifth embodiment of this invention;

FIG. 30 is a graph showing the relation between a temperature and a current output from the current source and voltage output from the temperature sensor provided in the MRAM according to the fifth embodiment of this invention;

FIG. 33 is a graph showing the relation between a temperature and a current output from the current source and voltage output from the temperature sensor provided in the MRAM according to the fifth embodiment of this invention;

FIG. 37 is a graph showing the relation between a temperature and a current output from the current source and voltage output from a temperature sensor provided in the MRAM according to the fourth embodiment of this invention;

FIG. 44 is a block diagram of an MRAM according to a modification of the eighth embodiment of this invention;

FIG. 47 is a conceptual diagram showing write current data held by the MRAM according to the ninth embodiment of this invention;

FIG. 48 is a conceptual diagram showing write current data held by the MRAM according to the ninth embodiment of this invention;

FIG. 49 is a conceptual diagram showing write current data held by the MRAM according to the ninth embodiment of this invention;

FIG. 50 is a conceptual diagram showing write current data held by the MRAM according to the ninth embodiment of this invention;

FIG. 52 is a graph showing the relation between write currents supplied to a digit line and a bit line in the MRAM according to the ninth embodiment of this invention and is a diagram indicating observation points when an optimum write current is detected;

FIG. 53 is a circuit diagram of memory cells of the MRAM;

FIG. 54 is a conceptual diagram of a data pattern used when an optimum write current is set in the MRAM according to the ninth embodiment of this invention;

FIG. 57 is a graph showing the state in which the ranges of optimum write currents supplied to a digit line and a bit line are changed according to the temperature in the MRAM according to the ninth embodiment of this invention;

FIG. 58 is a flowchart at the write operation time in the MRAM according to the ninth embodiment of this invention;

FIG. 76 shows a connecting apparatus operable to receive a memory card or cardholder;

FIG. 77 is an illustrative example of a connecting apparatus connected to a personal computer via a connecting wire and having a memory card inserted therein;

DETAILED DESCRIPTION OF THE INVENTION

Figure 1:
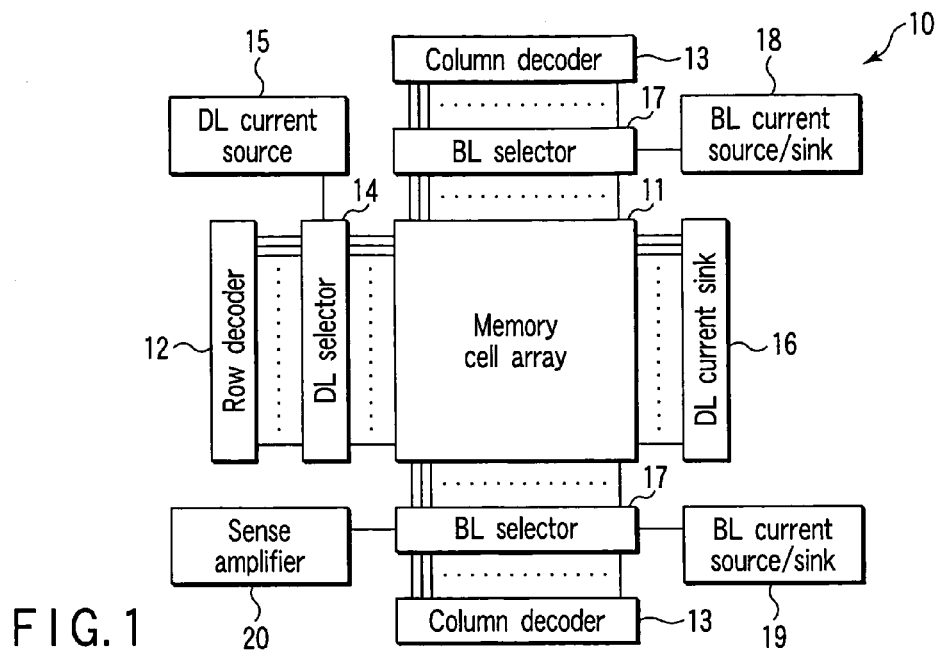
FIG. 1 is a block diagram of an MRAM according to a first embodiment of this invention.

A semiconductor memory device according to a first embodiment of the present invention is explained with reference to FIG. 1. FIG. 1 is a block diagram of an MRAM.

As shown in FIG. 1, an MRAM 10 includes a memory cell array 11, row decoder 12, column decoder 13, digit line selector 14, digit line current source 15, digit line current sink 16, bit line selector 17, bit line current sources/current sinks 18, 19 and sense amplifier 20.

The memory cell array 11 has a plurality of memory cells arranged in a matrix form. Each memory cell includes a magneto-resistive element. In the memory cell array 11, bit lines BL and digit lines DL, word lines WL which intersect one another are arranged. Each memory cell is arranged at an intersection of the bit line BL and the digit line DL, word line WL and connected to the bit line BL and word line WL. Each digit line DL is arranged to pass through portions near the respective memory cells. In the memory cell array 11, memory cells on the same column are connected to a corresponding one of the bit lines BL and memory cells on the same row are connected to a corresponding one of the word lines WL. Further, the same digit line DL is arranged in portions near the respective memory cells on the same row. The memory cell array will be described in detailed later.

The row decoder 12 decodes an externally input row address signal and outputs a row address decode signal. The column decoder 13 decodes an externally input column address signal and outputs a column address decode signal.

The digit line selector 14 selects a digit line DL of the memory cell array 11 based on the row address decode signal.

The digit line current source 15 supplies a write current to the digit line DL selected by the digit line selector 14. The current passes through a portion near the selected memory cell and flows into the digit line current sink 16.

The bit line selector 17 selects a bit line BL of the memory cell array 11 based on the column address decode signal.

The bit line current sources/current sinks 18, 19 each function as a current source or current sink. If one of the bit line current sources/current sinks 18, 19 functions as a current source at the write time, the other of the bit line current sources/current sinks 18, 19 functions as a current sink. Then, it supplies a current to the bit line BL selected by the bit line selector 17. The current supplied from the current source flows into the current sink. Write data into the memory cell can be controlled according to one of the bit line current sources/current sinks 18, 19 which supplies the current. Of course, if write data is controlled by a current passing through the digit line DL, each of the digit line current source 15 and digit line current sink 16 may be configured to function as a current source or current sink.

The sense amplifier 20 amplifies data read out onto the bit line at the read operation time.

Figure 2:
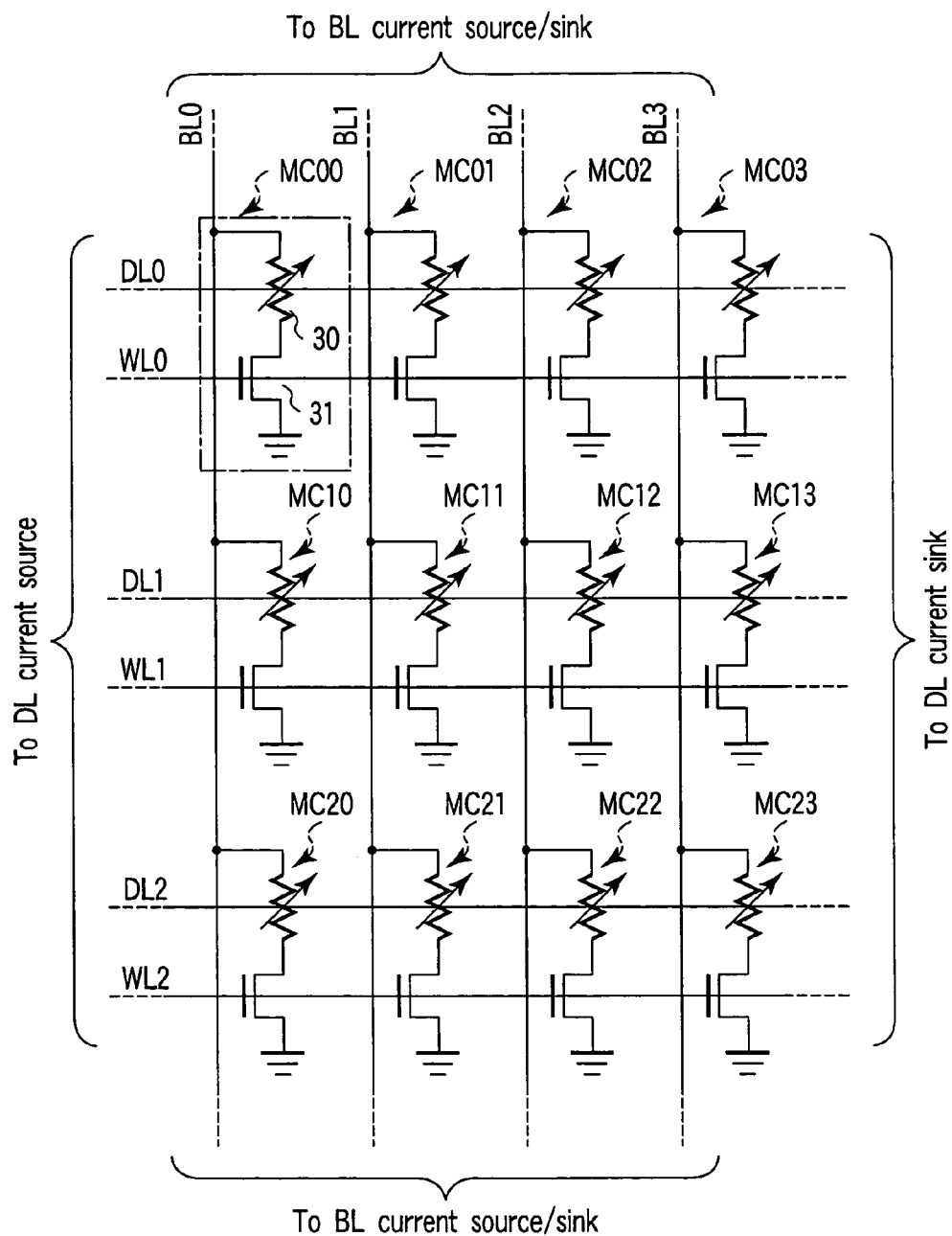
FIG. 2 is a circuit diagram of a memory cell array provided in the MRAM according to the first embodiment of this invention.

Next, the configuration of the memory cell array 11 is explained with reference to FIG. 2. FIG. 2 is a circuit diagram of the memory cell array 11.

As shown in FIG. 2, the memory cell array 11 includes a plurality of ((m+1)×(n+1)) memory cells arranged in a matrix form (in FIG. 2, only 3×4 memory cells are shown). Each of the memory cells includes a magneto-resistive element 30 and switching transistor 31. The magneto-resistive element 30 is an MTJ element, for example. One end of the magneto-resistive element 30 is connected to a corresponding one of the bit lines BL0 to BLn and the other end thereof is connected to one end of the current path of the switching transistor 31. The gate of the switching transistor 31 is connected to a corresponding one of the word lines WL0 to WLm and the other end of the current path thereof is connected to a ground potential node. A corresponding one of the digit lines DL0 to DLm is arranged in portions near the magneto-resistive elements 30 on the same row. The gates of the switching transistors 31 of the memory cells arranged on the same row are commonly connected to a corresponding one of the word lines WL0 to WLm. Further, a corresponding one of the digit lines DL0 to DLm is arranged in portions near the magneto-resistive elements 30 of the memory cells arranged on the same row. One-side ends of the magneto-resistive elements 30 of the memory cells arranged on the same column are commonly connected to a corresponding one of the bit lines BL0 to BLn. The digit lines DL0 to DLm and the bit lines BL0 to BLn are arranged to intersect one another.

Figure 3:
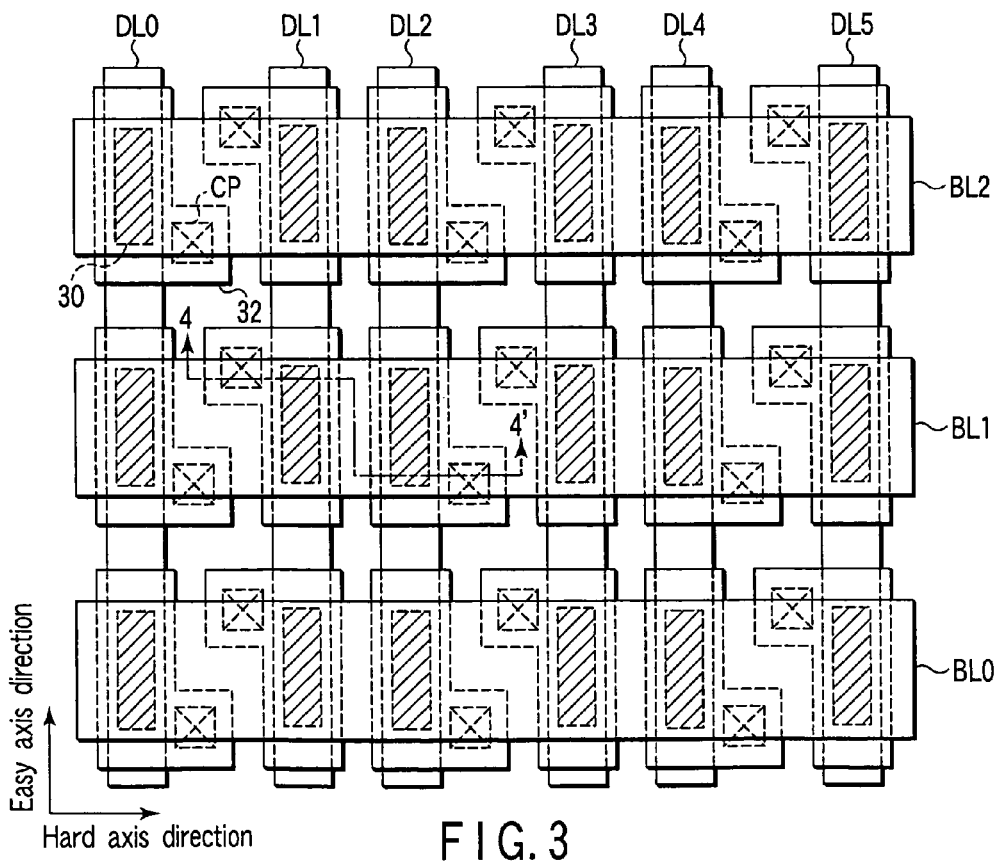
FIG. 3 is a plan view of the memory cell array provided in the MRAM according to the first embodiment of this invention.

Next, the plane pattern of the memory cell array 11 is explained with reference to FIG. 3. FIG. 3 is a plan view of the memory cell array 11 and the switching transistors are not shown in FIG. 3 for simplicity of the drawing. The directions indicated in FIG. 3 are respectively defined as a hard axis direction and easy axis direction.

As shown in FIG. 3, (1+n) bit lines BL0 to BLn are arranged along the hard axis direction (in FIG. 3, only the bit lines BL0 to BL2 are shown) and (1+m) digit lines DL0 to DLm are arranged along the easy axis direction which intersects the hard axis direction (in FIG. 3, only the digit lines DL0 to DL3 are shown). The magneto-resistive elements 30 are arranged at the intersections of the bit lines BL0 to BLn and the digit lines DL0 to DLm. The bit lines BL0 to BLn are electrically connected to one-side ends of the magneto-resistive elements 30. Further, the digit lines DL0 to DLm are electrically isolated from the magneto-resistive elements 30 and are arranged near the magneto-resistive elements 30.

The magneto-resistive element 30 has substantially a rectangular shape whose longitudinal side is set along the easy axis direction and whose short side is set along the hard axis direction. The shape of the magneto-resistive element is not limited to the rectangular shape and may be set to an ellipse having the line of apsides set along the easy axis direction, for example. The other end of each magneto-resistive element 30 is connected to the switching transistor 31 (not shown in FIG. 3) via a metal wiring layer and contact plug CP.

Figure 4:
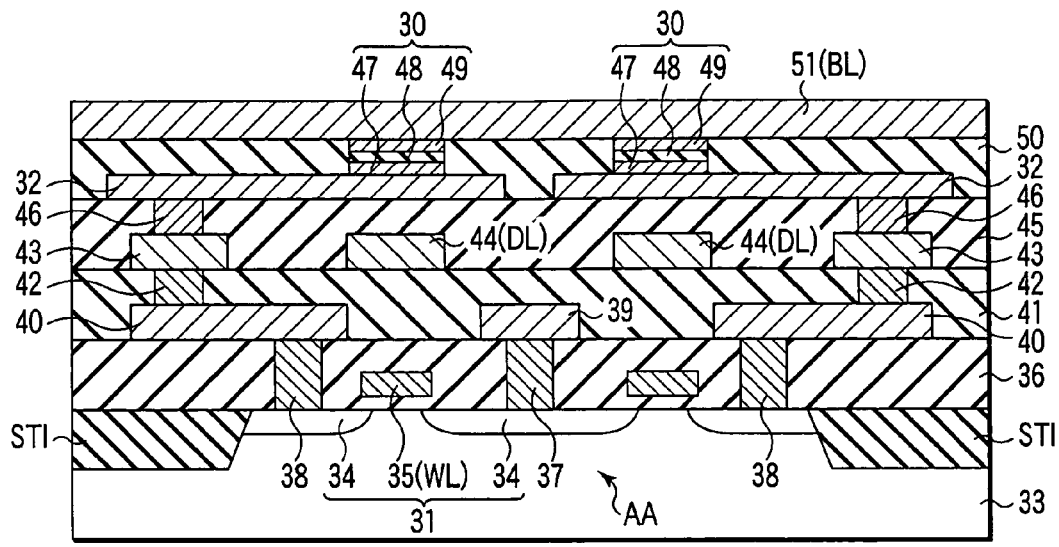
FIG. 4 is a cross-sectional view taken along the 4—4 line of FIG. 3.

Next, the cross-sectional structure of the memory cell array 11 is explained with reference to FIG. 4. FIG. 4 is a cross-sectional view taken along the 4—4 line of FIG. 3.

As shown in FIG. 4, an element isolation region STI is formed in a semiconductor substrate 33 and switching transistors 31 are formed on an element forming region AA surrounded by the element isolation region. The switching transistor 31 includes impurity diffusion layers 34 formed in the surface of the semiconductor substrate 33, a gate insulating film and a gate electrode 35. The gate electrode 35 functions as a corresponding one of the word lines WL0 to WLm and the gate electrodes are formed in a stripe form along the easy axis direction (perpendicular to the drawing sheet).

An inter-level insulating film 36 is formed on the semiconductor substrate 33. The inter-level insulating film 36 is formed to cover the switching transistor 31 and contact plugs 37, 38 are formed in the inter-level insulating film 36. The contact plugs 37, 38 are respectively connected to one (source region) and the other (drain region) of the impurity diffusion layers 34 of the switching transistor 31.

Metal wiring layers 39, 40 which are respectively connected to the contact plugs 37, 38 are formed on the inter-level insulating film 36. The metal wiring layer 39 is connected to a ground potential node to supply ground potential to the source region of the switching transistor 31 via the contact plug 37. Further, an inter-level insulating film 41 is formed on the inter-level insulating film 36. The inter-level insulating film 41 is formed to cover the metal wiring layers 39, 40 and contact plugs 42 are formed in the inter-level insulating film 41. The contact plugs 42 are connected to the respective metal wiring layers 40.

Metal wiring layers 43 connected to the respective contact plugs 42 and metal wiring layers 44 electrically isolated from the metal wiring layers 43 are formed on the inter-level insulating film 41. The metal wiring layer 44 functions as a corresponding one of the digit lines DL0 to DLm and the metal wiring layers are formed in a stripe form along the easy axis direction. Further, the metal wiring layer 44 is formed to lie substantially above a corresponding one of the gate electrodes 35 of the switching transistors 31 which are electrically connected. Further, an inter-level insulating film 45 is formed on the inter-level insulating film 41. The inter-level insulating film 45 is formed to cover the metal wiring layers 43, 44 and contact plugs 46 are formed in the inter-level insulating film 45. The contact plugs 46 are connected to the respective metal wiring layers 43.

Metal wiring layers 32 connected to the respective contact plugs 46 are formed on the inter-level insulating film 45. Magneto-resistive elements 30 are formed on the respective metal wiring layers 32. The magneto-resistive elements 30 are formed to lie above the metal wiring layers 44 with portions of the inter-level insulating film 45 and metal wiring layer 32 disposed therebetween. The magneto-resistive element 30 is an MTJ element of a structure having an insulating film sandwiched between magnetic films. That is, a magnetic film 47 is formed on the metal wiring layer 32, an insulating film 48 is formed on the magnetic film 47 and a magnetic film 49 is formed on the insulating film 48. The magnetic films 47, 49 and insulating film 48 configure an MTJ element. The direction of magnetization of the magnetic film 47 is previously set in a preset direction. Further, the direction of magnetization of the magnetic film 49 is set parallel or anti-parallel with respect to the magnetic film 47 to set up two states. Thus, "0" data or "1" data is selectively written. Further, an inter-level insulating film 50 is formed on the inter-level insulating film 45. The inter-level insulating film 50 is formed to cover the metal wiring layers 32 and the side surfaces of the magneto-resistive elements 30. A metal wiring layer 51 is formed on the inter-level insulating film 50 so as to be connected to the magnetic films 49. The metal wiring layer 51 functions as one of the bit lines BL0 to BLn and the metal wiring layers are formed in a stripe form along the hard axis direction (right and left directions in the drawing).

Next, the operation of the MRAM with the above configuration is explained with reference to FIGS. 1, 2 and 3. First, the write operation is explained by taking a case wherein data is written into a memory cell MC21 arranged at the intersection of the bit line BL1 and the word line WL2 (digit line DL2) as an example.

First, the digit line selector 14 selects the digit line DL2 based on a row address decode signal supplied from the row decoder 12. Then, the digit line current source 15 supplies a current to the digit line DL2 selected by the digit line selector 14. The current supplied from the digit line current source 15 flows into the digit line current sink 16. A magnetic field in the hard axis direction is created around the digit line DL2 by the above current.

Further, the bit line selector 17 selects the bit line BL1 based on a column address decode signal supplied from the column decoder 13. Thus, the bit line BL1 is electrically connected to the bit line current sources/current sinks 18, 19. Then, one of the bit line current sources 18 and 19 supplies a write current to the bit line BL1. The current supplied from one of the bit line current sources 18 and 19 flows into the other one of the bit line current sinks 18 and 19. A magnetic field in the easy axis direction is created around the bit line BL1 by the above current. Then, "0" data or "1" data is written into the memory cell MC21 depending on the direction of the current flowing in the bit line BL1 (depending on one of the bit line current sources which supplies the current).

Figure 5:
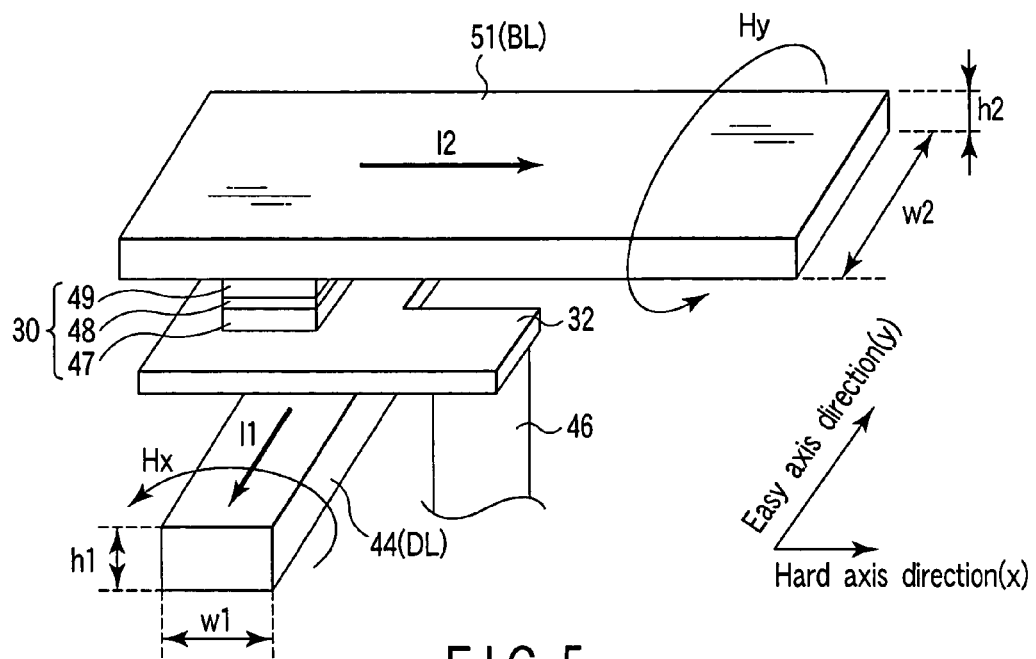
FIG. 5 is a perspective view of a memory cell provided in the MRAM according to the first embodiment of this invention.

FIG. 5 is a perspective view of a memory cell provided in the MRAM according to the present embodiment. As shown in FIG. 5, a magnetic field Hx in the hard axis direction as indicated in the drawing is generated by a write current I1 flowing in the digit line DL. Further, a magnetic field Hy in the easy axis direction as indicated in the drawing is generated by a write current I2 flowing in the bit line. In the write operation, the digit line current source 15 and bit line current sources 18, 19 respectively supply the write currents I1, I2 to the digit line DL and bit line BL so as to set the intensities of the magnetic field Hx in the hard axis direction and the magnetic field Hy in the easy axis direction equal to each other.

Next, the read operation is explained by taking a case wherein data is read out from the memory cell MC21 as an example.

First, the word line WL2 is selected based on a row address decode signal supplied from the row decoder 12. Therefore, the switching transistor 31 of the memory cell MC21 is set to the ON state.

Then, the bit line selector 17 selects the bit line BL1. As a result, the bit line BL1 is electrically connected to the bit line current source 18. Then, a read current is supplied from the bit line current source 18 to the bit line BL1.

The read current flows into a ground potential node via the magneto-resistive element 30 and switching transistor 31 of the memory cell MC21. As a result, a voltage drop in the magneto-resistive element 30 appears on the bit line BL1. That is, data held in the memory cell MC21 is read out and supplied to the bit line BL1.

Then, the sense amplifier 20 connected to the bit line BL1 by the bit line selector 17 amplifies data read out to the bit line BL1.

In the MRAM according to the present embodiment, occurrence of erroneous writing into a memory cell which is adjacent to the selected memory cell can be suppressed and the reliability of the write operation can be enhanced. This is explained below.

Figure 6:
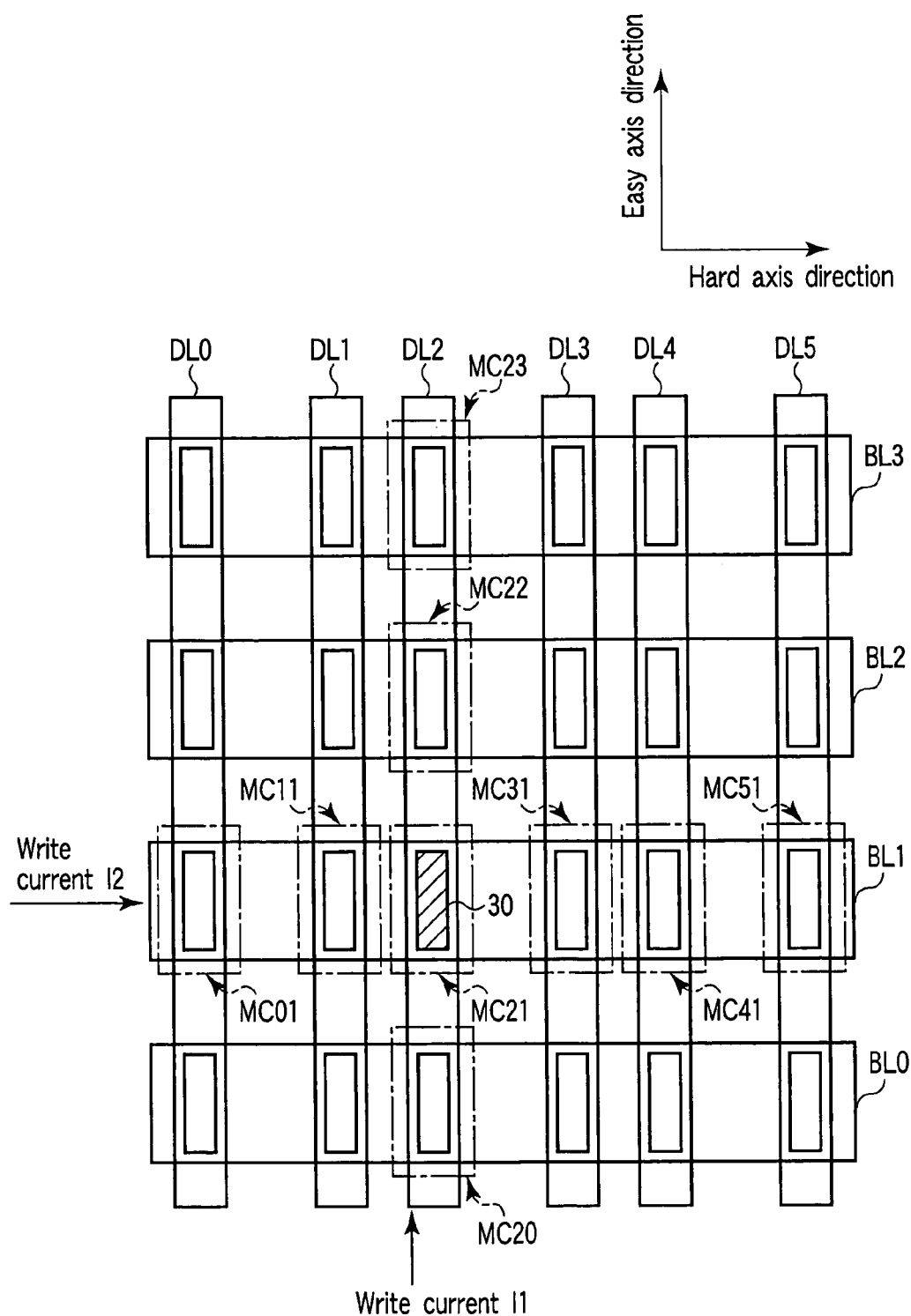
FIG. 6 is a plan view of the memory cell array provided in the MRAM according to the first embodiment of this invention.

FIG. 6 is a plan view of the memory cell array and corresponds to a simplified form of FIG. 3. In FIG. 6, only 6×4 memory cells are shown. Then, as explained above, a case wherein data is written into the memory cell MC21 disposed at the intersection of the digit line DL2 and the bit line BL1 is assumed.

When data is written into the memory cell MC21, write currents I1, I2 are supplied to the digit line DL2 and bit line BL1 as described above. As a result, the magnetic field Hx in the hard axis direction and the magnetic field Hy in the easy axis direction are applied to the memory cell MC21. At this time, the magnetic field Hx in the hard axis direction is applied to the memory cells MC20, MC22, MC23, . . . , MC2n which are arranged on the same row as the memory cell MC21 by the current I1 flowing in the digit line DL2. Further, the magnetic field Hy in the easy axis direction is applied to the memory cells MC01, MC11, MC31, MC41, . . . , MCm1 which are arranged on the same column as the memory cell MC21 by the current I2 flowing in the bit line BL1. The memory cells MC20, MC22 are influenced by not only the magnetic field Hx in the hard axis direction by the current I1 flowing in the digit line DL2 but also a leakage magnetic field Hy in the easy axis direction by the current I2 flowing in the bit line BL1. Further, the memory cells MC11, MC31 are influenced by not only the magnetic field Hy in the easy axis direction by the current I2 flowing in the bit line BL1 but also a leakage magnetic field Hx in the hard axis direction by the current I1 flowing in the digit line DL2. In the following description, the memory cells MC01, MC41, . . . and the memory cells MC23, . . . which are influenced by the magnetic field caused by only one of the digit line DL2 and bit line BL1 are each called a half-selected cell and the memory cells MC11, MC31, MC20, MC20 which are influenced by the leakage magnetic fields caused by both of the digit line DL2 and bit line BL1 are each called an adjacent cell.

In the MRAM, two causes of the presence of faulty in the half-selected cell (the write threshold voltage is low) and reversing of magnetization by thermal agitation are known as the cause of erroneous writing of data into the half-selected cell when data is written into the selected memory cell MC21. Therefore, the element material is selected and the element structure is designed to prevent erroneous writing of data into the half-selected cell.

The adjacent cell is influenced by not only the magnetic field caused by one of the digit line and bit line but also the leakage magnetic field from the other line. Therefore, the severest and most careful design is required to prevent erroneous writing. That is, a method for preventing erroneous writing of data into the adjacent cell can be said as a method for making the write operation margin of the MRAM maximum.

Figure 7:
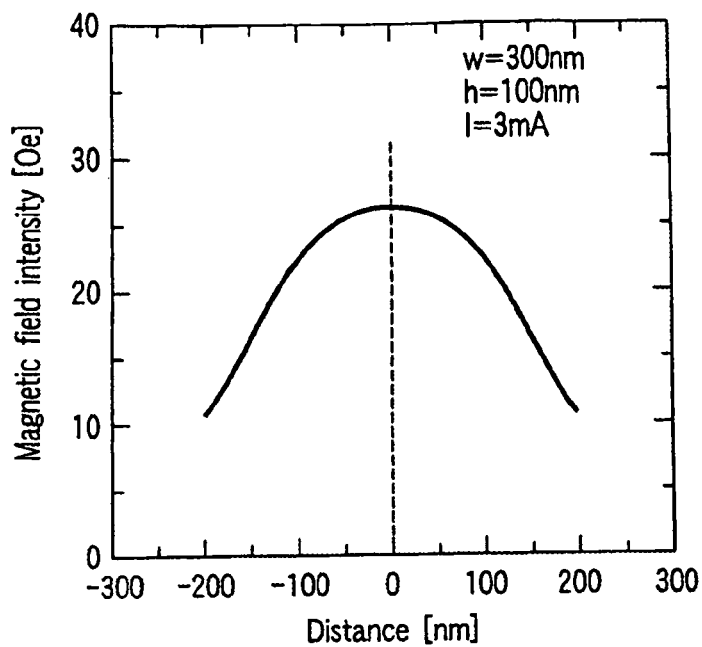
FIG. 7 is a graph showing the relation between the distance from the wiring and the intensity of the magnetic field, for illustrating the intensity of the magnetic field around the wiring.
Figure 8:
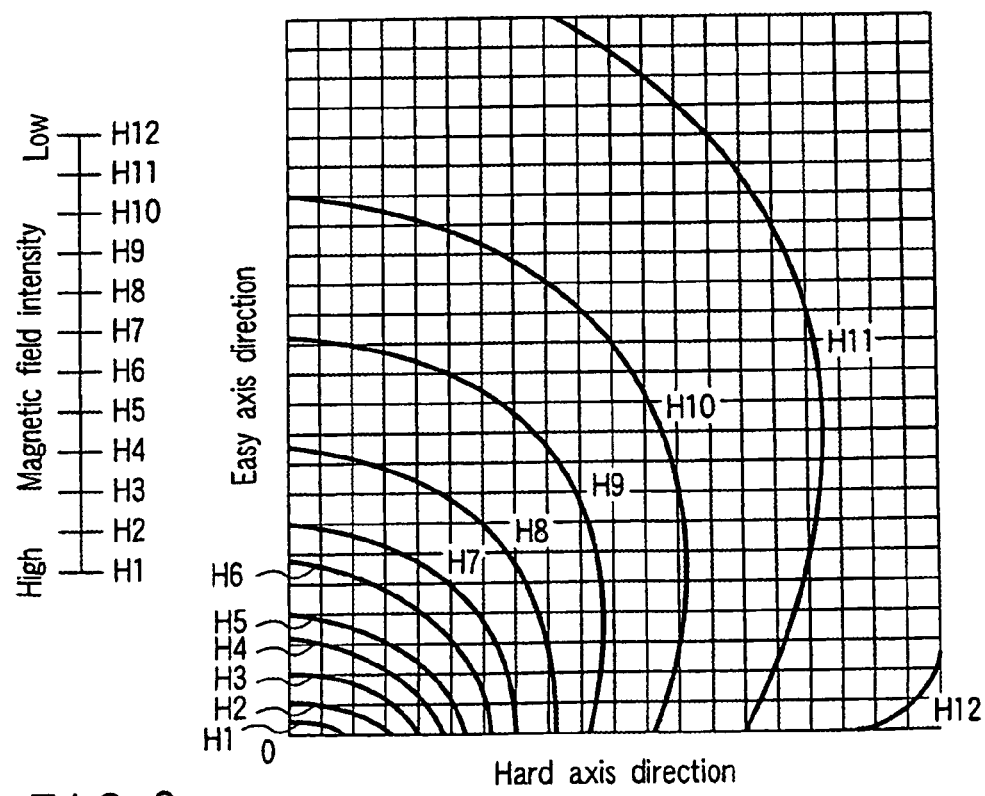
FIG. 8 is a relational diagram showing the relation between the distance from the wiring and the magnetic fields in a hard axis direction and easy axis direction.

FIGS. 7 and 8 are diagrams each showing the magnetic field distribution in a portion around the wiring. FIG. 7 shows the intensity distribution of the magnetic field in the wiring width direction in a portion separated from the upper surface by 50 nm when a current of 3 mA flows into the wiring with the width w of 300 nm and thickness h of 100 nm. The ordinate indicates the intensity of the magnetic field and the abscissa indicates the distance from the central position of the wiring. FIG. 8 shows the intensity of the magnetic field on the upper surface of the wiring with the width and thickness of 100 nm by use of two-dimensional contour lines. The ordinate indicates the easy axis direction and the abscissa indicates the hard axis direction. As shown in FIGS. 7, 8, the characteristic curve of the magnetic field around the wiring is gradually lowered and spreads as the distance becomes longer. In FIG. 8, if the wirings are arranged at an interval of 100 nm, the intensity of the magnetic field in the adjacent wiring position (x=200 nm) is attenuated to 1/7 of the intensity in the origin (x=0 nm). The ratio of the above values is hereinafter referred to as an attenuation coefficient "a". The attenuation coefficient varies depending on the wiring shape and the presence or absence of a ferromagnetic film used for shielding and concentration of the magnetic field.

Figure 9:
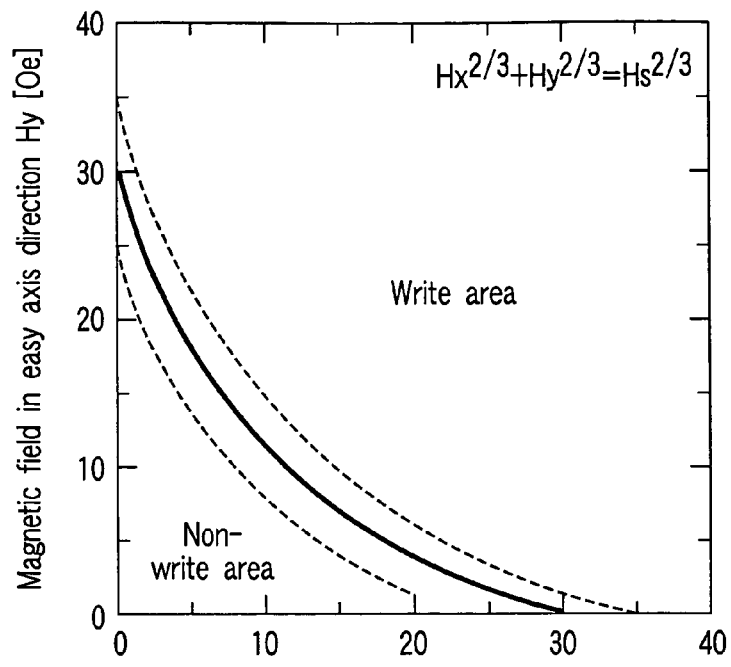
FIG. 9 is a graph showing an asteroid curve of a selected memory cell in the MRAM according to the first embodiment of this invention.

FIG. 9 is a graph (asteroid curve) showing the write threshold value of a selected memory cell. The ordinate indicates the magnetic field Hy in the easy axis direction and the abscissa indicates the magnetic field Hx in the hard axis direction. The write threshold value is derived based on the so-called Stoner-Wohlfarth relational equation on the assumption of simultaneous rotation of magnetization of single magnetic domain. As the Stoner-Wohlfarth relational equation, the following equation is used.

$$Hx^{(2/3)} + Hy^{(2/3)} = Hs^{(2/3)}$$

In this case, it is assumed that the anisotropic magnetic field Hs (coercive force) in the easy axis direction of the selected memory cell MC21 is 30 Oe. The broken lines in FIG. 9 show a case wherein the write threshold characteristic of the selected memory cell varies and it is assumed that the anisotropic magnetic field in the easy axis direction varies by 5 Oe at 3σ.

For example, the asteroid curve of the selected memory cell MC21 in FIG. 5 is shown in FIG. 8. When the relation of $Hx^{(2/3)} + Hy^{(2/3)} > 30^{(2/3)} Oe^{(2/3)}$ is satisfied, the direction of magnetization of the magneto-resistive element varies and data is written. That is, areas shown in FIG. 9 are used as a write area and non-write area.

Figure 10:
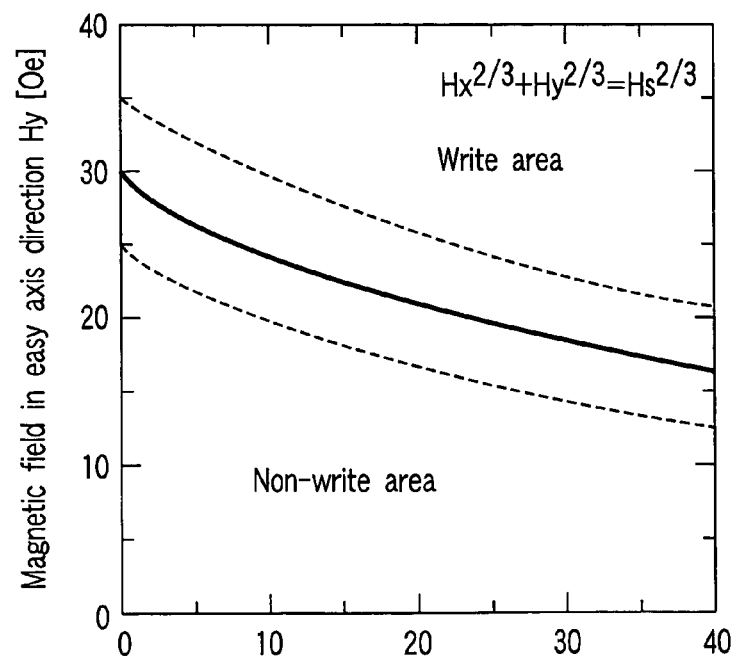
FIG. 10 is a graph showing an asteroid curve of an adjacent cell in the MRAM according to the first embodiment of this invention.

FIG. 10 shows an asteroid curve of an adjacent cell which is adjacent to the selected memory cell in the hard axis direction when a magnetic field is applied to the selected memory cell. Like the case of FIG. 9, the ordinate indicates the magnetic field Hy in the easy axis direction and the abscissa indicates the magnetic field Hx in the hard axis direction. In the example shown in FIG. 6, the above asteroid curve corresponds to an asteroid curve of the adjacent cell MC11 or MC31 which is adjacent to the selected memory cell MC21 and commonly uses the bit line BL1. As explained with reference to FIGS. 7, 8, the adjacent cells MC11, MC31 are influenced by a leakage magnetic field of the magnetic field Hx in the hard axis direction caused by the current I1 flowing in the digit line DL2. If the intensity of the magnetic field Hx in the hard axis direction is high as shown in FIG. 10, data will be easily written.

Figure 11:
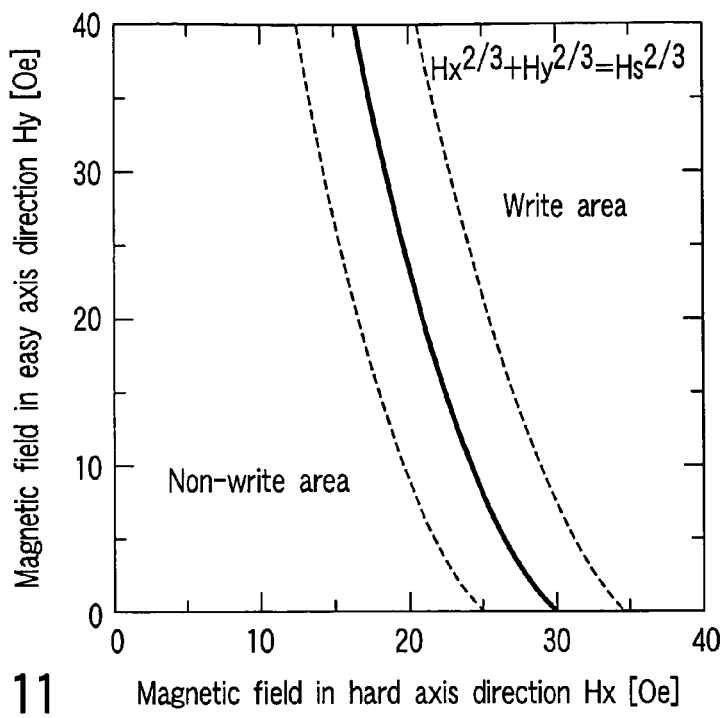
FIG. 11 is a graph showing an asteroid curve of an adjacent cell in the MRAM according to the first embodiment of this invention.

FIG. 11 shows an asteroid curve of an adjacent cell which is adjacent to the selected memory cell in the easy axis direction when a magnetic field is applied to the selected memory cell. Like the case of FIG. 9, the ordinate indicates the magnetic field Hy in the easy axis direction and the abscissa indicates the magnetic field Hx in the hard axis direction. In the example shown in FIG. 6, the above asteroid curve corresponds to an asteroid curve of the adjacent cell MC20 or MC22 which is adjacent to the selected memory cell MC21 and commonly uses the digit line DL2. As explained with reference to FIGS. 7, 8, the adjacent cells MC20, MC22 are influenced by a leakage magnetic field of the magnetic field Hy in the easy axis direction caused by the current I2 flowing in the bit line BL1. Therefore, if the intensity of the magnetic field Hy in the easy axis direction is high as shown in FIG. 11, data will be easily written.

Figure 12:
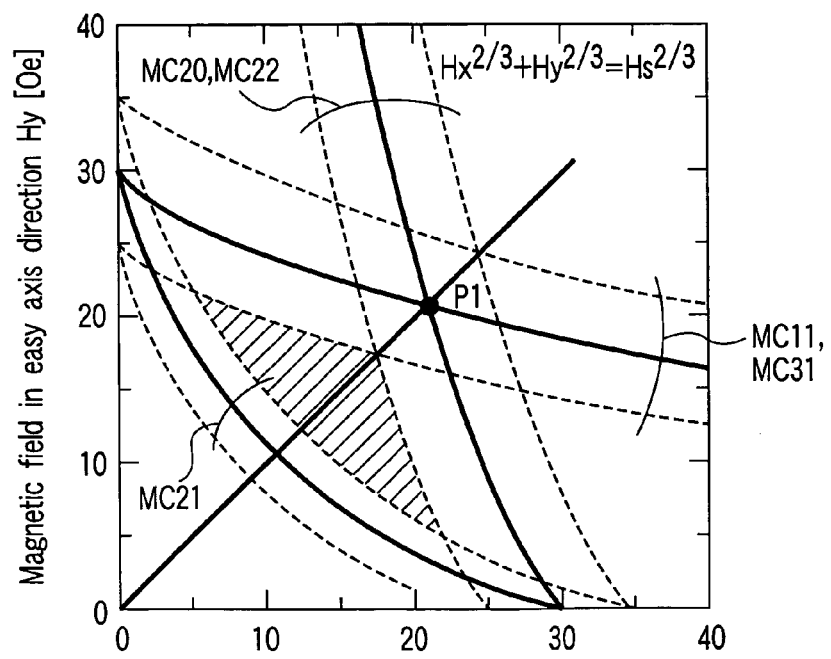
FIG. 12 is a graph showing asteroid curves of a selected memory cell and adjacent memory cell in the MRAM according to the first embodiment of this invention.

FIG. 12 is a graph obtained by superimposing the graphs of FIGS. 9 to 11. As shown in FIG. 12, in a case where the threshold value of occurrence of erroneous writing into the adjacent cell shown in FIGS. 10, 11 is taken into consideration, the following condition must be satisfied in order to write data into the selected memory cell without fail while erroneous writing is prevented. That is, the magnetic field Hy in the easy axis direction and the magnetic field Hx in the hard axis direction are set in a range defined by the asteroid curves of the adjacent cells MC20, MC22 in the easy axis direction, the asteroid curves of the adjacent cells MC1, MC31 in the hard axis direction and the asteroid curve of the selected memory cell MC21. Further, when a variation in the anisotropic magnetic field is taken into consideration, it is necessary to set the magnetic field Hy in the easy axis direction and the magnetic field Hx in the hard axis direction in a hatched range in FIG. 12 which is narrower than the above range. In the operating region, a point at which the maximum operating condition (operation margin) can be attained is on a straight line which connects an intersection P1 of the asteroid curve of the adjacent cell in the easy axis direction and the asteroid curve of the adjacent cell in the hard axis direction to the origin. That is, when an ideal asteroid curve is considered, the maximum operation margin is attained if the relation of the magnetic field Hy in the easy axis direction=the magnetic field Hx in the hard axis direction is satisfied. Thus, data can be written-into the selected memory cell without fail while erroneous writing of data into the adjacent cell is prevented. Further, as a set value of the write current, it is desirable to set the magnetic field on the straight line which connects the intersection P1 to the origin and in a portion near the center of the hatched portion when the operation margin of the current source circuit is taken into consideration.

Figure 13:
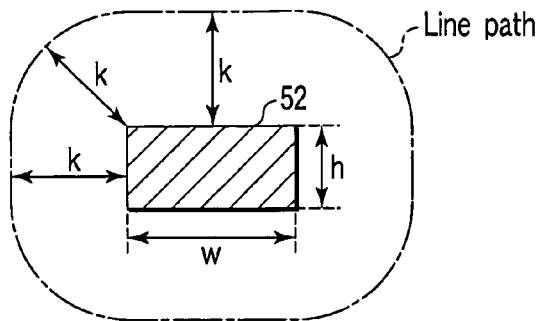
FIG. 13 is a cross-sectional view of a wiring.

The magnetic field is generated by passing a current in the metal wiring layer. The intensity of the generated magnetic field depends on the current value and depends on the shape of the metal wiring layer in which the current flows and the distance from the metal wiring. However, in the memory cell array, an extremely large number of magnetic films used for the magneto-resistive elements are arranged in an array form. Therefore, the actually generated magnetic field provides an extremely complicated pattern. However, the magnetic field in a portion around the wiring can be approximately estimated by dividing the current value by the length l of the closed integral line which surrounds the wiring. FIG. 13 is a cross-sectional view of the metal wiring layer. As shown in FIG. 13, when a closed path separated from the surface of the metal wiring layer 52 by k is taken into consideration, the line length l is expressed by the following equation.

$$l = 2(w+h) + 2\Pi \cdot k$$

where w indicates the width of the metal wiring layer 52 and h indicates the height thereof.

Then, the magnetic field H created around the metal wiring layer is expressed by the following equation.

$$H = I/l = I/\{2(w+h+\Pi \cdot k)\}$$

The present embodiment is more specifically explained with reference to FIG. 5. The width of the digit line DL is w1, the thickness is h1, and the minimum distance from the surface of the digit line DL on the side facing the magnetic film to the magnetic film 49 of the magneto-resistive element 30 of the memory cell is k1. The width of the bit line BL is w2, the thickness is h2, and the minimum distance from the surface of the bit line BL on the side facing the magnetic film to the magnetic film 49 of the magneto-resistive element 30 of the memory cell is k2. Further, the write current flowing in the digit line DL is I1 and the write current flowing in the bit line BL is I2. Then, the magnetic field Hx in the hard axis direction created by passing the write current I1 into the digit line DL by use of the digit line current source 15 is expressed by the following equation.

$$Hx = I1/\{2(w1+h1+\Pi \cdot k1)\}$$

Further, the magnetic field Hy in the easy axis direction created by passing the write current I2 into the bit line BL by use of the bit line current sources 18, 19 is expressed by the following equation.

$$Hy = I2/\{2(w2+h2+\Pi \cdot k2)\}$$

That is, $Hx = \alpha 1 \times I1$ and $Hy = \alpha 2 \times I2$ ($\alpha 1$, $\alpha 2$ are coefficients relating to the shape of the metal wiring layer). Therefore, in the present embodiment, in order to satisfy the relation of Hx=Hy, it is satisfied the relation of $I1 = I2 \times (\alpha 2/\alpha 1)$. However, as described before, the intensity of the magnetic field may depend on another factor other than the shape of the metal wiring layer. Therefore, if the relation of Hx=Hy is satisfied, the write current value is not necessarily limited to the relation of $I1 = I2 \times (\alpha 2/\alpha 1)$.

Next, a semiconductor memory device according to a second embodiment of this invention is explained with reference to FIGS. 14 to 17. FIGS. 14 to 17 show asteroid curves of MRAM cells.

In the first embodiment, a case wherein an ideal asteroid curve can be obtained is explained on the assumption that simultaneous reversing of magnetization of the single magnetic domain occurs according to the write threshold value of the magneto-resistive element. However, the magneto-resistive element is influenced by the magnetic domain wall, anisotropic dispersion, edge domain and the like in the magnetization reversing process. As a result, the threshold curve is generally deviated from the ideal asteroid curve. It is not easy to numerically and strictly express the above deviation, but it is known that an asteroid curve which is contracted along the easy-axis direction or extended along the hard-axis direction occurs as a phenomenon due to the effective magnetic field reducing by the presence of the anti-magnetic field and the above-mentioned factors influenced by the magnetization reversing process.

The present embodiment relates to a case wherein the asteroid curve is deviated from the ideal shape as described above.

Figure 14:
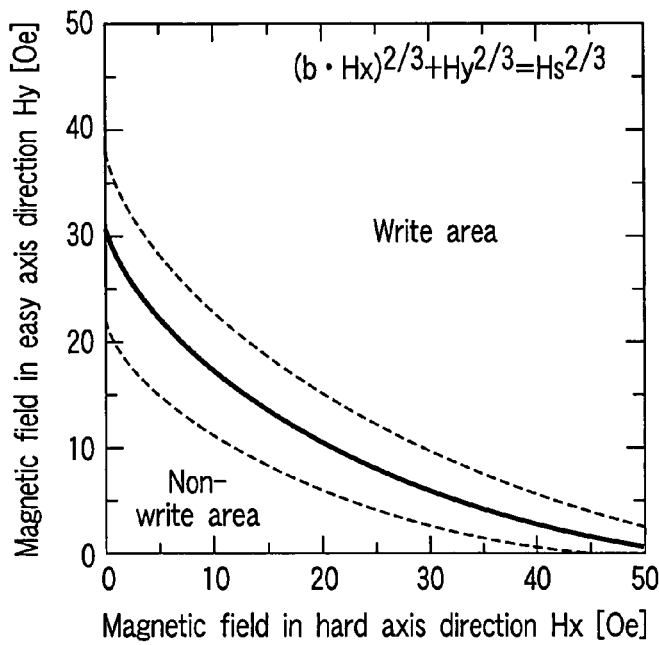
FIG. 14 is a graph showing an asteroid curve of a selected memory cell in an MRAM according to a second embodiment of this invention.

The Stoner-Wohlfarth relational equation for the asteroid curve which extends in the hard axis direction by a certain amount as described above is expressed as follows.

$$(b \times Hx)^{(2/3)} + Hy^{(2/3)} = Hs^{(2/3)}$$

where b is a coefficient and whether it may be a constant or a function containing a variable depends on the situation. FIG. 14 shows an asteroid curve based on the above relational equation in a selected memory cell. Like the first embodiment, it is assumed that the anisotropic magnetic field Hs in the easy axis direction is 30 Oe. The broken lines in FIG. 14 shows a case wherein the anisotropic magnetic field in the easy axis direction varies by 5 Oe at 3σ.

Figure 15:
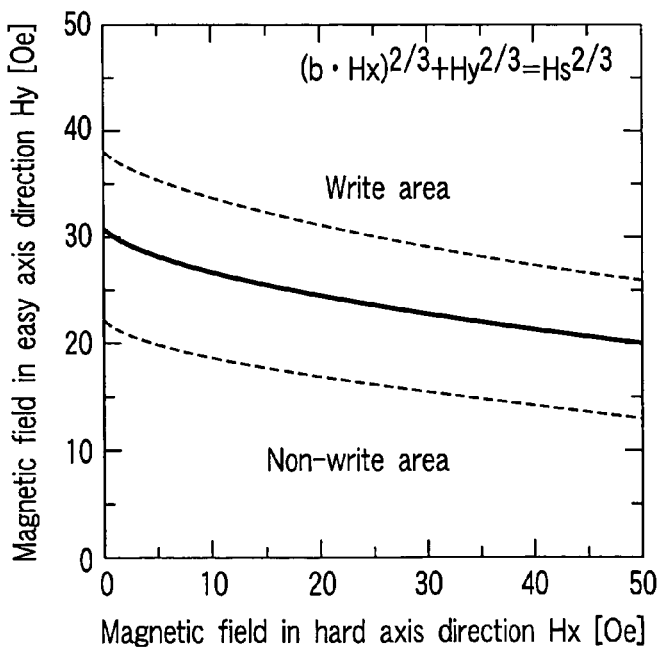
FIG. 15 is a graph showing an asteroid curve of an adjacent cell in the MRAM according to the second embodiment of this invention.
Figure 16:
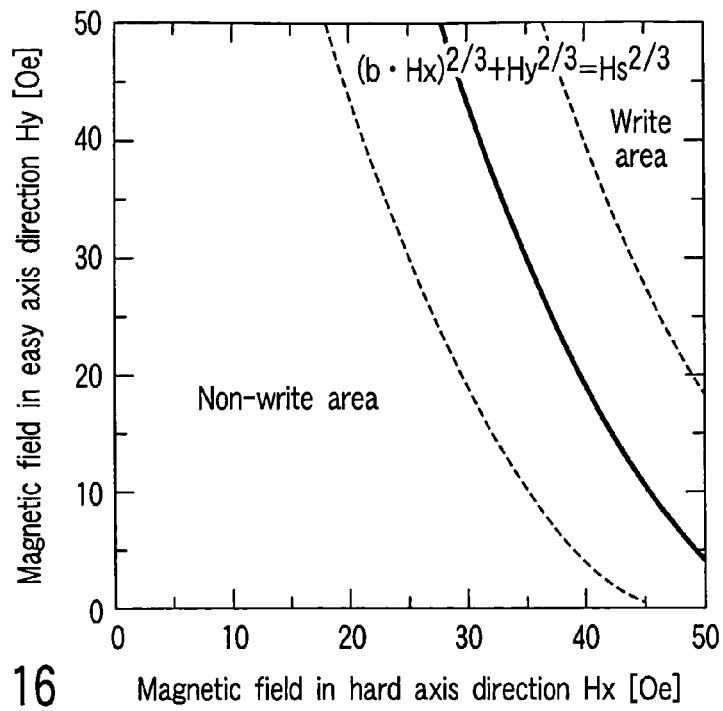
FIG. 16 is a graph showing an asteroid curve of an adjacent cell in the MRAM according to the second embodiment of this invention.

FIGS. 15, 16 show asteroid curves of adjacent cells which are adjacent to the selected memory cell in the hard axis direction and easy axis direction. That is, if the selected memory cell is a memory cell MC21 as shown in FIG. 6, FIG. 15 shows the asteroid curves of adjacent cells MC11 and MC31 and FIG. 16 shows the asteroid curves of adjacent cells MC20 and MC22.

Figure 17:
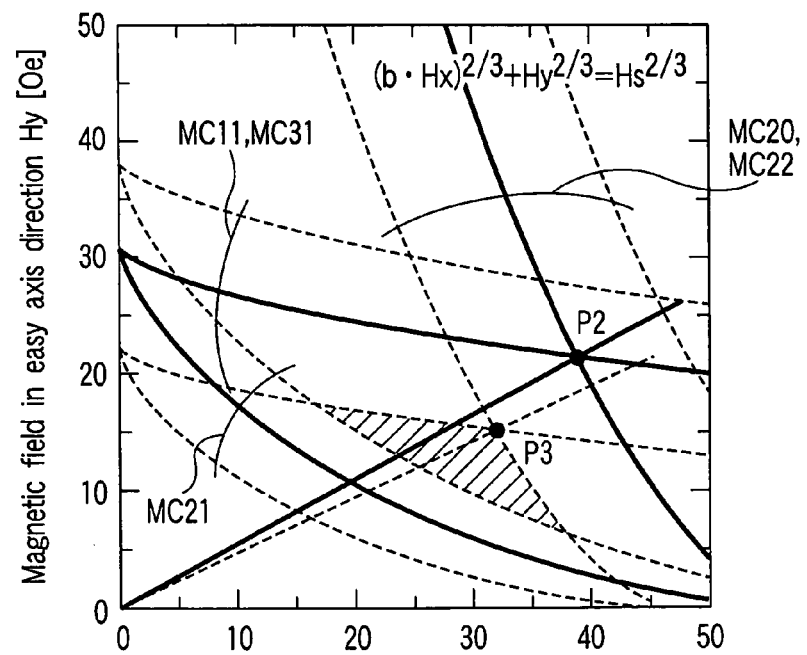
FIG. 17 is a graph showing asteroid curves of a selected memory cell and adjacent cell in the MRAM according to the second embodiment of this invention.

FIG. 17 is a graph obtained by superimposing the graphs of FIGS. 14 to 16. That is, in order to write data into the selected memory cell without fail while preventing erroneous writing, the magnetic field Hy in the easy axis direction and the magnetic field Hx in the hard axis direction are set in a range defined by the asteroid curves of the adjacent cells MC20, MC22 in the easy axis direction indicating the resistance to erroneous writing, the asteroid curves of the adjacent cells MC11, MC31 in the hard axis direction and the asteroid curve of the selected memory cell MC21 indicating the resistance to erroneous writing. Further, when a variation in the anisotropic magnetic field is taken into consideration, it is necessary to set the magnetic fields Hy and Hx in a hatched range of FIG. 17 narrower than the above range. This is the same as a case of the first embodiment.

However, unlike the first embodiment, a point at which the maximum operating condition can be attained does not lie on a straight line which connects an intersection P2 of the asteroid curve of the adjacent cell in the easy axis direction and the asteroid curve of the adjacent cell in the hard axis direction to the origin. When a variation in the magnetic field is taken into consideration, the point lies on a straight line which connects an intersection P3 of the minimum asteroid curves of the adjacent cells to the origin. That is, a leaner operation which satisfies the relation of Hx=c×Hy (c: coefficient) which connects the intersection P3 to the origin gives the maximum operation margin. In this case, c is a value which substantially satisfies b×c=1. Further, as a set value of the write current, it is desirable to set the generated magnetic field on the straight line which connects the intersection P3 to the origin and in a portion near the center of the hatched portion when taking the operation margin of the current source circuit into consideration.

Like the first embodiment, in the present embodiment, it is only required to satisfy the relation of I1=I2×c×(α2/α1) in order to satisfy Hx=c×Hy when the relation between the current and the shape of the metal wiring layer is considered.

Figure 18:
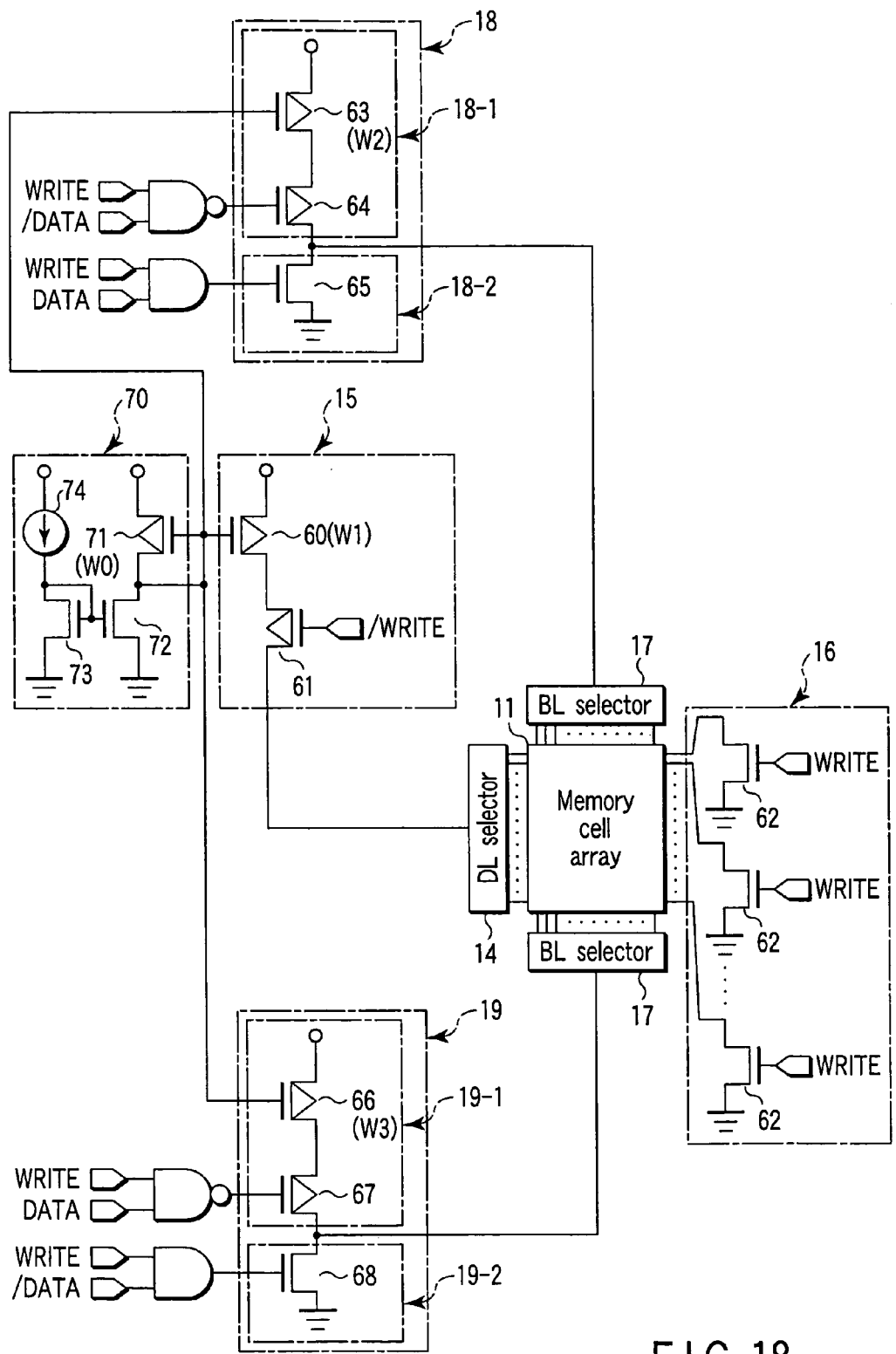
FIG. 18 is a circuit diagram of a partial region of an MRAM according to a third embodiment of this invention.

Next, a semiconductor memory device according to a third embodiment of this invention is explained. The third embodiment relates to a concrete example of the peripheral circuit which realizes the first and second embodiments. FIG. 18 is a circuit diagram mainly showing a peripheral circuit of an MRAM according to the present embodiment, for example.

As shown in FIG. 18, a digit line current source 15 includes p-channel MOS transistors 60, 61. One end of the current path of the p-channel MOS transistor 60 is connected to a power supply potential node and the other end thereof is connected to one end of the current path of the p-channel MOS transistor 61. The other end of the current path of the p-channel MOS transistor 61 is used as an output terminal of the digit line current source 15 and connected to digit lines DL via a digit line selector 14. Further, the gate of the p-channel MOS transistor 61 is supplied with an inverted signal /WRITE of a write command signal.

A digit line current sink 16 includes a plurality of n-channel MOS transistors 62, 62, . . . respectively provided for the digit lines DL. The current path of each of the n-channel MOS transistors 62 is connected between a corresponding one of the digit lines DL and the ground potential node and the gate thereof is supplied with a write command signal WRITE.

A bit line current source/current sink 18 includes a current source 18-1 and current sink 18-2. The current source 18-1 has p-channel MOS transistors 63, 64. One end of the current path of the p-channel MOS transistor 63 is connected to the power supply potential node and the other end thereof is connected to one end of the current path of the p-channel MOS transistor 64. The other end of the current path of the p-channel MOS transistor 64 is used as an output terminal of the current source 18-1 and connected to bit lines BL via a bit line selector 17. Further, the gate of the p-channel MOS transistor 64 is supplied with a signal of the NAND of a write signal WRITE and an inverted data signal /DATA. The current sink 18-2 includes an n-channel MOS transistor 65. The current path of the n-channel MOS transistor 65 is connected between the bit line BL selected by the bit line selector 17 and the ground potential node. Further, the gate of the n-channel MOS transistor 65 is supplied with a signal of the AND of the write signal WRITE and a data signal DATA.

A bit line current source/current sink 19 includes a current source 19-1 and current sink 19-2. The current source 19-1 has p-channel MOS transistors 66, 67. One end of the current path of the p-channel MOS transistor 66 is connected to the power supply potential node and the other end thereof is connected to one end of the current path of the p-channel MOS transistor 67. The other end of the current path of the p-channel MOS transistor 67 is used as an output terminal of the current source 19-1 and connected to the bit lines BL via another bit line selector 17. Further, the gate of the p-channel MOS transistor 67 is supplied with a signal of the NAND of the write signal WRITE and the data signal DATA. The current sink 19-2 includes an n-channel MOS transistor 68. The current path of the n-channel MOS transistor 68 is connected between the bit line BL selected by the bit line selector 17 and the ground potential node. Further, the gate of the n-channel MOS transistor 68 is supplied with a signal of the AND of the write signal WRITE and the inverted data signal /DATA.

The gates of the p-channel MOS transistors 60, 63, 66 contained in the current sources 15, 18-1, 19-1 are connected to a current supply circuit 70. The current supply circuit 70 includes a p-channel MOS transistor 71, n-channel MOS transistors 72, 73 and current source 74.

One end of the current path of the p-channel MOS transistor 71 is connected to the power supply potential node and the other end of the current path and the gate thereof are connected together. The current path of the n-channel MOS transistor 72 is connected between the ground potential node and a connection node of the other end of the current path of the p-channel MOS transistor 71 and the gate thereof. Further, the gate of the p-channel MOS transistor 72 is connected to the gate of the n-channel MOS transistor 73. One end of the current path of the n-channel MOS transistor 73 is connected to the ground potential node and the other end of the current path and the gate thereof are connected together and connected to the current source 74. A connection node of the other end of the current path of the p-channel MOS transistor 71 and the gate thereof is connected to the gates of the p-channel MOS transistors 60, 63, 66 contained in the current sources 15, 18-1, 19-1. That is, the p-channel MOS transistor 71 and p-channel MOS transistors 60, 63, 66 configure a current mirror circuit.

Figure 19:
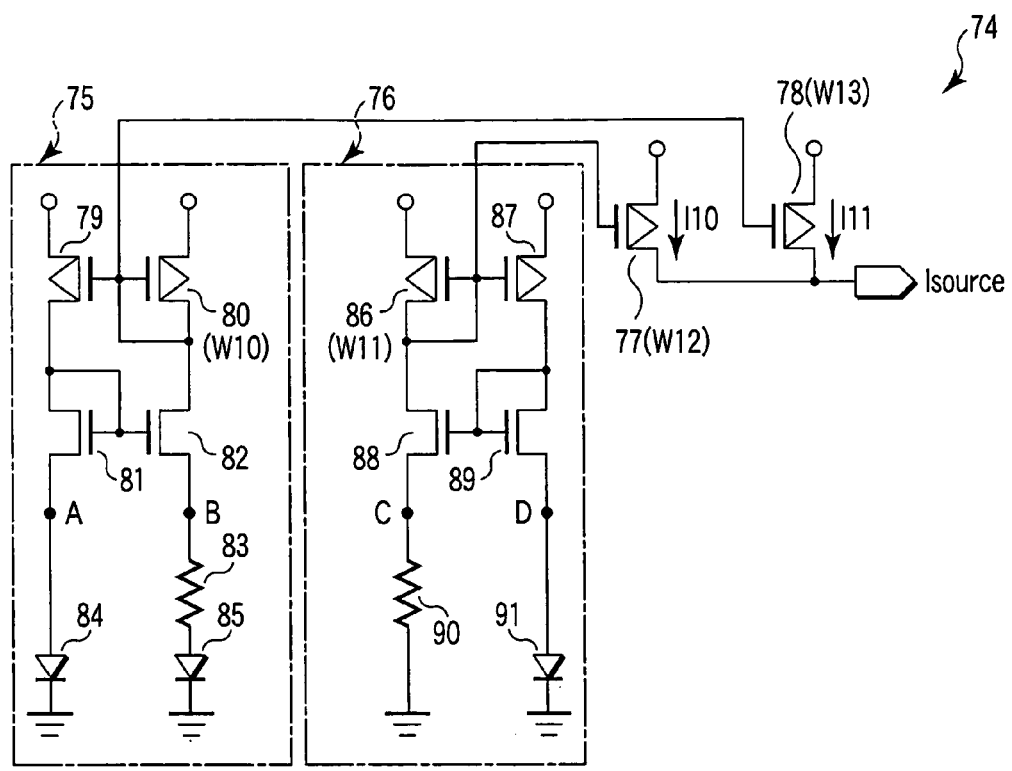
FIG. 19 is a circuit diagram of a current source provided in the MRAM according to the third embodiment of this invention.

A concrete example of the configuration of the current source 74 contained in the current supply circuit 70 is explained with reference to FIG. 19. FIG. 19 is a circuit diagram of the current source 74. As shown in FIG. 19, the current source 74 utilizes a band gap reference (BGR) circuit and roughly includes circuit blocks 75, 76 and p-channel MOS transistors 77, 78.

The circuit block 75 includes p-channel MOS transistors 79, 80, n-channel MOS transistors 81, 82, resistance element 83 and diodes 84, 85. One end of the current path of the p-channel MOS transistor 79 is connected to the power supply potential node and the other end thereof is connected to one end of the current path of the n-channel MOS transistor 81. Further, the gate of the p-channel MOS transistor 79 is connected to the gate of the p-channel MOS transistor 80. One end of the current path of the p-channel MOS transistor 80 is connected to the power supply potential node and the other end thereof is connected to one end of the current path of the n-channel MOS transistor 82. One end of the current path and the gate of the n-channel MOS transistor 81 are connected together and the other end of the current path thereof is connected to the anode of the diode 84. The cathode of the diode 84 is connected to the ground potential node. The gate of the n-channel MOS transistor 82 is connected to the gate of the n-channel MOS transistor 81 and the other end of the current path thereof is connected to one end of the resistance element 83. The other end of the resistance element 83 is connected to the anode of the diode 85 and the cathode of the diode 85 is connected to the ground potential node.

The circuit block 76 includes p-channel MOS transistors 86, 87, n-channel MOS transistors 88, 89, resistance element 90 and diode 91. One end of the current path of the p-channel MOS transistor 86 is connected to the power supply potential node and the other end of the current path thereof is connected to the gate thereof and one end of the current path of the n-channel MOS transistor 88. Further, the gate of the p-channel MOS transistor 86 is connected to the gate of the p-channel MOS transistor 87. One end of the current path of the p-channel MOS transistor 87 is connected to the power supply potential node and the other end thereof is connected to one end of the current path of the n-channel MOS transistor 89. The other end of the current path of the n-channel MOS transistor 88 is connected to one end of the resistance element 90 and the gate thereof is connected to the gate and one end of the current path of the n-channel MOS transistor 89. The other end of the resistance element 90 is connected to the ground potential node. The gate and one end of the current path of the n-channel MOS transistor 89 are connected together and the other end of the current path thereof is connected to the anode of the diode 91. The cathode of the diode 91 is connected to the ground potential node.

Potential of a connection node of the gate of the p-channel MOS transistor 79 and the gate and the other end of the current path of the p-channel MOS transistor 80 is used as an output signal of the circuit block 75. Further, potential of a connection node of the gate and the other end of the current path of the p-channel MOS transistor 86 and the gate of the p-channel MOS transistor 87 is used as an output signal of the circuit block 76.

One-side ends of the current paths of the p-channel MOS transistors 77, 78 are connected to the power supply potential node and the other ends thereof are connected together. Further, the gates of the p-channel MOS transistors 77, 78 are respectively supplied with output signals of the circuit blocks 75, 76. A current passing through a connection node of the other ends of the current paths of the p-channel MOS transistors 77, 78 is used as an output current Isource of the current source 74. The output current Isource is supplied to the gate and the other end of the current path of the n-channel MOS transistor 73 in the current source circuit 70.

Next, the function of each circuit with the above configuration at the write operation is explained. At the write operation, a write command signal WRITE is set to the "H" level. Then, at the "1" data write time, a data signal DATA is set to the "H" level. Therefore, the logical NAND value of the write command signal WRITE and data signal DATA is set to the "L" level and the logical AND value thereof is set to the "H" level. Further, the logical NAND value of the write command signal WRITE and an inverted data signal /DATA is set to the "H" level and the logical AND value thereof is set to the "L" level.

Thus, the p-channel MOS transistors of the digit line current source 15 are set into the ON state. Also, the n-channel MOS transistor 62 of the digit line current sink 16 is set to the ON state. Therefore, the digit line current source 15 supplies a write current I1 to the digit line DL based on a current output from the current supply circuit 70 according to the current Isource output from the current source 74. The write current I1 flows into the ground potential node via a corresponding one of the n-channel MOS transistors 62 of the digit line current sink 16.

Further, in the bit line current source/current sink 18, the p-channel MOS transistor 64 is set to the OFF state, the n-channel MOS transistor 65 is set to the ON state and the current sink 18-2 is operated. In the bit line current source/current sink 19, the p-channel MOS transistor 67 is set to the ON state, the n-channel MOS transistor 68 is set to the OFF state and the current source 19-1 is operated. Therefore, the current source 19-1 supplies a write current I2 to the bit line BL based on a current output from the current supply circuit 70. The write current I2 flows into the ground potential node via the n-channel MOS transistor 65 of the current sink 18-2.

The current supply circuit 70 supplies a current corresponding to the current Isource output from the current source 74. The operation of the current source 74 is explained below. The current source 74 shown in FIG. 19 outputs a constant current Isource irrespective of temperatures. In the circuit block 75, it is assumed that the switching characteristics of the diodes 84, 85 are the same. Then, potential Va at a connection node A of the n-channel MOS transistor 81 and the diode 84 and potential Vb at a connection node B of the n-channel MOS transistor 82 and the resistance element 83 are expressed by the following equations.

$$Va = Vja$$

$$Vb = Vjb + R1 \circ If$$

where Vja, Vjb respectively indicate voltage drops in the diodes 84, 85, R1 indicates the resistance of the resistance element 83 and If indicates a current supplied from the p-channel MOS transistor 80. The current If is expressed by the following equation since Va=Vb based on the characteristic of the current mirror circuit.

$$If=(Vja-Vjb)/R1=\Delta Vj/R1$$

That is, since $\Delta Vj$ is raised with a temperature rise according to the diode characteristic, the current If increases with a temperature rise. Since the p-channel MOS transistors 80 and 78 configure a current mirror circuit, the current I11 supplied from the p-channel MOS transistor 78 is expressed by the following equation.

$$I11=(W13/W10)\times If=(W13/W10)\times(\Delta Vj/R1)$$

where W10, W13 respectively indicate the channel widths of the p-channel MOS transistors 80, 78. That is, the current I11 is determined by the ratio of the channel widths of the p-channel MOS transistors 80, 78.

In the circuit block 76, potential Vc at a connection node C of the n-channel MOS transistor 88 and the resistance element 90 and potential Vd at a connection node D of the n-channel MOS transistor 89 and the diode 91 are expressed by the following equations.

$$Vc=R2\circ Ir$$

$$Vd=Vj$$

where Ir indicates a current supplied from the p-channel MOS transistor 86 and Vj indicates a voltage drop in the diode 91. The current Ir is expressed by the following equation since Vc=Vd based on the characteristic of the current mirror circuit.

$$Ir=Vj/R2$$

That is, since Vj is lowered with a temperature rise according to the diode characteristic, the current Ir decreases with a temperature rise. Since the p-channel MOS transistors 86 and 77 configure a current mirror circuit, the current I10 supplied from the p-channel MOS transistor 77 is expressed by the following equation.

$$I10=(W12/W11)\times Ir=(W12/W11)\times(Vj/R2)$$

where W11, W12 respectively indicate the channel widths of the p-channel MOS transistors 77, 86. That is, the current I10 is determined by the ratio of the channel widths of the p-channel MOS transistors 86, 77.

The output current Isource of the current source 74 is equal to (I10+I11) and can be expressed by the following equation.

$$Isource=(W13/W10)\times(\Delta Vj/R1)+(W12/W11)\times(Vj/R2)$$

Figure 20:
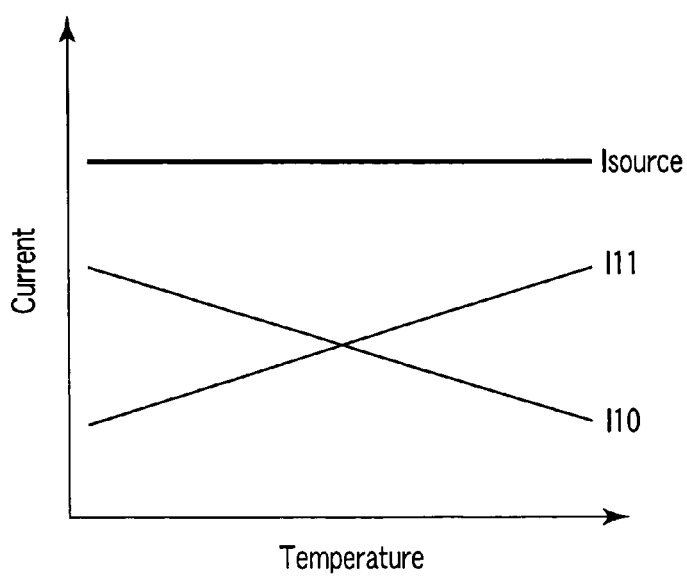
FIG. 20 is a graph showing the relation between a temperature and a current supplied by the current source provided in the MRAM according to the third embodiment of this invention.

The differential coefficient of $\Delta Vj$ with respect to the temperature and the differential coefficient of Vj with respect to the temperature are different from each other. Therefore, it is possible to design the current Isource so as not to depend on the temperature by adequately adjusting the parameters of (W13/W10), R1, (W12/W11), R2. That is, as shown in the graph of FIG. 20, the current Isource can be set to a constant value irrespective of the temperature by canceling the temperature dependencies of the currents I10, I11 on each other.

With the above circuit configuration, the values of the write currents I1, I2 can be controlled by use of the gate width W1 of the p-channel MOS transistor 60 of the digit line current source 15 and the gate widths W2, W3 of the p-channel MOS transistors 63, 66 of the bit line current sources/current sinks 18, 19. In the first and second embodiments, the relations between the write currents I1 and I2 are respectively set to I1=I2×(α2/α1) and I1=I2×c×(α2/α1). Therefore, the gate widths W1, W2, W3 of the respective transistors are designed according to (α2/α1) and c×(α2/α1). That is, the relations of W1=W2×(α2/α1)=W3×(α2/α1) and W1=W2×c×(α2/α1)=W3×c×(α2/α1) are set. For example, when it is desired to set the relation of I1=I2, the relation of W1=W2=W3 is set.

Further, it is a common practice to operate the current supply circuit 74 also in a period other than at the write time so as to attain the stable and high-speed operation. At this time, it is desired that the current supply circuit 74 does not have large drive power so as to suppress power consumption. That is, at the non-write time, it is designed to supply a current smaller than the current required for writing. For this purpose, it is desirable that the gate width W0 of the p-channel MOS transistor 71 of the current supply circuit 70 is set smaller than W1, W2.

Figure 21:
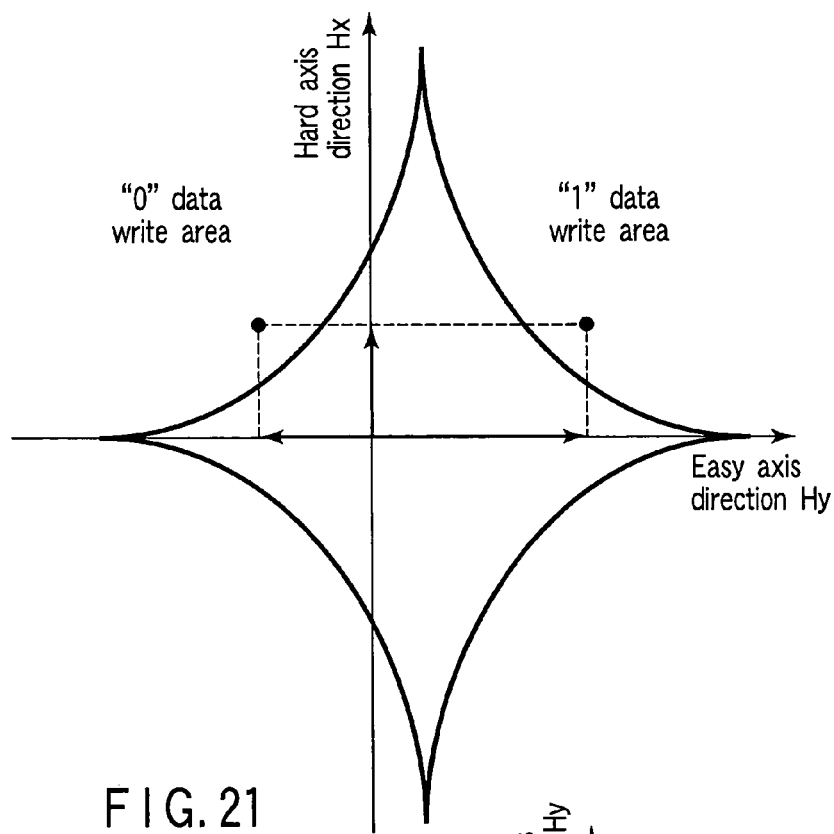
FIG. 21 is a graph showing an asteroid curve of an MRAM cell.

The write currents I2 supplied from the bit line current sources 18-1, 19-1 are not necessarily equal to each other. For example, as shown in FIG. 21, assume that the asteroid curve is deviated in the easy axis direction. Then, the threshold magnetic field in the easy axis direction is different in a case of "1" data writing and in a case of "0" data writing. That is, the values of the write currents I2 which are to be supplied to the bit lines BL are different. In this case, the gate widths W2, W3 of the p-channel MOS transistors 63, 66 of the bit line current sources/current sinks 18-1, 19-1 are designed to have different values. For example, when the write current I1 supplied from the digit line current source 15 is set to k times the write current I2 supplied from the bit line current source 18-1 and the write current I2 supplied from the bit line current source 18-1 is set to l times the write current I2 supplied from the bit line current source 19-1, the relation of W1=k×W2 and W2=l×W3 may be set.

FIG. 22 is a circuit diagram of a peripheral circuit of an MRAM according to a modification of the third embodiment. The present modification shows the configuration in which the write currents I1, I2 are controlled by use of different current supply circuits.

As shown in FIG. 22, current supply circuits 70-1, 70-2 are provided in correspondence to the digit line current source 15 and bit line current sources 18-1, 19-1. Since the current supply circuits 70-1, 70-2 are formed with the same configuration as that in the third embodiment, the explanation thereof is omitted. The current supply circuit 70-1 supplies a preset signal to the gate of the p-channel MOS transistor 60 of the digit line current source 15 to control the write current I1 supplied from the digit line current source 15. Further, the current supply circuit 70-2 supplies a preset signal to the gates of the p-channel MOS transistors 63, 66 of the bit line current sources 18-1, 19-1 to control the write currents I2 supplied from the bit line current sources 18-1, 19-1.

In the case of the present modification, as is explained in the third embodiment, the first and second embodiments can be realized by controlling the gate widths W1, W2, W3 of the p-channel MOS transistor 60 of the digit line current source 15, the p-channel MOS transistor 63 of the bit line current source 18-1 and the p-channel MOS transistor 66 of the bit line current source 19-1.

Next, a semiconductor memory device according to a fourth embodiment of this invention is explained. The fourth embodiment relates to the circuit configuration which maintains the relation between the write currents I1, I2 explained in the first and second embodiments even when the shape of the asteroid curve is changed according to a temperature change.

Figure 23:
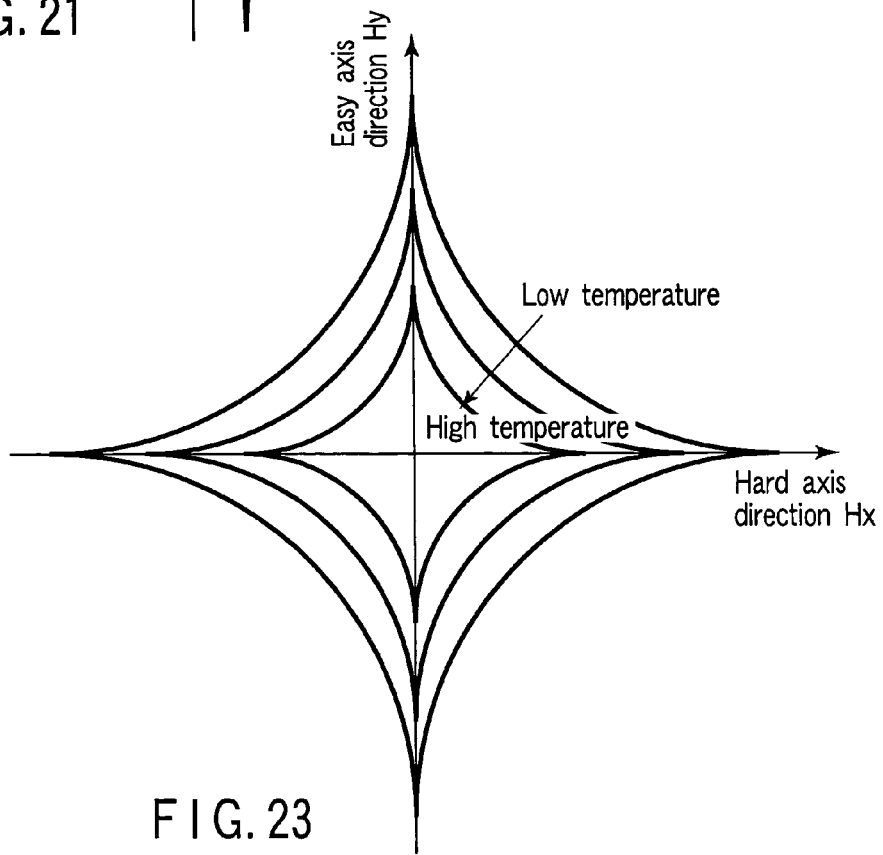
FIG. 23 is a graph showing an asteroid curve of an MRAM cell.

FIG. 23 shows an asteroid curve. As shown in FIG. 23, the asteroid curve spreads in a low temperature region and shrinks in a high temperature region. That is, the write threshold magnetic field of the MTJ element rises when the temperature becomes low and it is lowered when the temperature becomes high. Therefore, it is necessary to change the absolute values of the write currents I1, I2 according to the temperature change while the relation of the write currents I1, I2 explained in the first and second embodiments is maintained. The present embodiment shows the configuration of a peripheral circuit in the above case.

Figure 24:
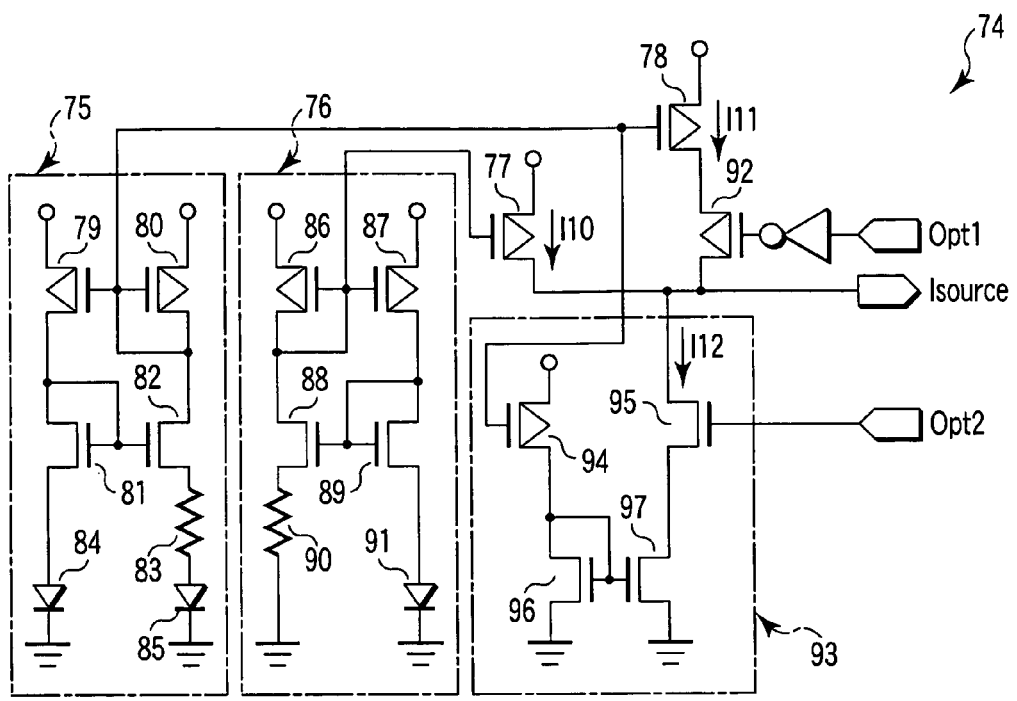
FIG. 24 is a circuit diagram of a current source provided in an MRAM according to a fourth embodiment of this invention.

An MRAM according to the present embodiment is obtained by replacing the current sources 74 of the current supply circuit 70 in FIG. 18 explained in the third embodiment and the current supply circuits 70-1, 70-2 in FIG. 22 by the configuration shown in FIG. 24. FIG. 24 is a circuit diagram of the current source 74.

As shown in FIG. 24, the current source 74 according to the present embodiment has a configuration which has a p-channel MOS transistor 92 and circuit block 93 additionally provided in the configuration shown in FIG. 19 explained in the third embodiment. The p-channel MOS transistor 92 has a current path connected between the other end of the current path of the p-channel MOS transistor 78 and the other end of the current path of the p-channel MOS transistor 77. Further, the gate of the p-channel MOS transistor 92 is supplied with an inverted signal of a control signal Opt1.

The circuit block 93 includes a p-channel MOS transistor 94 and n-channel MOS transistors 95 to 97. One end of the current path of the p-channel MOS transistor 94 is connected to a power supply potential node and the other end thereof is connected to the gate and one end of the current path of the n-channel MOS transistor 96. The gate of the p-channel MOS transistor 94 is supplied with an output signal of the circuit block 75. One end of the current path of the n-channel MOS transistor 95 is connected to a connection node of the p-channel MOS transistors 77, 92 and the other end thereof is connected to one end of the current path of the n-channel MOS transistor 97. Further, the gate of the n-channel MOS transistor 95 is supplied with a control signal Opt2. The gate and one end of the current path of the n-channel MOS transistor 96 are connected together and the other end of the current path thereof is connected to a ground potential node. The other end of the current path of the n-channel MOS transistor 97 is connected to the ground potential node and the gate thereof is connected to the gate of the n-channel MOS transistor 96. A current supplied from the n-channel MOS transistor is used as a current I12. Therefore, the output current Isource of the current source 74 is determined by the currents I10, I11 and I12.

Figure 25:
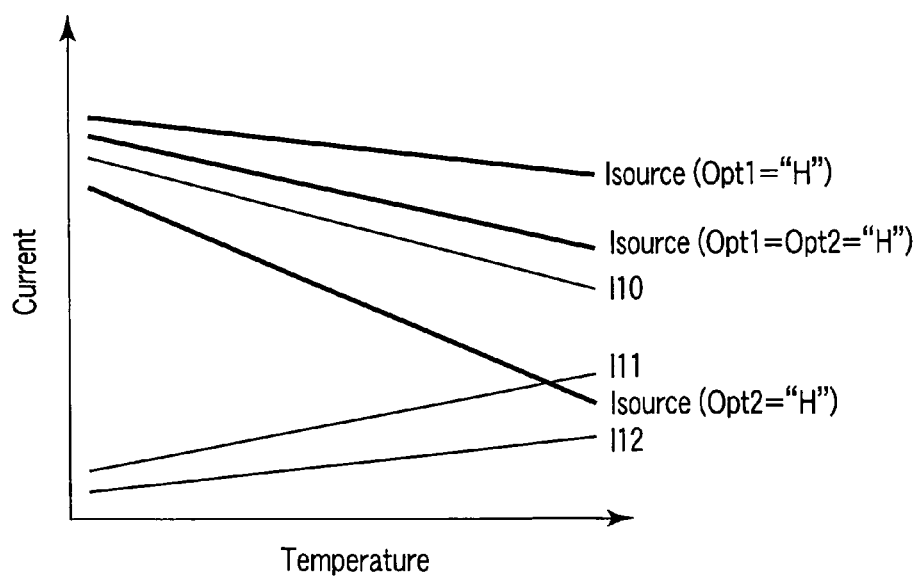
FIG. 25 is a graph showing the relation between a temperature and a current supplied by the current source provided in the MRAM according to the fourth embodiment of this invention.

Next, the operation of the current source 74 with the above configuration is explained with reference to FIG. 25. FIG. 25 is a graph showing the relation between the current and temperature.

As described before, the circuit block 75 gives a component which increases with a temperature rise. Further, the circuit block 76 gives a component which decreases with a temperature rise. The circuit block 93 is operated according to the output signal of the circuit block 75 and gives a component which increases with a temperature rise. Therefore, the currents I10, I11, I12 supplied from the p-channel MOS transistors 77, 78 and n-channel MOS transistor 95 have the temperature dependency as shown in FIG. 25. The current Isource depends on the currents I10, I11 and I12.

First, when the control signals Opt1=Opt2="L", the p-channel MOS transistor 92 and n-channel MOS transistor 95 are set to the OFF state. Therefore, Isource=I10.

Next, when the control signal Opt1="H" and the control signal Opt2="L", the p-channel MOS transistor 92 is set to the ON state and the n-channel MOS transistor 95 is set to the OFF state. Therefore, Isource=I10+I11. In this case, the current source 74 can supply the maximum current.

When the control signal Opt1="L" and the control signal Opt2="H", the p-channel MOS transistor 92 is set to the OFF state and the n-channel MOS transistor 95 is set to the ON state. Therefore, Isource=I10−I12. In this case, the current source 74 can supply the minimum current.

Next, when the control signals Opt1=Opt2="H", the p-channel MOS transistor 92 and n-channel MOS transistor 95 are set to the ON state. Therefore, Isource=I10+I11−I12. In this case, the current source 74 can supply an intermediate current between the current obtained in the case of the control signal Opt1="H" and the control signal Opt2="L" and the current obtained in the case of the control signal Opt1="L" and the control signal Opt2="H".

As described above, in the current source according to the present embodiment, a BGR circuit is configured to have temperature dependency. With the configuration of FIG. 19 explained in the third embodiment, the output current Isource of the current source 74 is expressed by the following equation.

$$I_{source}=(W13/W10) \times (\Delta Vj/R1)+(W12/W11) \times (Vj/R2)$$

Generally, a differential coefficient of $\Delta Vj$ with respect to the temperature is smaller than a differential coefficient of $Vj$ with respect to the temperature. Therefore, the current supply amount of the current source 74 decreases with a temperature rise by setting the relation of $(W13/W10) \div R1 = (W12/W11) \div R2$ to. That is, an influence on the output current Isource by the current I10 which decreases as the temperature rises becomes larger than an influence by the current I11 which increases as the temperature rises. As a result, the output current Isource decreases with a temperature rise.

Further, with the circuit configuration of the present embodiment, the current I11 having a positive increase tendency with respect to a temperature rise can be added to the current I10 having a negative increase tendency with respect to a temperature rise. Further, the current I12 having a positive increase tendency with respect to a temperature rise can be subtracted from the current I10. The operation of adding the current I11 to the current I10 is performed by use of a control signal Opt1 and the operation of subtracting the current I12 from the current I10 is performed by use of a control signal Opt2. Therefore, the output current Isource can be selectively set to the following four values depending on the control signals Opt1, Opt2 (refer to FIG. 25).

Isource=I10 in the case of Opt1="L" and Opt2=
Isource=I10+I11 in the case of Opt1="H" and Opt2="L".
Isource=I10−I12 in the case of Opt1="L" and Opt2="H".
Isource=I10+I11−I12 in the case of Opt1="H" and Opt2="H".

That is, optimum write currents I1, I2 can be supplied by selecting the most adequate output current Isource according to a variation in the asteroid curve caused by a temperature change. If the output current Isource which causes the current variation with respect to the temperature change to coincide with the variation in the asteroid curve can be provided, the control signals Opt1, Opt2 can be set constant in the entire temperature range. However, if such an output current cannot be provided, the control signals Opt1, Opt2 can be selectively set in the temperature ranges.

Figure 26:
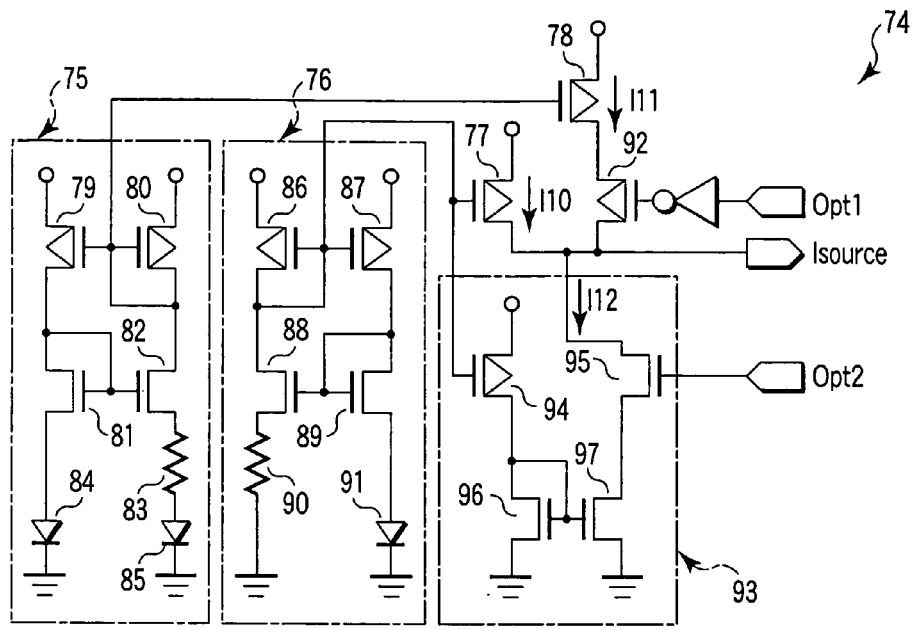
FIG. 26 is a circuit diagram of a current source provided in an MRAM according to a modification of the fourth embodiment of this invention.
Figure 27:
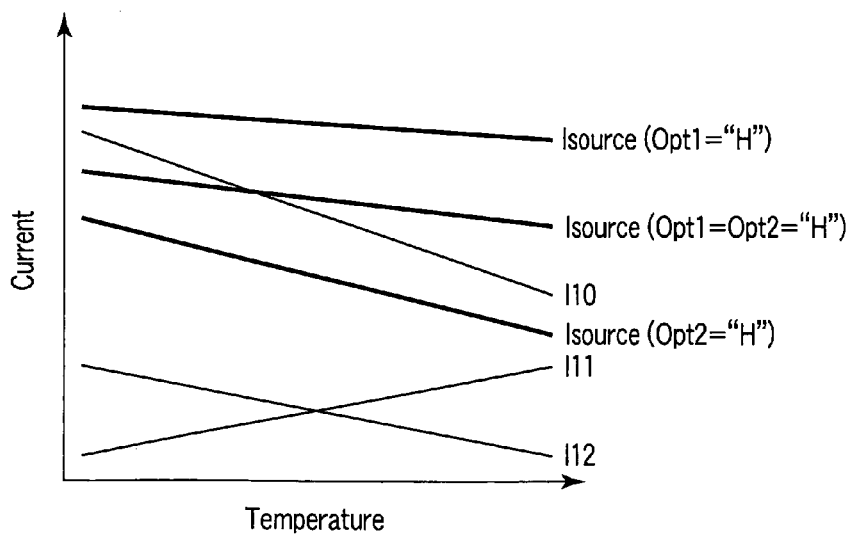
FIG. 27 is a graph showing the relation between a temperature and a current supplied by the current source provided in the MRAM according to the modification of the fourth embodiment of this invention.

FIG. 26 is a circuit diagram of the current source 74 according to a modification of the fourth embodiment. In the present modification, an output signal of the circuit block 76 is input instead of the output signal of the circuit block 75 to the gate of the p-channel MOS transistor of the circuit block 93 in FIG. 24 of the fourth embodiment. With this configuration, the circuit block 93 gives a component which decreases with a temperature rise. That is, the current I12 decreases with the temperature rise.

As described above, in the present modification, the current I11 having a positive increase tendency with respect to a temperature rise can be added to the current I10 having a negative increase tendency with respect to a temperature rise. Further, the current I12 having a negative increase tendency with respect to a temperature rise can be subtracted from the current I10. The operation of adding the current I11 to the current I10 is performed by use of a control signal Opt1 and the operation of subtracting the current I12 from the current I10 is performed by use of a control signal Opt2. In this case, the degree of a variation in the output current Isource of the current source 74 with respect to a temperature change can be made smoother in comparison with a case of FIGS. 24, 25.

Next, a semiconductor memory device according to a fifth embodiment of this invention is explained. Like the fourth embodiment, the fifth embodiment relates to a current source in which a current Isource varies with a temperature change. In the fourth embodiment, the current source 74 linearly changes the output current Isource. However, the dependency of the asteroid curve on the temperature is not always a simple linear function but it has a tendency to be shrunk when the temperature becomes high. In the fifth embodiment, the configuration of the current source which copes with the above case is shown. FIG. 28 is a circuit diagram of the current source 74 according to this embodiment.

As shown in FIG. 28, the current source 74 includes circuit blocks 75-1, 76-1, 93 and p-channel MOS transistors 98 to 100. The circuit blocks 75-1, 76-1, 93 according to the present embodiment are the same as the circuit blocks 75, 76, 93, and therefore, the explanation thereof is omitted. The gate of the p-channel MOS transistor 94 in the circuit block 93 is supplied with an output signal of the circuit block 75-1 and the gate of the n-channel MOS transistor 95 is supplied with a temperature discrimination signal Vtemp. The temperature voltage Vtemp is described later.

One end of the current path of the p-channel MOS transistor 98 is connected to the power supply potential node and the gate thereof is supplied with an output signal of the circuit block 76-1. One end of the current path of the p-channel MOS transistor 99 is connected to the power supply potential node and the gate thereof is supplied with the output signal of the circuit block 76-1. One end of the current path of the p-channel MOS transistor 100 is connected to the other end of the current path of the p-channel MOS transistor 99 and the gate thereof is supplied with an inverted signal of the temperature discrimination signal Vtemp. The other ends of the current paths of the p-channel MOS transistors 98, 100 and one end of the current path of the n-channel MOS transistor in the circuit block 93 are commonly connected. A current passing through the common connection node is used as the output current Isource of the current source 74.

FIG. 29 is a circuit diagram of a temperature sensor. The temperature sensor determines whether a preset temperature is reached or not and sets the temperature discrimination signal Vtemp to "H" or "L". As shown in FIG. 29, the temperature sensor 110 includes circuit blocks 75-2, 76-2, 120 and p-channel MOS transistor 111. Since the configurations of the circuit blocks 75-2, 76-2 are the same as those of the circuit blocks 75, 76 in the fourth embodiment, the explanation thereof is omitted.

One end of the current path of the p-channel MOS transistor 111 is connected to the power supply potential node and the gate thereof is supplied with an output signal of the circuit block 76-2.

The circuit block 120 includes a p-channel MOS transistor 121 and n-channel MOS transistors 122, 123. One end of the current path of the p-channel MOS transistor 121 is connected to the power supply potential node and the gate thereof is supplied with an output signal of the circuit block 75-2. The gate and one end of the current path of the n-channel MOS transistor 122 are commonly connected and the common connection node is connected to the other end of the current path of the p-channel MOS transistor 121. Further, the other end of the current path of the n-channel MOS transistor 122 is connected to the ground potential node. One end of the current path of the n-channel MOS transistor 123 is connected to the other end of the current path of the p-channel MOS transistor 111, the other end of the current path thereof is connected to the ground potential node and the gate thereof is connected to the gate of the n-channel MOS transistor 122.

In the temperature sensor 110 with the above configuration, voltage obtained by inverting the potential of the connection node of the p-channel MOS transistor 111 and n-channel MOS transistor 123 by use of an inverter is used as the temperature discrimination signal Vtemp.

In the temperature sensor 110, the circuit block 75-2 produces a component which increases with a temperature rise and the circuit block 76-2 produces a component which decreases with a temperature rise. A current flowing through the connection node of the p-channel MOS transistor 111 and n-channel MOS transistor 123 is equal to a difference between a current supplied from the p-channel MOS transistor 111 and a current supplied from the n-channel MOS transistor 123. When the temperature rises, the current supplied from the p-channel MOS transistor 111 decreases and the current supplied from the n-channel MOS transistor 123 increases. As a result, potential of the connection node of the p-channel MOS transistor 111 and n-channel MOS transistor 123 is lowered. On the other hand, if the temperature is lowered, the current supplied from the p-channel MOS transistor 111 increases and the current supplied from the n-channel MOS transistor 123 decreases. As a result, the potential of the connection node of the p-channel MOS transistor 111 and n-channel MOS transistor 123 rises.

The potential of the connection node of the p-channel MOS transistor 111 and n-channel MOS transistor 123 is inverted by an inverter and used as the temperature discrimination signal Vtemp. Therefore, when the temperature is lower than a preset threshold temperature, the temperature discrimination signal Vtemp is set to the "L" level and when it is higher than the preset threshold temperature, the temperature discrimination signal Vtemp is set to the "H" level.

Next, the operation of the current source 74 with the above configuration is explained with reference to FIG. 30. FIG. 30 is a graph showing the relation between the temperature and the temperature discrimination signal Vtemp and the relation between the temperature and current.

The p-channel MOS transistors 98, 99 are operated in response to an output signal of the circuit block 76-1. Therefore, the currents I13, I15 supplied from the p-channel MOS transistors 98, 99 become smaller with a temperature rise. The circuit block 93 is operated in response to an output signal of the circuit block 75-1. Therefore, the current I14 supplied from the n-channel MOS transistor 95 becomes larger with a temperature rise. That is, the currents I13, I14 and I15 have the characteristics as shown in FIG. 30. Then, Isource depends on I13, I14 and I15.

First, when the temperature is lower than a preset temperature, the temperature discrimination signal Vtemp is set to "L". Therefore, the p-channel MOS transistor 100 is set to the OFF state and the n-channel MOS transistor 95 in the circuit block 93 is also set to the OFF state. As a result, the relation of Isource=I13 is obtained.

When the temperature is higher than the preset temperature, the temperature discrimination signal Vtemp is set to "H". Therefore, the p-channel MOS transistor 100 is set to the ON state and the n-channel MOS transistor 95 in the circuit block 93 is also set to the ON state. As a result, the relation of Isource=I13+I15−I14 is obtained. Thus, the gradient of the output current Isource of the current source 74 is changed depending on whether the temperature is lower or higher than the preset temperature. In the case of this embodiment, the gradient of the curve Isource becomes steeper when the temperature exceeds the preset temperature.

As described above, in the MRAM according to the present embodiment, the current source and the temperature sensor are combined. When the temperature sensor detects that the preset temperature is exceeded, the output current Isource is designed to depend on the component I14 which decreases with a temperature rise. Therefore, the degree of a lowering in the output current Isource of the current source 74 with a temperature rise can be made larger with a temperature rise. As a result, In the MRAM having the asteroid curve indicating that the degree of shrinkage becomes higher with a temperature rise, the relation of the write currents I1, I2 explained in the first and second embodiments can be realized.

Figure 31:
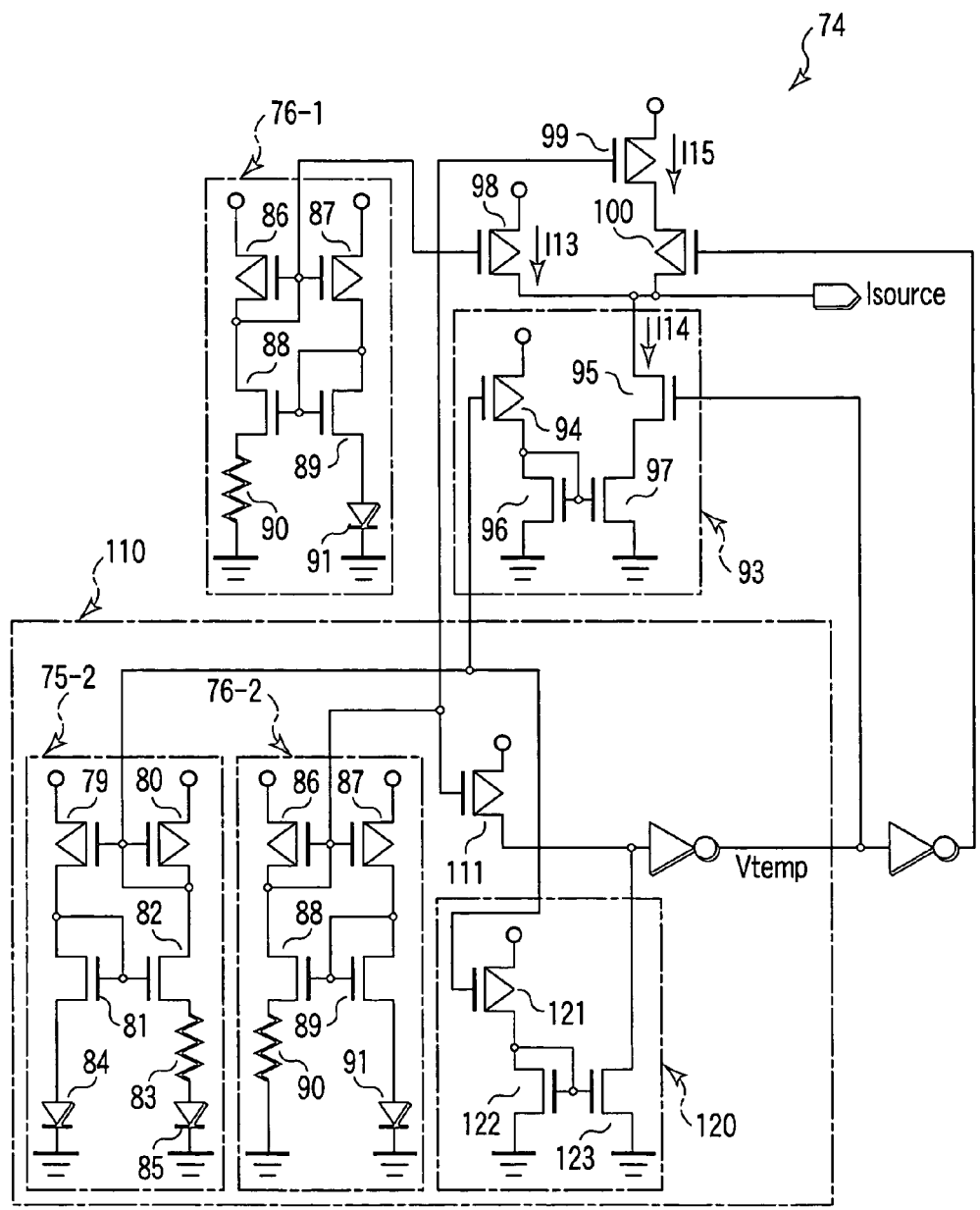
FIG. 31 is a circuit diagram of a current source provided in the MRAM according to the fifth embodiment of this invention.

FIG. 31 is a circuit diagram showing one example in which the temperature sensor 110 is incorporated into the current source 74. In the example of FIG. 31, an output signal of the circuit block 75-2 of the temperature sensor 110 is input to the gate of the p-channel MOS transistor 94 and an output signal of the circuit block 76-2 is input to the gate of the p-channel MOS transistor 99. That is, the circuit block 75-2 is used as the circuit block 75-1 and the circuit block 76-2 is used as the circuit block 76-1. With this configuration, the operation of FIG. 30 can be realized and, at the same time, the circuit configuration can be made small.

Figure 32:
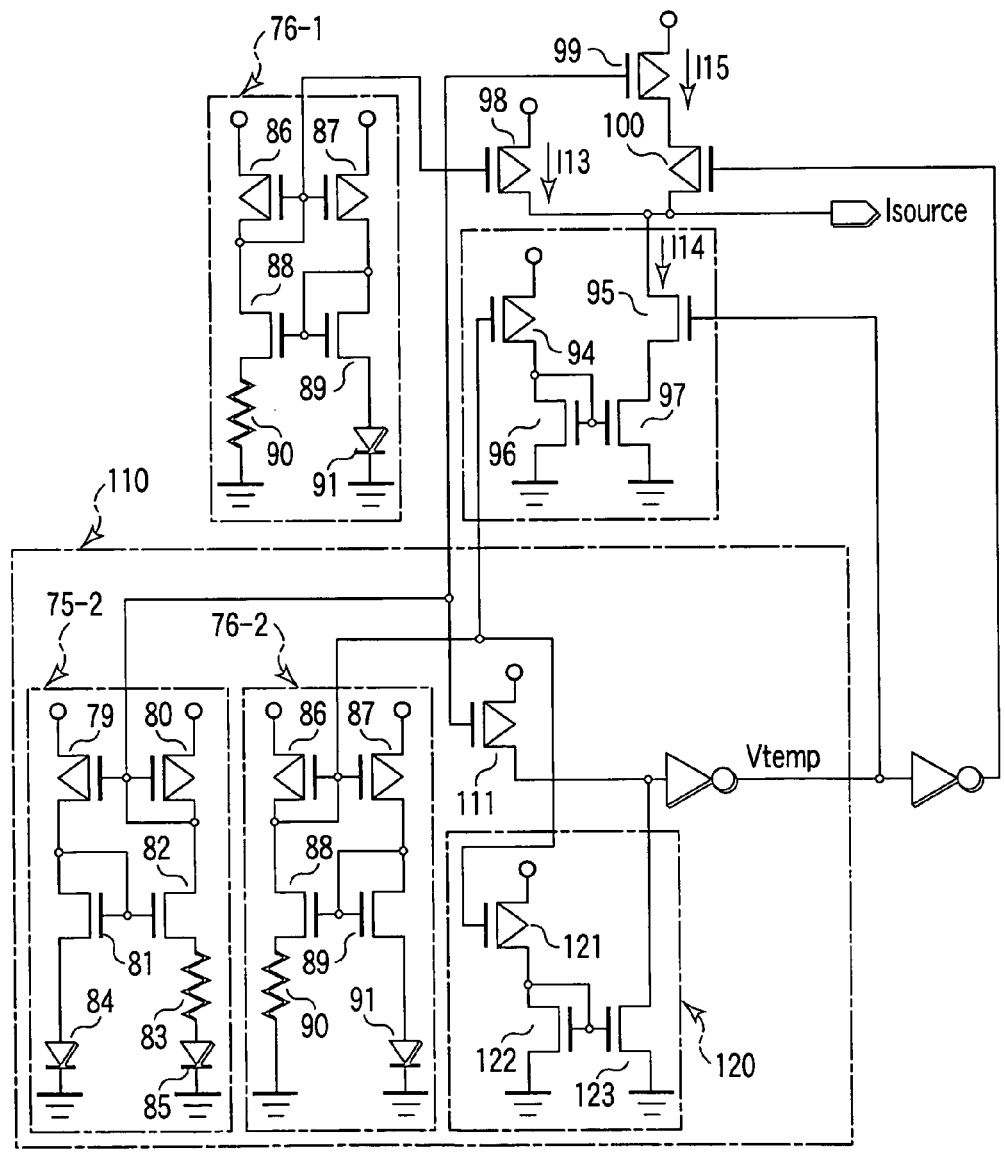
FIG. 32 is a circuit diagram of a current source provided in an MRAM according to a modification of the fifth embodiment of this invention.

FIG. 32 is a circuit diagram of the current source 74 according to a modification of the fifth embodiment. In the present modification, an output signal of the circuit block 75-2 is input to the gates of the p-channel MOS transistors 99, 100 and an output signal of the circuit block 76-2 is input to the gates of the p-channel MOS transistors 94, 121 in the circuit of FIG. 31 of the fifth embodiment.

Therefore, the potential of the connection node of the p-channel MOS transistor 111 and n-channel MOS transistor 123 in the temperature sensor 110 becomes higher with the temperature rise and becomes lower with the temperature drop. Therefore, the temperature discrimination signal Vtemp is set into the inverted form with respect to that in the case of FIG. 30. That is, the temperature discrimination signal Vtemp is set to the "H" level or "L" level when the temperature is lower or higher than the preset temperature, respectively.

Then, in the case of Vtemp="L" level, the output current Isource of the current source 74 is set to I13 since the p-channel MOS transistor 100 and n-channel MOS transistor 95 are set to the OFF state. In the case of Vtemp="H" level, the p-channel MOS transistor 100 and n-channel MOS transistor 97 are set to the ON state. In this case, the current I15 supplied from the p-channel MOS transistor 99 increases with the temperature rise and the current I14 supplied from the n-channel MOS transistor 95 decreases with the temperature rise. Then, the output current Isource of the current source 74 becomes equal to (I13+I15−I14). That is, as shown in FIG. 33, when the temperature is equal to or higher than the preset temperature, the gradient of Isource is equal to that of I13 and when the temperature is lower than the preset temperature, the gradient of Isource becomes gentle.

Figure 34:
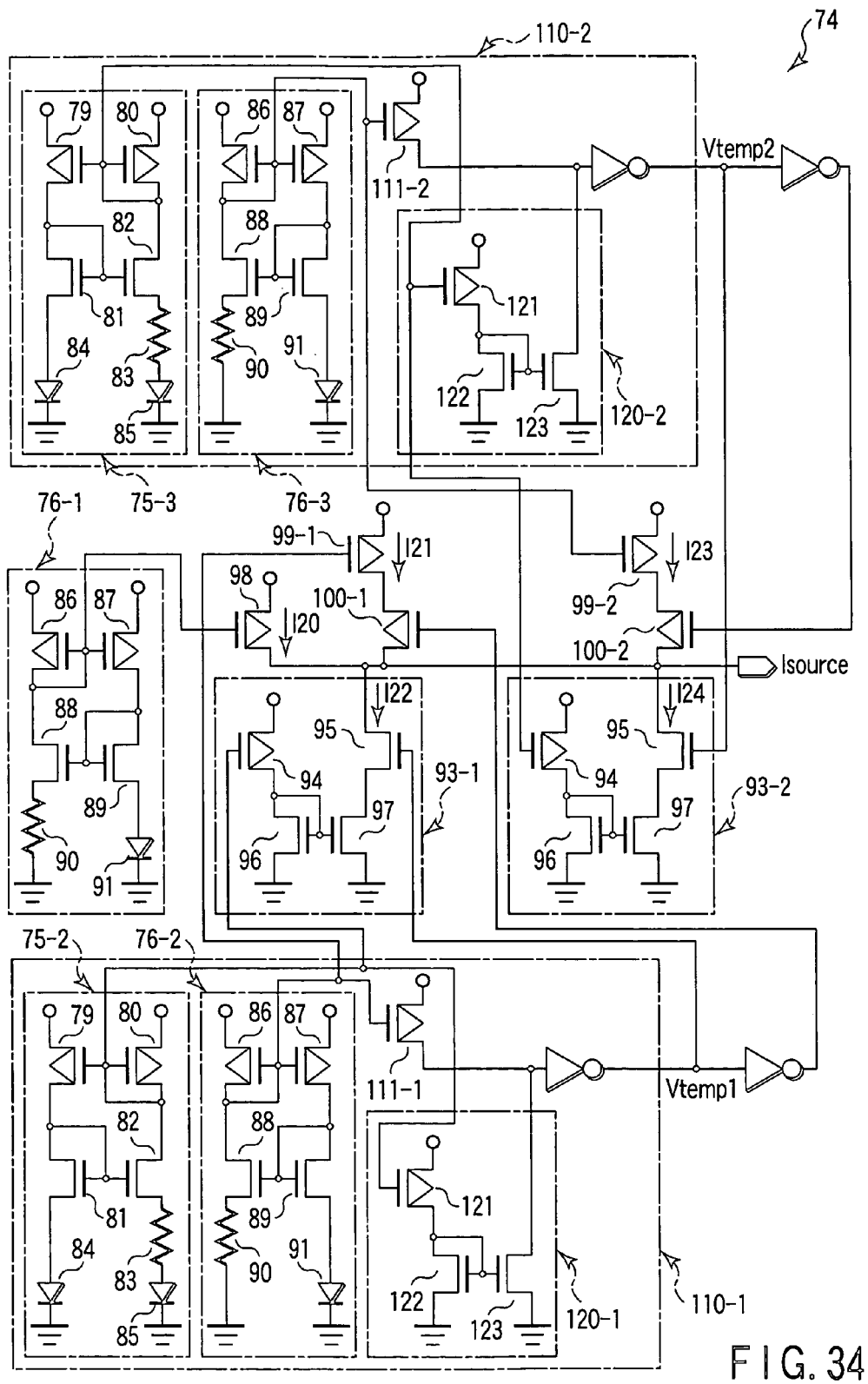
FIG. 34 is a circuit diagram of a current source provided in an MRAM according to a sixth embodiment of this invention.

Next, a semiconductor memory device according to a sixth embodiment of this invention is explained. Like the fifth embodiment, the sixth embodiment is configured to change the gradient of Isource supplied from the current source 74 with a specified temperature used as a boundary. In the fifth embodiment, the point at which the gradient of the current Isource is changed is only one point. However, in the present embodiment, the gradient is changed at two points. FIG. 34 is a circuit diagram of the current source 74 provided in an MRAM according to the present embodiment.

The current source 74 having a configuration in which a temperature sensor is additionally provided in the configuration of FIG. 31 explained in the fifth embodiment. As shown in FIG. 34, the current source 74 includes circuit blocks 76-1, 93-1, 93-2; p-channel MOS transistors 98, 99-1, 99-2, 100-1, 100-2 and temperature sensors 110-1, 110-2.

The circuit block 76-1 has the same configuration as that of the circuit block 76-1 explained with reference to FIG. 31 in the fifth embodiment. Further, the circuit blocks 93-1, 93-2 have the same configuration as that of the circuit block 93 shown in FIG. 31. Also, the temperature sensors 110-1, 110-2 have the same configuration as that of the temperature sensor 110 in FIG. 31. Therefore, the explanation thereof is omitted. Temperature discrimination signals output from the temperature sensors 110-1, 110-2 are respectively referred to as Vtemp1, Vtemp2.

One end of the current path of the p-channel MOS transistor 98 is connected to a power supply potential node and the other end thereof is connected to an output node (a node from which the current Isource is output) of the current source 74. Further, the gate of the p-channel MOS transistor 98 is supplied with an output signal of the circuit block 76-1. One end of the current path of the p-channel MOS transistor 99-1 is connected to the power supply potential node and the gate thereof is supplied with an output signal of the circuit block 76-2 of the temperature sensor 110-1. One end of the current path of the p-channel MOS transistor 100-1 is connected to the other end of the current path of the p-channel MOS transistor 99-1 and the other end thereof is connected to the output node of the current source 74. Further, the gate of the p-channel MOS transistor 100-1 is supplied with an inverted signal of the temperature discrimination signal Vtemp1.

One end of the current path of the p-channel MOS transistor 99-2 is connected to the power supply potential node and gate thereof is supplied with an output signal of the circuit block 76-3 of the temperature sensor 110-2. One end of the current path of the p-channel MOS transistor 100-2 is connected to the other end of the current path of the p-channel MOS transistor 99-2 and the other end thereof is connected the output node of the current source 74. Further, the gate of the p-channel MOS transistor 100-2 is supplied with an inverted signal of the temperature discrimination signal Vtemp2.

In the circuit block 93-1, an output signal of the circuit block 75-2 of the temperature sensor 110-1 is input to the gate of the p-channel MOS transistor 94. Further, one end of the current path of the n-channel MOS transistor 95 is connected to the output node of the current source 74 and the gate thereof is supplied with the temperature discrimination signal Vtemp1.

In the circuit block 93-2, an output signal of the circuit block 75-3 of the temperature sensor 110-2 is input to the gate of the p-channel MOS transistor 94. Further, one end of the current path of the n-channel MOS transistor 95 is connected to the output node of the current source 74 and the gate thereof is supplied with the temperature discrimination signal Vtemp2.

The temperature sensors 110-1, 110-2 perform the same operation as explained in the fifth embodiment. That is, the temperature discrimination signals Vtemp1, Vtemp2 are set to the "L" level when the temperature is set below the preset temperature and the temperature discrimination signals Vtemp1, Vtemp2 are set to the "H" level when the temperature is set equal to or higher than the preset temperature. In this case, as shown by the graph which indicates the relation between the temperature and voltage in FIG. 35, threshold values at which the outputs are inverted are different. In the temperature sensor 110-1, an output of the temperature discrimination signal Vtemp1 is inverted at the temperature T1. In the temperature sensor 110-2, an output of the temperature discrimination signal Vtemp2 is inverted at the temperature T2 higher than the temperature T1.

Figure 35:
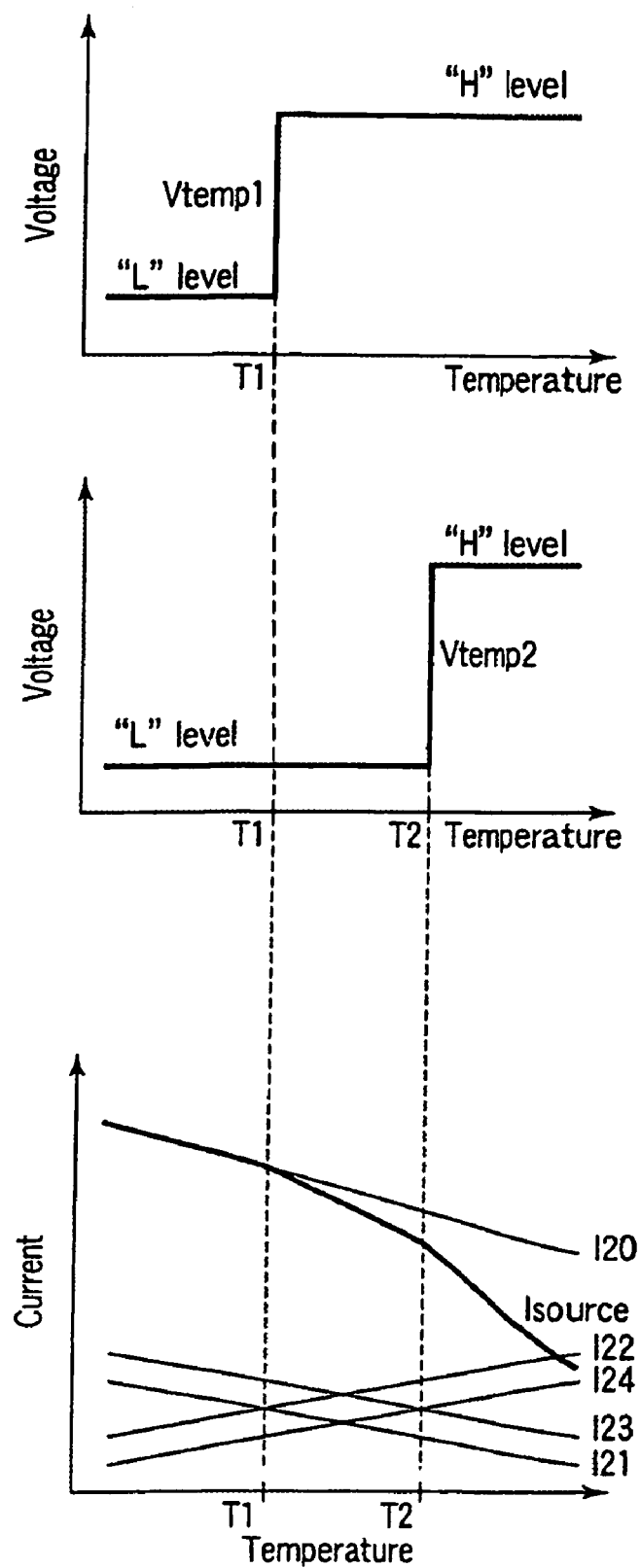
FIG. 35 is a graph showing the relation between a temperature and a current output from the current source and voltage output from a temperature sensor provided in the MRAM according to the sixth embodiment of this invention.

Next, the operation of the current source 74 of this embodiment is explained with reference to FIG. 35. FIG. 35 is a graph showing variations in the temperature discrimination signals Vtemp1, Vtemp2 and current Isource with respect to a temperature change.

First, a case wherein the temperature is lower than T1 is explained. In this case, Vtemp1=Vtemp2="L" level. Therefore, the p-channel MOS transistors 100-1, 100-2 and the n-channel MOS transistors 95 in the circuit blocks 93-1, 93-2 are set to the OFF state. Therefore, the output current Isource of the current source 74 is determined by the current I20 output from the p-channel MOS transistor 98 and Isource=I20.

Next, a case wherein the temperature is set in the range of T1 to T2 is explained. In this case, Vtemp1="H" level and Vtemp2="L" level. Therefore, the p-channel MOS transistor 100-1 and the n-channel MOS transistor 95 in the circuit block 93-1 are set to the ON state and the p-channel MOS transistor 100-2 and the n-channel MOS transistor 95 in the circuit block 93-2 are set to the OFF state. Therefore, the output current Isource of the current source 74 is determined by the currents I20, I21, I22 respectively output from the p-channel MOS transistors 98, 99-1 and the n-channel MOS transistor 95 in the circuit block 93-1. That is, the output current Isource=I20+I21−I22. As a result, the gradient of the current Isource with respect to a temperature change becomes steeper than that in the case wherein the temperature is not higher than the temperature T1 and the rate of a lowering increases with a temperature change.

Next, a case wherein the temperature is equal to or higher than the temperature T2 is explained. In this case, Vtemp1=Vtemp2="H" level. Therefore, the p-channel MOS transistors 100-1, 100-2 and the n-channel MOS transistors 95 in the circuit blocks 93-1, 93-2 are set to the ON state. Therefore, the output current Isource of the current source 74 is determined by the currents I20, I21, I22, I23, I24 respectively output from the p-channel MOS transistors 98, 99-1 and the n-channel MOS transistors 95 in the circuit blocks 93-1, 93-2. That is, the output current Isource=I20+I21−I22+I23−I24. As a result, the gradient of the current Isource with respect to a temperature change becomes higher than that in the case wherein the temperature is set in the temperature range of T1 to T2 and the rate of a lowering increases with a temperature change.

As described above, in the MRAM according to the present embodiment, the two temperature sensors 110-1, 110-2 are combined in the current source 74. When the output of the temperature sensor 110-1 is inverted, the output current Isource of the current source 74 varies depending not only on I20 but also on I21, I22. Further, when the output of the temperature sensor 110-2 is inverted, the output current Isource varies depending not only on I20, I21, I22 but also on I23, I24. As a result, a variation in the gradient of the output current Isource with respect to the temperature can be more finely set in comparison with a case of the fifth embodiment.

Figure 36:
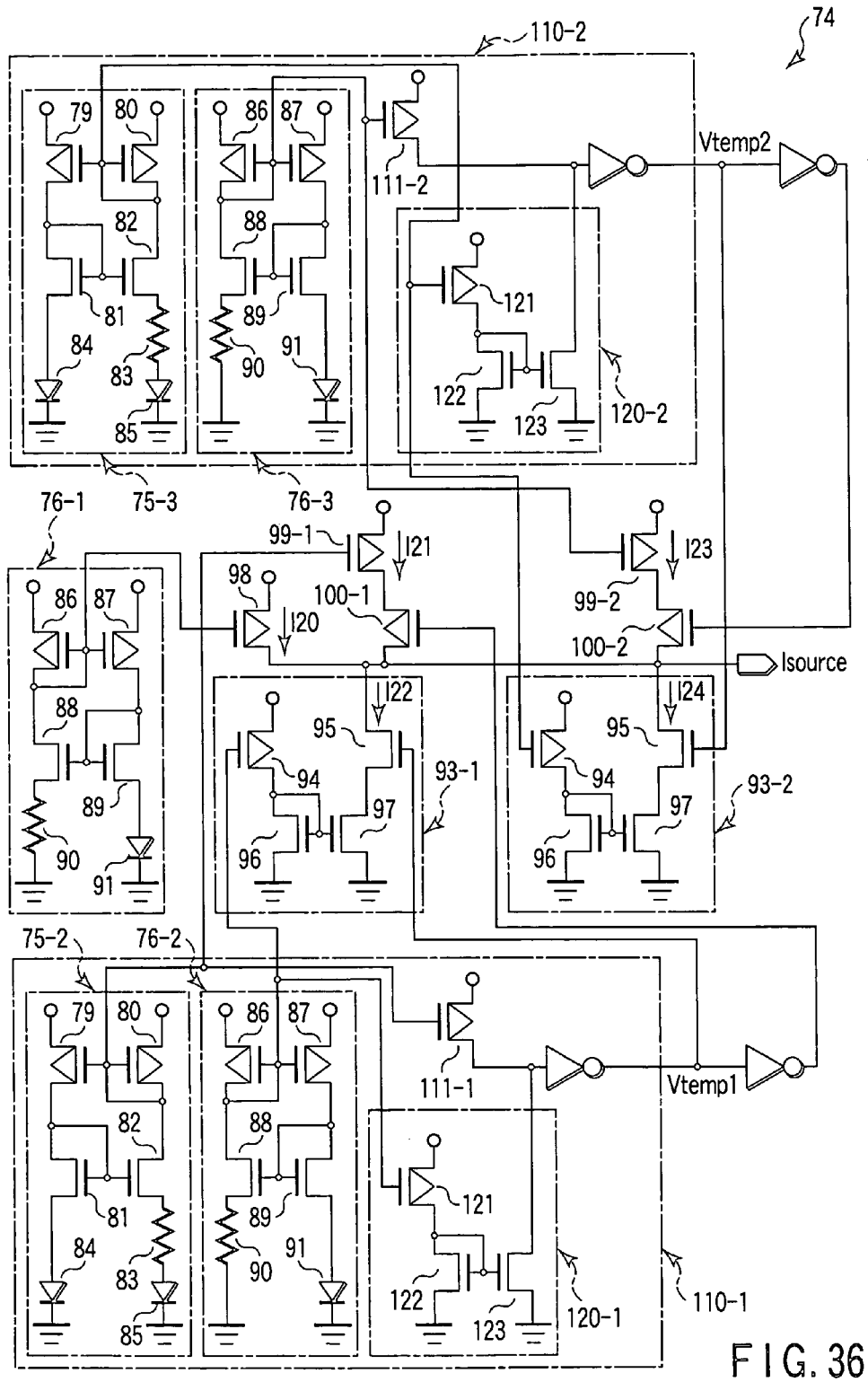
FIG. 36 is a circuit diagram of a current source provided in an MRAM according to a modification of the fifth embodiment of this invention.

FIG. 36 is a circuit diagram of the current source 74 according to a modification of the sixth embodiment. The present modification is a combination of the temperature sensor shown in FIG. 31 explained in the fifth embodiment and the temperature sensor shown in FIG. 31 explained in the modification of the fifth embodiment.

As shown in FIG. 36, the configuration of the temperature sensor 110-1 in the configuration shown in FIG. 34 is replaced by the configuration of a temperature sensor 110 shown in FIG. 32. Therefore, the temperature sensor 110-1 outputs a temperature discrimination signal Vtemp1 which is set to the "H" level when the temperature is lower than the temperature T1 and is set to the "L" level when the temperature is not lower than the temperature T1. Further, an output signal of the circuit block 75-2 of the temperature sensor 110-1 is input to the gate of the p-channel MOS transistor 99-1 and an output signal of the circuit block 76-2 of the temperature sensor 110-1 is input to the gate of the p-channel MOS transistor 94 of the circuit block 93-1.

Next, the operation of the current source 74 according to the above modification is explained with reference to FIG. 37. FIG. 37 is a graph showing variations in the temperature discrimination signals Vtemp1, Vtemp2 and current Isource with respect to a temperature change.

First, a case wherein the temperature is equal to or lower than the temperature T1 is explained. In this case, Vtemp1="H" level and Vtemp2="L" level. Therefore, the p-channel MOS transistor 100-1 and the n-channel MOS transistor 95 of the circuit block 93-1 are set to the ON state and the p-channel MOS transistor 100-2 and the n-channel MOS transistor 95 of the circuit block 93-2 are set to the OFF state. As a result, the output current Isource of the current source 74 becomes equal to (I20+I21−I22).

Next, a case wherein the temperature is set in the temperature range between T1 and T2 is explained. In this case, Vtemp1=Vtemp2="L" level. Therefore, the p-channel MOS transistors 100-1, 100-2 and the n-channel MOS transistors 95 of the circuit block 93-1, 93-2 are set to the OFF state. As a result, Isource=I10 and the gradient of the current Isource with respect to a temperature change becomes steeper than that in the case where the temperature is equal to or lower than T1.

Further, a case wherein the temperature is equal to or higher than the temperature T2 is explained. In this case, Vtemp1="L" level and Vtemp2="H" level. Therefore, the p-channel MOS transistor 100-1 and the n-channel MOS transistor 95 of the circuit block 93-1 are set to the OFF state and the p-channel MOS transistor 100-2 and the n-channel MOS transistor 95 of the circuit block 93-2 are set to the ON state. As a result, the current Isource becomes equal to (I10+I23−I24). Thus, the gradient of the current Isource with respect to a temperature change becomes higher than that in the case where the temperature is set in the temperature range of T1 to T2 and the rate of a lowering increases with a temperature change.

That is, as shown in FIG. 37, in this modification, a change in the gradient of the current Isource with respect to the temperature change can be made smoother in comparison with the case of the sixth embodiment.

Of course, the fourth to sixth embodiments can also be applied to a case wherein the write current I2 supplied to the bit line BL as explained in the modification of the third embodiment varies depending on write data.

Figure 38:
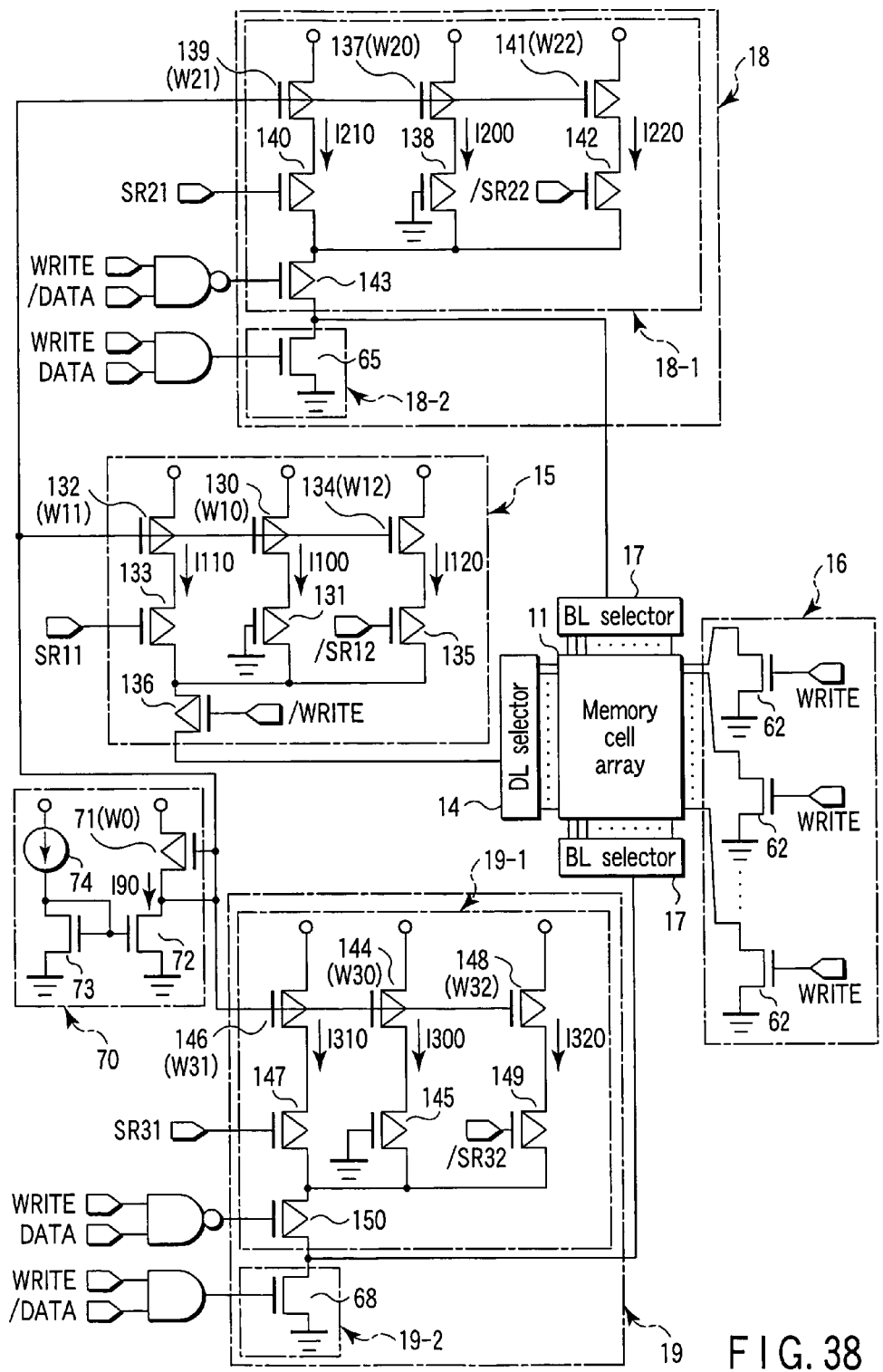
FIG. 38 is a circuit diagram of a partial region of an MRAM according to a seventh embodiment of this invention.

Next, a semiconductor memory device according to a seventh embodiment of this invention is explained. The present embodiment relates to a concrete example of a peripheral circuit which realizes the first and second embodiments by use of a method different from that of the third embodiment. In the third embodiment, the optimum write currents I1, I2 are obtained by controlling the gate voltages of the transistors in the digit line current source 15 and bit line current sources 18-1, 19-1. However, in the present embodiment, optimum write currents I1, I2 are obtained by controlling the number of transistors which are set to the ON state in the digit line current source 15 and bit line current sources 18-1, 19-1. FIG. 38 is a circuit diagram mainly showing a peripheral circuit of an MRAM according to this embodiment.

The digit line current source 16 and bit line current sources 18-1, 19-2 are the same as those of the third to sixth embodiments, and therefore, the explanation thereof is omitted. Further, the current supply circuit 70 is also the same as that of the third embodiment and the explanation thereof is omitted.

The digit line current source 15 includes seven p-channel MOS transistors 130 to 136. One end of the current path of the p-channel MOS transistor 130 is connected to a power supply potential node and the gate thereof is connected to an output node of the current supply circuit 70 (the gate of the p-channel MOS transistor 71). One end of the current path of the p-channel MOS transistor 131 is connected to the other end of the current path of the p-channel MOS transistor 130 and the gate thereof is grounded. That is, the p-channel MOS transistor 131 is normally set to the ON state. One end of the current path of the p-channel MOS transistor 132 is connected to the power supply potential node and the gate thereof is connected to the output node of the current supply circuit 70. One end of the current path of the p-channel MOS transistor 133 is connected to the other end of the current path of the p-channel MOS transistor 132 and the gate thereof is supplied with a control signal SR11. One end of the current path of the p-channel MOS transistor 134 is connected to the power supply potential node and the gate thereof is connected to the output node of the current supply circuit 70. One end of the current path of the p-channel MOS transistor 135 is connected to the other end of the current path of the p-channel MOS transistor 134 and the gate thereof is supplied with a control signal /SR12. One end of the current path of the p-channel MOS transistor 136 is connected to the other ends of the current paths of the p-channel MOS transistors 131, 133, 135 and the gate thereof is supplied with an inverted write command signal /WRITE. The other end of the current path of the p-channel MOS transistor 136 is used as an output node of the digit line current source 15 and connected to one of digit lines DL which is selected by a digit line selector 14. The control signals SR11, /SR12 are described later.

The bit line current source 18-1 has substantially the same configuration as that of the digit line current source 15. That is, the bit line current source 18-1 includes seven p-channel MOS transistors 137 to 143. One end of the current path of the p-channel MOS transistor 137 is connected to the power supply potential node and the gate thereof is connected to the output node of the current supply circuit 70. One end of the current path of the p-channel MOS transistor 138 is connected to the other end of the current path of the p-channel MOS transistor 137 and the gate thereof is grounded. That is, the p-channel MOS transistor 138 is normally set to the ON state. One end of the current path of the p-channel MOS transistor 139 is connected to the power supply potential node and the gate thereof is connected to the output node of the current supply circuit 70. One end of the current path of the p-channel MOS transistor 140 is connected to the other end of the current path of the p-channel MOS transistor 139 and the gate thereof is supplied with a control signal SR21. One end of the current path of the p-channel MOS transistor 141 is connected to the power supply potential node and the gate thereof is connected to the output node of the current supply circuit 70. One end of the current path of the p-channel MOS transistor 142 is connected to the other end of the current path of the p-channel MOS transistor 141 and the gate thereof is supplied with a control signal /SR22. One end of the current path of the p-channel MOS transistor 143 is connected to the other ends of the current paths of the p-channel MOS transistors 138, 140, 142 and the gate thereof is supplied with a signal of the NAND of a write command signal WRITE and an inverted data signal /DATA. The other end of the current path of the p-channel MOS transistor 143 is used as an output node of the bit line current source 18-1 and connected to one of bit lines BL which is selected by a bit line selector 17. The control signals SR21, /SR22 are described later.

The bit line current source 18-2 has substantially the same configuration as that of the digit line current source 15. That is, the bit line current source 18-2 includes seven p-channel MOS transistors 144 to 150. One end of the current path of the p-channel MOS transistor 144 is connected to the power supply potential node and the gate thereof is connected to the output node of the current supply circuit 70. One end of the current path of the p-channel MOS transistor 145 is connected to the other end of the current path of the p-channel MOS transistor 144 and the gate thereof is grounded. That is, the p-channel MOS transistor 145 is normally set to the ON state. One end of the current path of the p-channel MOS transistor 146 is connected to the power supply potential node and the gate thereof is connected to the output node of the current supply circuit 70. One end of the current path of the p-channel MOS transistor 147 is connected to the other end of the current path of the p-channel MOS transistor 146 and the gate thereof is supplied with a control signal SR31. One end of the current path of the p-channel MOS transistor 148 is connected to the power supply potential node and the gate thereof is connected to the output node of the current supply circuit 70. One end of the current path of the p-channel MOS transistor 149 is connected to the other end of the current path of the p-channel MOS transistor 148 and the gate thereof is supplied with a control signal /SR32. One end of the current path of the p-channel MOS transistor 150 is connected to the other ends of the current paths of the p-channel MOS transistors 145, 147, 149 and the gate thereof is supplied with a signal of the NAND of the write command signal WRITE and a data signal DATA. The other end of the current path of the p-channel MOS transistor 150 is used as an output node of the bit line current source 18-2 and connected to one of the bit lines BL which is selected by the bit line selector 17.

Next, the operations of the digit line current source 15 and bit line current sources 18-1, 18-2 are explained. First, the operation of the digit line current source 15 is explained.

As described before, the p-channel MOS transistor 131 is normally set to the ON state. Therefore, the default value of the write current I1 supplied from the digit line current source 15 is determined by a current I100 supplied by the p-channel MOS transistor 130. That is, the write current I1 at the time of the control signal SR11=/SR12="H" level is given by the following equation.

$$I1=I100=(W10/W0)\times I90$$

where W10 indicates the gate width of the p-channel MOS transistor 130, W0 indicates the gate width of the p-channel MOS transistor 71 in the current supply circuit 70 and 190 indicates a current value supplied by the p-channel MOS transistor 71. In this case, the write current I1 becomes minimum.

In the case of the control signal SR11="L" level and /SR12="H" level, the p-channel MOS transistor 133 is turned ON. Therefore, the write current I1 is given by the following equation.

$$I1=I100+I110=((W10+W11)/W0)\times I90$$

where I110 indicates a current value supplied by the p-channel MOS transistor 132 and W11 indicates the gate width of the p-channel MOS transistor 132.

In the case of the control signal SR11="H" level and /SR12="L" level, the p-channel MOS transistor 133 is turned OFF and the p-channel MOS transistor 135 is turned ON. Therefore, the write current I1 is given by the following equation.

$$I1=I100+I120=((W10+W12)/W0)\times I90$$

where I120 indicates a current value supplied by the p-channel MOS transistor 134 and W12 indicates the gate width of the p-channel MOS transistor 134.

In the case of the control signal SR11=/SR12="L" level, the p-channel MOS transistors 133, 135 are set to the ON state. Therefore, the write current I1 is given by the following equation.

$$I1=I100+I110+I120=((W10+W11+W12)/W0)\times I90$$

In this case, the write current I1 becomes maximum.

Next, the operation of the bit line current source 18-1 is explained. The operation of the bit line current source 18-1 is the same as that of the digit line current source 15. In the case of the control signal SR21=/SR22="H" level, the default value of the write current I2 supplied from the bit line current source 18-1 is given by the following equation.

$$I2=I200=(W20/W0)\times I90$$

where I200 indicates a current value supplied by the p-channel MOS transistor 137 and W20 indicates the gate width of the p-channel MOS transistor 137. In this case, the write current I2 becomes minimum.

In the case of the control signal SR21="L" level and /SR22="H" level, the write current I2 is given by the following equation.

$$I2=I200+I210=((W20+W21)/W0)\times I90$$

where I210 indicates a current value supplied by the p-channel MOS transistor 139 and W21 indicates the gate width of the p-channel MOS transistor 139.

In the case of the control signal SR21="H" level and /SR22="L" level, the write current I2 is given by the following equation.

$$I2=I200+I220=((W20+W22)/W0)\times I90$$

where I220 indicates a current value supplied by the p-channel MOS transistor 141 and W22 indicates the gate width of the p-channel MOS transistor 141.

In the case of the control signal SR21=/SR22="L" level, the write current I2 is given by the following equation.

$$I2=I200+I210+I220=((W20+W21+W22)/W0)\times I90$$

In this case, the write current I2 supplied by the bit line current source 18-1 becomes maximum.

Next, the operation of the bit line current source 19-1 is explained. The operation of the bit line current source 19-1 is also the same as that of the digit line current source 15. In the case of the control signal SR31=/SR32="H" level, the default value of the write current I2 supplied from the bit line current source 19-1 is given by the following equation.

$$I2=I300=(W30/W0)\times I90$$

where I300 indicates a current value supplied by the p-channel MOS transistor 144 and W30 indicates the gate width of the p-channel MOS transistor 144. In this case, the write current I2 becomes minimum.

In the case of the control signal SR31="L" level and /SR32="H" level, the write current I2 is given by the following equation.

$$I2=I300+I310=((W30+W31)/W0)\times I90$$

where I310 indicates a current value supplied by the p-channel MOS transistor 146 and W31 indicates the gate width of the p-channel MOS transistor 146.

In the case of the control signal SR31="H" level and /SR32="L" level, the write current I2 is given by the following equation.

$$I2=I300+I320=((W30+W32)/W0)\times I90$$

where I320 indicates a current value supplied by the p-channel MOS transistor 148 and W32 indicates the gate width of the p-channel MOS transistor 148.

In the case of the control signal SR31=/SR32="L" level, the write current I2 is given by the following equation.

$$I2=I300+I310+I320=((W30+W31+W32)/W0)\times I90$$

In this case, the write current I2 supplied by the bit line current source 19-1 becomes maximum.

Thus, in the digit line current source 15 and bit line current sources 18-1, 18-2 with the above configurations, the write currents I1, I2 can be controlled by use of the control signals SR11, /SR12, SR21, /SR22, SR31, /SR32. In the first and second embodiments, the relations of the write currents I1 and I2 are respectively set to I1=I2×(α2/α1) and I1=I2×c×(α2/α1). Therefore, the control signals SR11, /SR12, SR21, /SR22, SR31, /SR32 may be controlled according to (α2/α1) and c×(α2/α1).

It is desirable to set each of the control signals to SR11=SR21=SR31=/SR12=/SR22=/SR32="H" level as the default value. In this case, the write current I1 is (W10/W0)×I90 and the write current I2 supplied by the bit line current source 18-1 is (W20/W0)×I90. That is, the relation of I1=(W10/W20)×I2 is attained. If, in this state, the control signal SR11 is set to the "L" level, the write current I1 is set to ((W10+W11)/W0)×I90. Therefore, the relation of I1, I2 can be changed to I1=((W10+W11)/W20)×I2.

Further, as explained in the third embodiment by use of FIG. 21, when it is desired to change the value of the write current I2 supplied to the bit line, the number of transistors in the ON state in the bit-line current sources 18-1 and 19-1 may be changed according to write data. In the default state, the relation between the write current I2 supplied from the bit line current source 18-1 and a write current I2' supplied from the bit line current source 19-1 is set to I2=(W20/W30)×I2'. In this state, if the control signal /SR32 is set to the "L" level, the write current I2' is set to ((W30+W32)/W0)×I90. Therefore, the relation of I1, I2 can be changed to I2=(W20/(W30+W32))×I2'. In this case, it is desirable to set the relation of W20=W30.

Figure 39:
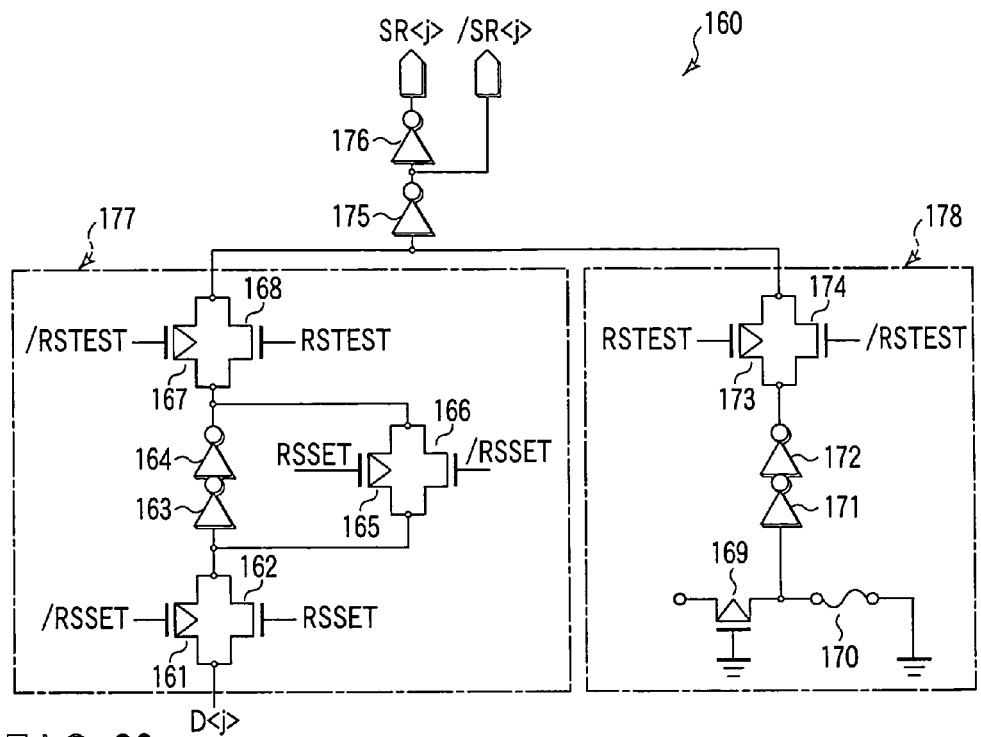
FIG. 39 is a circuit diagram of a setting circuit provided in the MRAM according to the seventh embodiment of this invention.

Next, the control signal setting method is explained with reference to FIG. 39. FIG. 39 is a circuit diagram of a setting circuit which sets the control signals SR11, /SR12, SR21, /SR22, SR31, /SR32. The setting circuit is provided for each control signal. That is, each setting circuit is allocated for a corresponding one of the control signals and each setting circuit holds data of a corresponding one of the control signals.

As shown in FIG. 39, a setting circuit 160 includes p-channel MOS transistors 161, 165, 167, 169, 173, n-channel MOS transistors 162, 166, 168, 174, inverters 163, 164, 171, 172, 175, 176 and fuse element 170. One-side ends of the current paths of the p-channel MOS transistor 161 and n-channel MOS transistor 162 are connected together and supplied with a data signal D<j> (j=11, 12, 21, 22, 31, 32) and the other ends thereof are connected together. The gate of the p-channel MOS transistor 161 is supplied with a control signal /RSSET and the gate of the n-channel MOS transistor 162 is supplied with a control signal RSSET. The inverters 163, 164 are serially connected and the input terminal of the inverter 163 is connected to the other ends of the current paths of the p-channel MOS transistor 161 and n-channel MOS transistor 162. One-side ends of the current paths of the p-channel MOS transistor 165 and n-channel MOS transistor 166 are connected together and the other ends thereof are connected together. One-side ends of the current paths thereof are connected to the input terminal of the inverter 163 and the other ends of the current paths thereof are connected to the output terminal of the inverter 164. The gate of the p-channel MOS transistor 165 is supplied with the control signal RSSET and the gate of the n-channel MOS transistor 166 is supplied with the control signal /RSSET. One-side ends of the current paths of the p-channel MOS transistor 167 and n-channel MOS transistor 168 are connected together and the other ends thereof are connected together. One-side ends of the current paths thereof are connected to the output terminal of the inverter 164. The gate of the p-channel MOS transistor 167 is supplied with an inverted test signal /RSTEST and the gate of the n-channel MOS transistor 168 is supplied with a test signal RSTEST. The above configuration is referred to as a circuit block 177.

One end of the current path of the p-channel MOS transistor 169 is connected to a power supply potential node, the other end of the current path thereof is connected to a ground potential node via the fuse element 170 and the gate thereof is grounded. The inverters 171, 172 are connected in series and the input terminal of the inverter 171 is connected to a connection node of the p-channel MOS transistor 171 and the fuse element 170. One-side ends of the current paths of the p-channel MOS transistor 173 and n-channel MOS transistor 174 are connected together and the other ends thereof are connected together. One-side ends of the current paths thereof are connected to the output terminal of the inverter 172. The gate of the p-channel MOS transistor 173 is supplied with the test signal RSTEST and the gate of the n-channel MOS transistor 174 is supplied with the inverted test signal /RSTEST. The above configuration is referred to as a circuit block 178.

The other ends of the current paths of the p-channel MOS transistor 167 and n-channel MOS transistor 168 which are connected together are used as an output node of the circuit block 177 and connected to the input terminal of the inverter 175. The other ends of the current paths of the p-channel MOS transistor 173 and n-channel MOS transistor 174 which are connected together are used as an output node of the circuit block 178 and connected to the input terminal of the inverter 175. The inverter 175 is connected in series with the inverter 176. A signal of the output terminal of the inverter 175 is a control signal /SR<j> and a signal of the output terminal of the inverter 176 is a control signal SR<j>.

Next, a method for setting the control signals SR<j>, /SR<j> by use of the setting circuit 160 with the above configuration is explained. The operation for setting the control signals SR<j>, /SR<j> is performed in the test mode. In the test mode, the test signal RSTEST is set to the "H" level (/RSTEST="L" level). Therefore, the p-channel MOS transistor 167 and n-channel MOS transistor 168 in the circuit block 177 are set to the ON state. On the other hand, the p-channel MOS transistor 173 and n-channel MOS transistor 174 in the circuit block 178 are set to the OFF state. That is, in the test mode, a signal is output from the circuit block 177 and no signal is output from the circuit block 178. Then, the control signal RSSET is set to the "H" level (/RSSET="L" level). In this state, a data signal D<j> is input. When the data signal D<j> is set to the "H" level, the control signal SR<j> is also set to the "H" level (/SR<j>="L" level). On the other hand, if the data signal D<j> is set to the "L" level, the control signal SR<j> is also set to the "L" level. Then, whether it is desirable to set the control signal SR<j> to the "H" level or "L" level is determined. When the control signal SR<j> is set to the "H" level, the fuse element 170 is blown by use of a laser. Thus, SR<j>="H" level is stored in the setting circuit 160. When the control signal SR<j> is set to the "L" level, the fuse element 170 is not blown.

As described above, data items of the control signals SR11, /SR12, SR21, /SR22, SR31, /SR32 are written into the setting circuit 160.

In the normal operation mode, the test signal RSTEST is set to the "L" level (/RSTEST="H" level). Therefore, the p-channel MOS transistor 167 and n-channel MOS transistor 168 in the circuit block 177 are set to the OFF state. On the other hand, the p-channel MOS transistor 173 and n-channel MOS transistor 174 in the circuit block 178 are set to the ON state. That is, a signal is output only from the circuit block 178. A signal corresponding to data written into the fuse element 170 in the test mode is output from the circuit block 178. The circuit block 178 outputs an "H" level if the fuse element 170 is blown. Therefore, the control signal SR<j> is set to the "H" level. On the other hand, if the fuse element 170 is not blown, the circuit block 178 outputs an "L" level. Therefore, the control signal SR<j> is set to the "L" level.

The control signals SR<j> can be set by use of the setting circuits 160. As input pins of data signals D<j> of the setting circuits 160 corresponding to the respective control signals SR<j>, data input pins of the MRAM can be used. In the example of FIG. 38, the number of control signals SR<j> is six. Therefore, if the data input pins are 8 bits, six pins among them may be used. The test signal RSTEST which is used to transfer the normal operation mode to the test mode can be created by a combination of the control signals which is not normally used. Then, the control signal RSSET can be created by performing the logical operation of the test signal RSTEST and a write enable signal WE. Thus, a data signal D<j> can be input to the setting circuit 160 via the data pin in the test mode.

Figure 40:
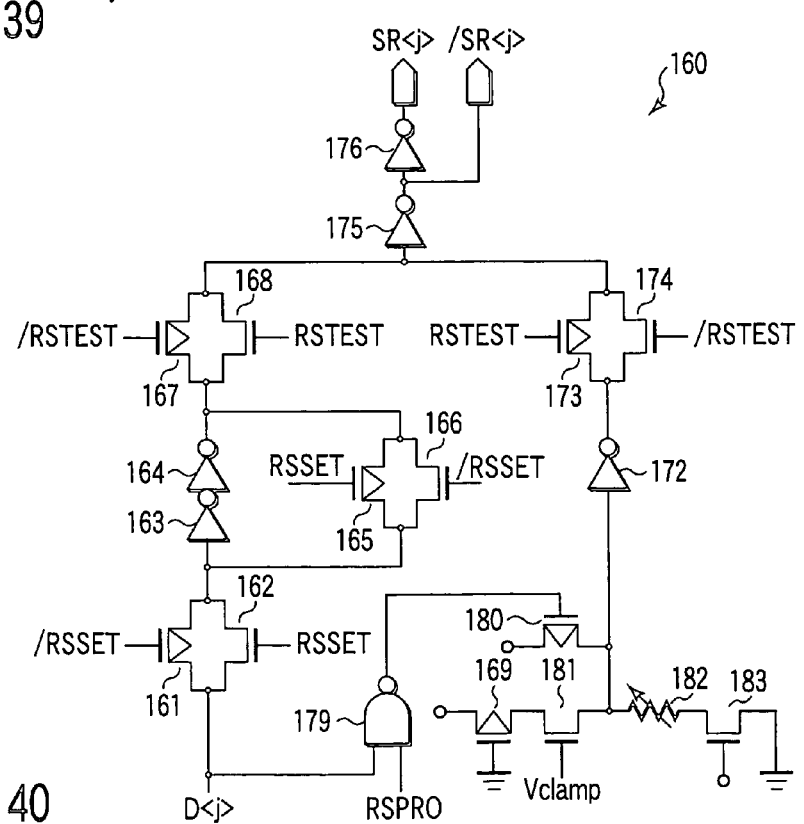
FIG. 40 is a circuit diagram of a setting circuit provided in an MRAM according to a first modification of the seventh embodiment of this invention.

FIG. 40 is a circuit diagram of the setting circuit 160 provided in an MRAM according to a first modification of the seventh embodiment. In the present modification, a magneto-resistive element is used as an anti-fuse instead of the fuse element 170. That is, as shown in FIG. 40, the inverter 171 and fuse element 170 in the configuration of FIG. 39 are omitted. Then, a NAND gate 179, p-channel MOS transistor 180, n-channel MOS transistor 181, 183 and magneto-resistive element 182 are additionally provided.

The NAND gate 179 calculates the logical NAND of the data input signal D<j> and a control signal RSPRO. One end of the current path of the p-channel MOS transistor 180 is connected to the power supply potential node, the other end of the current path thereof is connected to the input terminal of the inverter 182 and the gate thereof is supplied with an output signal of the NAND gate 179. The current path of the n-channel MOS transistor 181 is connected between the other end of the current path of the p-channel MOS transistor 169 and the input terminal of the inverter 172 and the gate thereof is supplied with voltage Vclamp. The magneto-resistive element 182 is connected between the input terminal of the inverter 172 and one end of the current path of the n-channel MOS transistor 183. The other end of the current path of the n-channel MOS transistor 183 is grounded and the gate thereof is supplied with the power supply potential.

With the above configuration, when the control signal SR<j> is set to the "H" level, the data signal D<j>="H" level is input and the control signal RSPRO is set to the "H" level. Then, the output signal of the NAND gate 179 is set to the "L" level, and therefore, the p-channel MOS transistor 180 is set to the ON state. As a result, one end of the magneto-resistive element 182 is applied with voltage via the p-channel MOS transistor 180 and the tunnel barrier film of the magneto-resistive element 182 is dielectric broken down. Therefore, the magneto-resistive element 182 is made conductive. As a result, the control signal SR<j>="H" level is stored. When the control signal SR<j> is set to the "L" level, the p-channel MOS transistor 180 is set to the OFF state since the data signal D<j> is set to the "L" level and the control signal RSPRO is set to the "L" level. Therefore, the magneto-resistive element 182 is not made dielectric breakdown and the control signal SR<j>="L" level is stored. In the present modification, the magneto-resistive element is used as the anti-fuse, but it is also possible to use a MOS capacitor element.

Figure 41:
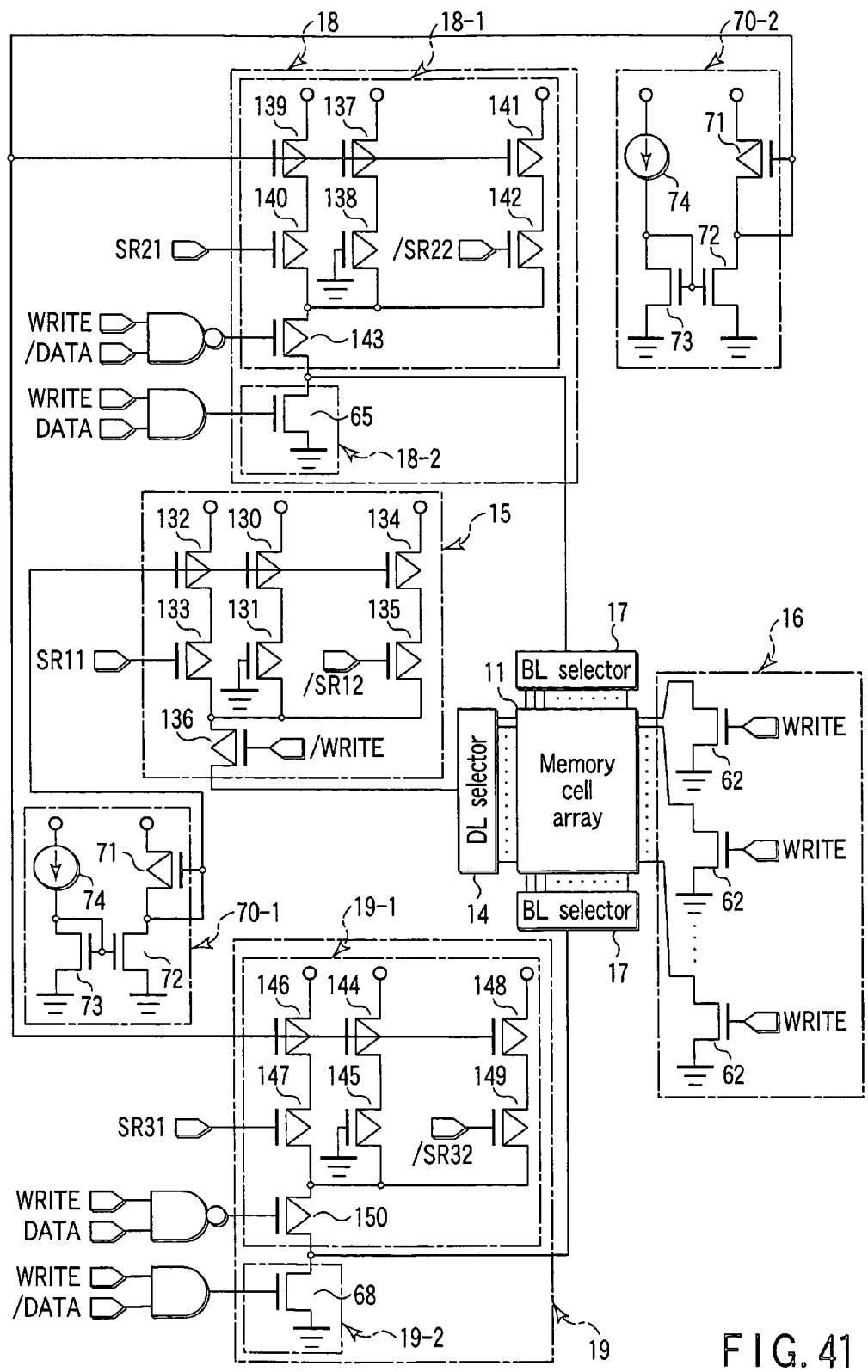
FIG. 41 is a circuit diagram of a partial region of an MRAM according to a second modification of the seventh embodiment of this invention.

FIG. 41 is a circuit diagram mainly showing a peripheral circuit of an MRAM according to a second modification of the seventh embodiment. As shown in this modification, the digit line current source 15 and bit line current sources 18-1, 19-1 can be controlled by use of separate current supply circuits 70-1, 70-2.

Figure 42:
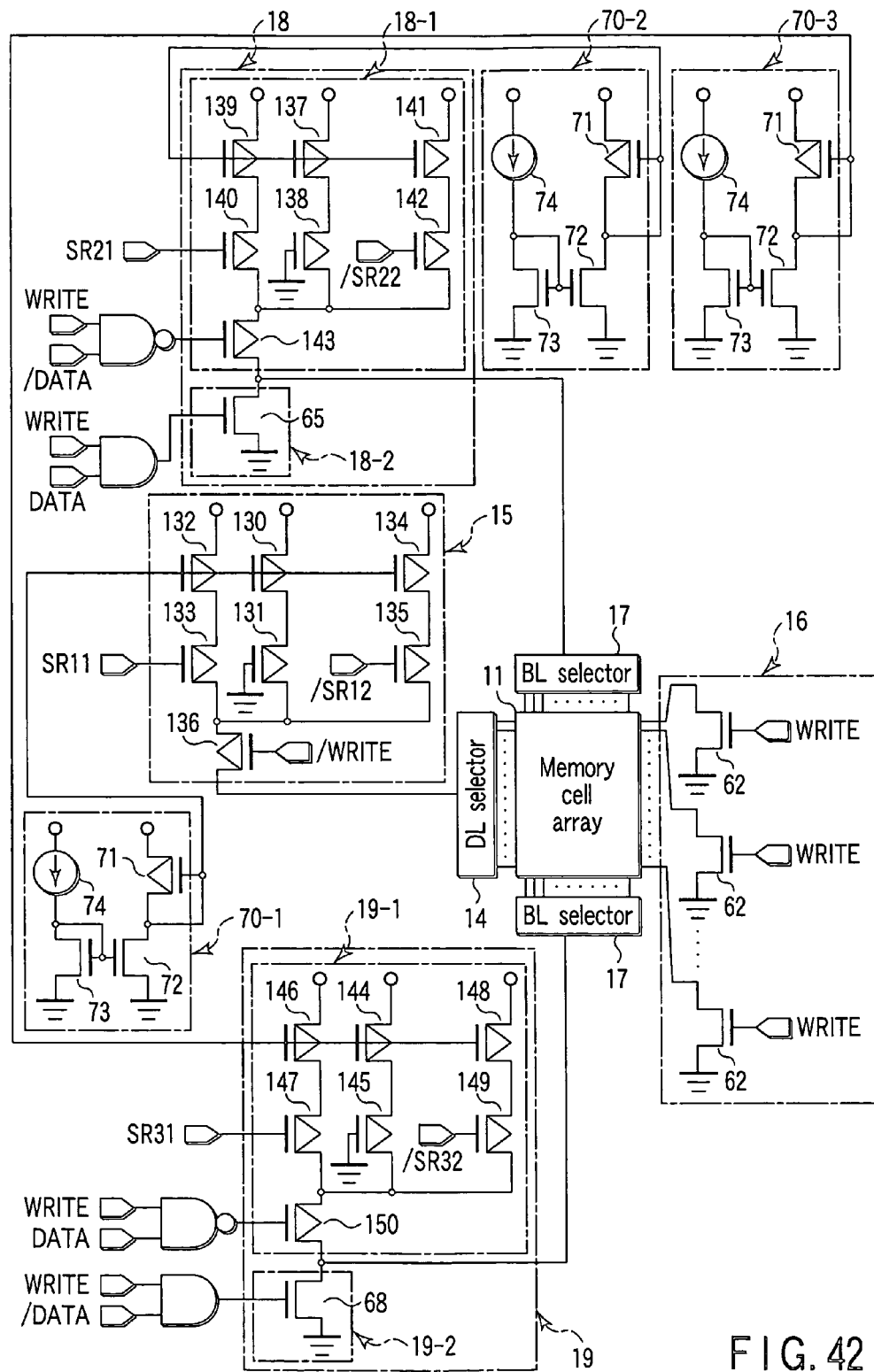
FIG. 42 is a circuit diagram of a partial region of an MRAM according to a third modification of the seventh embodiment of this invention.

FIG. 42 is a circuit diagram mainly showing a peripheral circuit of an MRAM according to a third modification of the seventh embodiment. As shown in this modification, the digit line current source 15 and bit line current sources 18-1, 19-1 can be controlled by use of separate current supply circuits 70-1, 70-2, 70-3.

Figure 43:
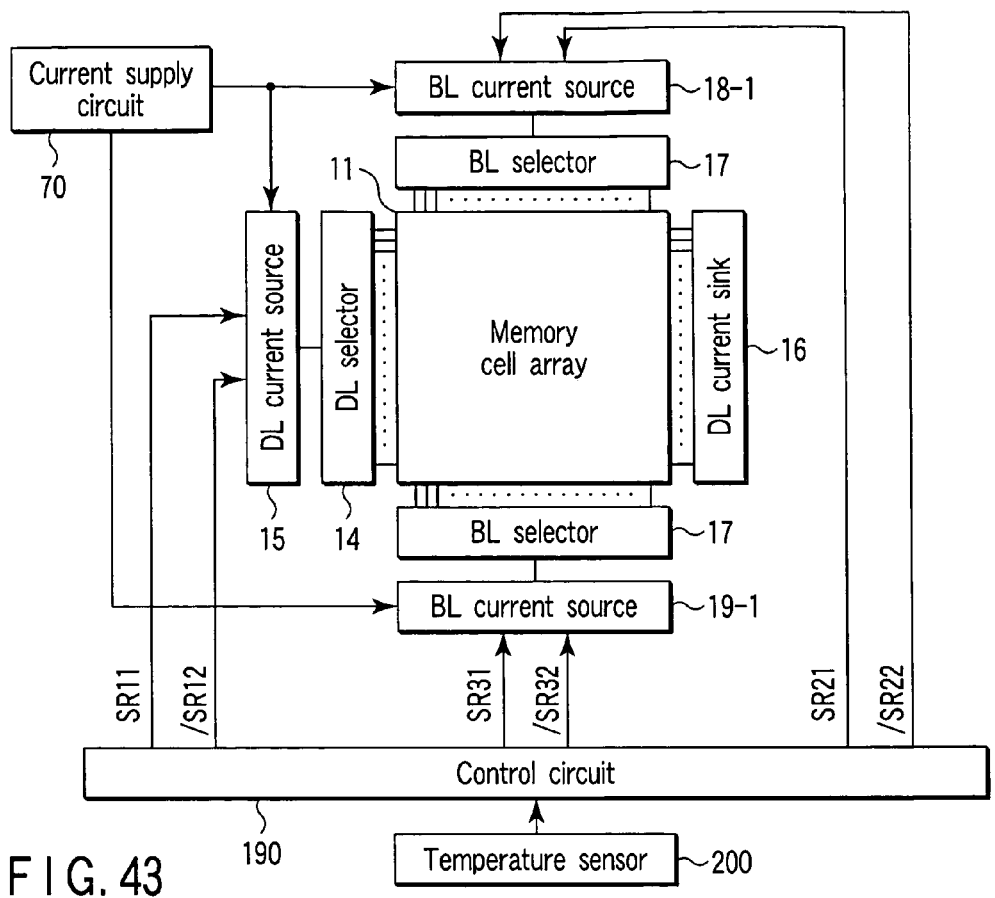
FIG. 43 is a block diagram of an MRAM according to an eighth embodiment of this invention.

Next, a semiconductor memory device according to an eighth embodiment of this invention is explained. The present embodiment relates to a configuration formed to cope with a case wherein the asteroid curve is changed according to a temperature change as explained in the fourth embodiment in the configuration of the seventh embodiment. FIG. 43 is a block diagram of a partial region of an MRAM according to the eighth embodiment.

The MRAM according to the eighth embodiment further includes a control circuit 190 and temperature sensor 200 in the configuration shown in FIG. 38 explained in the seventh embodiment. For example, the temperature sensor 200 includes a plurality of temperature sensors each of which has the same configuration as the temperature sensor 110 shown in FIG. 31 as explained in the fifth embodiment or the temperature sensor 110 shown in FIG. 32. The control circuit 190 generates control signals SR11, /SR12, SR21, /SR22, SR31, /SR32. Further, the control circuit 190 changes the control signal according to an output of the temperature sensor 110. That is, the control circuit controls the number of transistors set to the ON state in the digit line current source 15 and digit line current sources 18-1, 19-1 according to the temperature.

With the above configuration, for example, even when the asteroid curve is changed with a temperature change as shown in FIG. 23, the relation between the write currents I1, I2 explained in the first, second embodiments can be realized.

FIG. 44 is a block diagram of a partial region of an MRAM according to a modification of the eighth embodiment. In this modification, the control circuit 190 in the eighth embodiment is configured by a plurality of setting circuits 160-1 to 160-4 and switching circuit 210.

Each of the setting circuits 160-1 to 160-4 has the same configuration as that shown in FIG. 39 or 40 in the seventh embodiment. The setting circuits have optimum values of the control signals SR11, /SR12, SR21, /SR22, SR31, /SR32 in the different temperature ranges. For example, the setting circuits 160-1, 160-2, 160-3, 160-4 hold optimum values of the control signals SR11, /SR12, SR21, /SR22, SR31, /SR32 to respectively attain the optimum relations between the write currents I1 and I2 in the temperature ranges of T1 to T2, T2 to T3, T3 to T4, and T4 to T5. The switching circuit 210 selects the control signals output from one of the setting circuits 160-1 to 160-4 according to temperature voltage Vtemp output from the temperature sensor 200 and supplies the selected control signals to the digit line current source 15 and digit line current sources 18-1, 19-1. For example, when it is determined by the temperature sensor 200 that the present temperature lies in the temperature range of T1 to T2, the control signals held in the setting circuit 160-1 are selected.

With the above configuration, the relation between the write currents I1 and I2 can be set to an optimum relation when the asteroid curve is changed according to a temperature change.

In the seventh and eighth embodiments, two control signals are allocated for each current source. However, it is of course possible to increase the number of transistors which configure each current source and control the current source by use of a larger number of control signals. In this case, the write currents I1 and I2 can be more precisely controlled.

Figure 45:
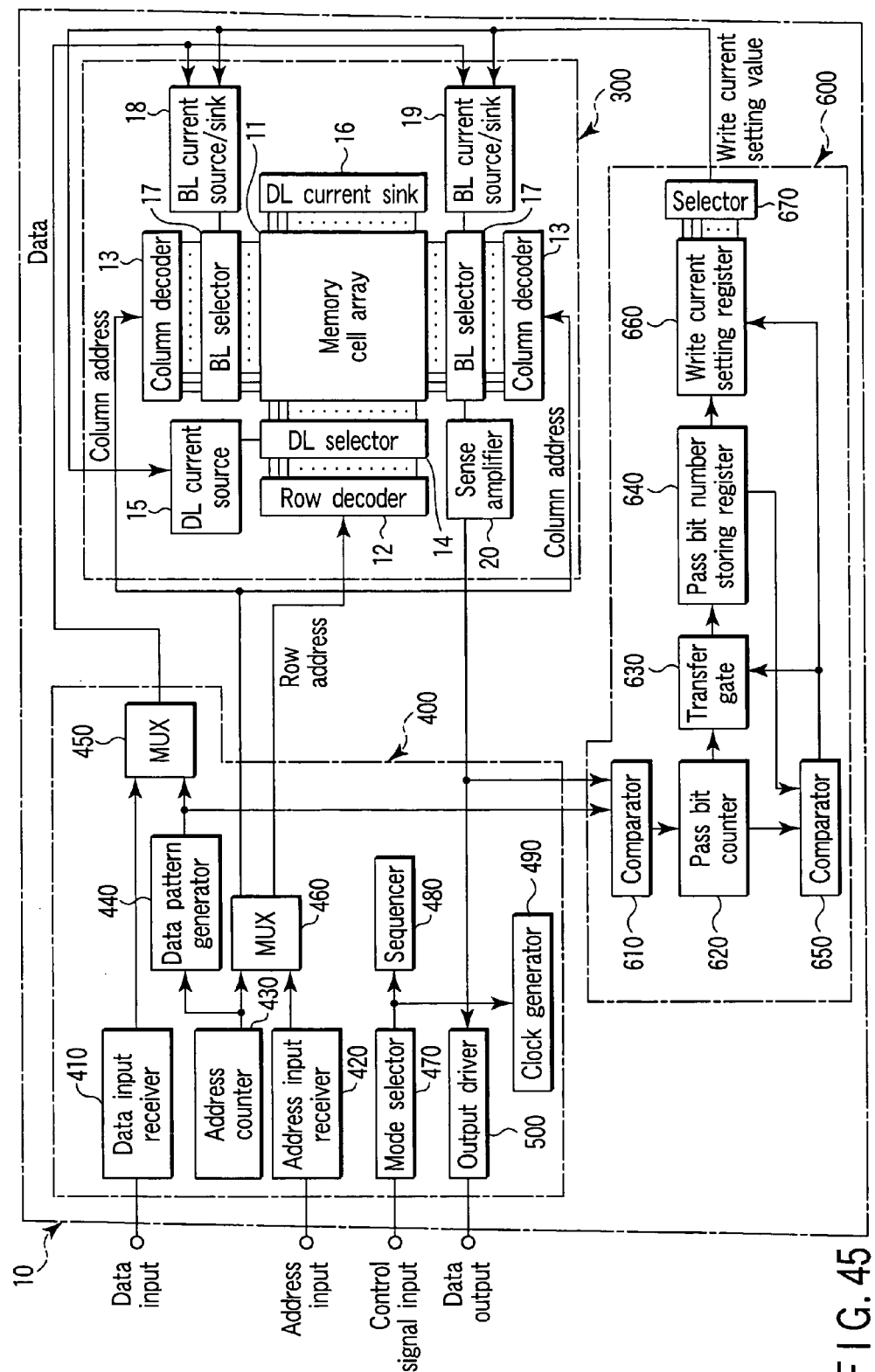
FIG. 45 is a block diagram of an MRAM according to a ninth embodiment of this invention.

Next, a semiconductor memory device according to a ninth embodiment of this invention is explained. The present embodiment relates to a method for detecting the optimum relation between the write currents I1 and I2 in the first to eighth embodiments. FIG. 45 is a block diagram of an MRAM according to the ninth embodiment.

As shown in FIG. 45, an MRAM 10 includes a memory cell block 300, peripheral circuit block 400 and write current control block 600. The memory cell block 300 has the same configuration as that shown in FIG. 1 explained in the first embodiment, and therefore, the explanation thereof is omitted.

The peripheral circuit block 400 includes a data input receiver 410, address input receiver 420, address counter 430, data pattern generator 440, multiplexers (MUX) 450, 460, mode selector 470, sequencer 480, clock generator 490 and output driver 500.

The data input receiver 410 receives an externally input data signal via a data input pin. The address input receiver 420 receives an externally input address signal via an address input pin. The address counter 430 generates an address signal. The data pattern generator 440 generates a checker board pattern. The multiplexer 450 selects one of an output of the data input receiver 410 and an output of the data pattern generator 440. The multiplexer 460 selects one of an output of the address input receiver 420 and an output of the address counter 430. The mode selector 470 receives an externally input control signal via a control signal input pin. The sequencer 480 commands the memory cell block 300, write current control circuit 600 and the like to perform processes of the operations such as the write operation, read operation and test operation based on the output of the mode selector 470. The clock generator 490 generates an internal clock. The output driver 500 externally outputs readout data amplified by the sense amplifier 20 from a data output pin.

The write current control block 600 includes comparators 610, 650, pass bit counter 620, transfer gate 630, pass bit number storing register 640, write current setting register 660 and selector 670.

The comparator 610 compares data generated from the data pattern generator 440 with readout data amplified by the sense amplifier. The pass bit counter 620 counts the number of times (pass bit) which the result of comparison in the comparator 610 has indicated coincidence. The transfer gate 630 transfers the pass bit number counted by the pass bit counter 620 to the pass bit number storing register 640. The pass bit number storing register 640 stores the pass bit. The comparator 650 compares the pass bit counted by the pass bit counter 620 with the pass bit stored in the pass bit number storing register 640. The write current setting register 660 stores set values of the write currents I1, I2. The selector 670 selects the set values stored in the write current setting register 660. The digit line current source 15 and digit line current sources 18-1, 19-1 are controlled according to the selected set values. The selector 670 includes the temperature sensor explained in the fourth to sixth embodiments and reads out data from the write current setting register 660 according to the ambient temperature.

Figure 46:
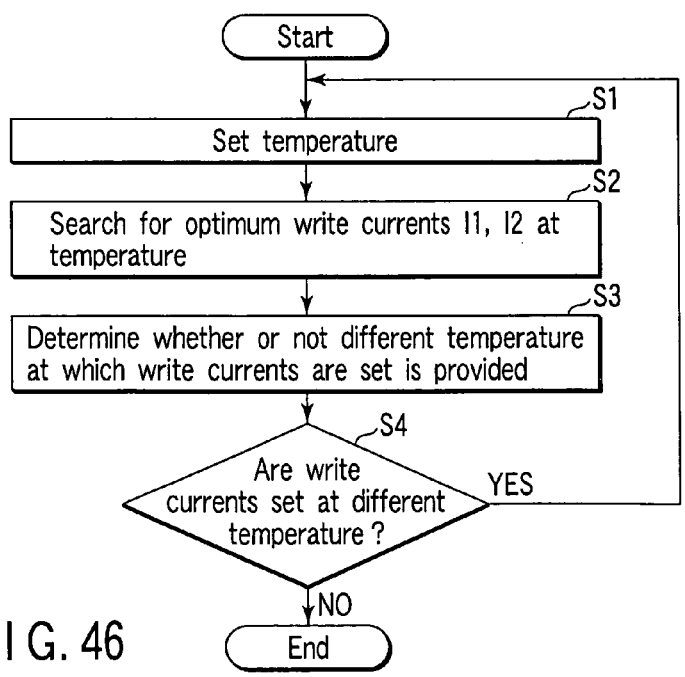
FIG. 46 is a flowchart showing a process for setting an optimum write current according to a temperature in the MRAM according to the ninth embodiment of this invention.

Next, the setting method of the write currents I1, I2 in the MRAM with the above configuration is explained. First, the flow of the process is roughly explained with reference to FIG. 46. FIG. 46 is a flowchart showing the setting method of the write currents I1, I2.

After the end of the wafer-process or post-process, a write current setting mode signal is input via the control signal pin. Then, the mode selector 470 selects the write current setting mode and the sequencer 480 causes each of the circuit blocks to perform the write current setting operation. After this, the ambient temperature is set at a preset temperature (step S1).

Next, the write current control circuit 600 searches for optimum write currents I1, I2 at the preset temperature thus set (step S2). The detected optimum write currents I1, I2 are stored together with temperature data in the write current setting register 660.

Then, whether or not it is necessary to set optimum write currents I1, I2 at a different temperature is determined (step S3). When it is required to set the optimum write currents at a different temperature (step S4), the process returns to a step S1. Then, the temperature is set at a preset different temperature (step S1) and the write current control circuit 600 searches for optimum write currents I1, I2 at the preset different temperature thus set. When it is required to set the optimum write currents (step S4), the write current setting flow is terminated. For example, when the optimum write current can be expressed as a linear function with respect to a temperature change, the current source circuits as shown in FIGS. 25, 26 are used. Then, the "H" level and "L" level of Opt1, Opt2 are selected according to the temperature characteristic. Further, the amount of the current is determined according to the "H" or "L" level of SR11, /SR12, SR21, /SR22, SR31, /SR32 in the circuit configuration of FIG. 38.

The optimum write current may not be given as a linear function of the temperature for the current source circuits of FIGS. 28 to 37. In this case, some fluctuation points are provided on the current-temperature characteristic line for each current source circuit. The characteristic lines shown in FIGS. 28 to 33 have one fluctuation point only. Thus, the optimum write current is determined from two temperatures higher and lower than that at the fluctuation point. To store the two data items representing these temperatures, at least two registers are required.

Even if the current-temperature characteristic line has two or more fluctuation points-, one register may suffice if it holds data corresponding to the fluctuation points. Nonetheless, the circuit of FIG. 38 has two registers for holding data items representing two temperatures higher and lower than that at the sole fluctuation point on the current-temperature characteristic line.

The current source circuit of FIG. 34 has the current-temperature characteristic line shown in FIG. 35 or 37, which has two fluctuation points. Thus, the optimum current is determined from three temperature, the first and second of which are higher and lower than that at the first fluctuation point, respectively, and the second and third of which are higher and lower than at the second fluctuation point, respectively. Thus, the current source circuit of FIG. 34 has three registers, which holds the three data items representing the three temperature.

Examples of data stored in the write current setting register 660 by the above method are shown in FIGS. 47 to 50. In the example shown in FIG. 47, the write current setting register holds values of optimum write currents (in this example, write currents at an evaluation temperature in the temperature range) I1, I2 as representative values in the temperature range. In this example, a digit line write current I1 (optimum write current at the evaluation temperature) as a representative value in the temperature range of T1 to T2 is Iw1 and a bit line write current I2 is Ib1. Further, a digit line write current I1 (optimum write current at the evaluation temperature) as a representative value in the temperature range of T2 to T3 is Iw2 and a bit line write current I2 is Ib2.

In the example shown in FIG. 48, bit line write currents I2 at the "0" data write time and "1 data write time are recorded. In this example, an optimum value of a digit line write current I1 in the temperature range of T1 to T2 is Iw1. A value (an optimum value at the evaluation temperature) as a representative value of the bit line write current I2 at the "0" data write time is Ib10 and a value (an optimum value at the evaluation temperature) as a representative value of the bit line write current I2 at the "1" data write time is Ib11.

Further, a write current I1 (an optimum write current at the evaluation temperature) as a representative value in the temperature range of T2 to T3 is Iw2, a write current I2 at the "0" data write time is Ib20 and a write current I2 at the "1" data write time is Ib21.

In the example shown in FIG. 49, a digit line write current I1 and the write current ratio (the optimum write current ratio at the evaluation temperature) I1/I2 are recorded. In this example, a write current (an optimum value at the evaluation temperature) I1 as a representative value in the temperature range of T1 to T2 is Iw1. The write current ratio (the optimum write current ratio at the evaluation temperature) I1/I2 as a representative value is c10. Therefore, a write current (an optimum write current at the evaluation temperature) I2 as a representative value is I1/c10=Iw1/c10. A write current (an optimum write current at the evaluation temperature) I1 as a representative value in the temperature range of T2 to T3 is Iw2. Then, the write current ratio (the optimum write current ratio at the evaluation temperature) I1/I2 as a representative value is c20. Therefore, a write current (an optimum write current at the evaluation temperature) I2 as a representative value is I1/c20=Iw2/c20.

In the example shown in FIG. 50, bit line write currents I2 at the "0" data write time and "1" data write time are recorded in the example shown in FIG. 49. In this example, a write current (an optimum write current at the evaluation temperature) I1 as a representative value in the temperature range of T1 to T2 is Iw1. The write current ratio (the optimum write current ratio at the evaluation temperature) I1/I2 as a representative value at the "0" data write time is c11. Further, the write current ratio (the optimum write current ratio at the evaluation temperature) I1/I2 as a representative value at the "1" data write time is c12. Therefore, a write current (an optimum write-current at the evaluation temperature) I2 as a representative value at the "0" data write time is I1/c11=Iw1/c11. Further, a write current I2 at the "1" data write time is I1/c12=Iw1/c12. A write current (an optimum write current at the evaluation temperature) I1 as a representative value in the temperature range of T2 to T3 is Iw2. Then, a write current (an optimum write current at the evaluation temperature) I2 as a representative value at the "0" data write time is I1/c21=Iw2/c21 and a write current (an optimum write current at the evaluation temperature) I2 as a representative value at the "1" data write time is I1/c22=Iw2/c22.

Figure 51:
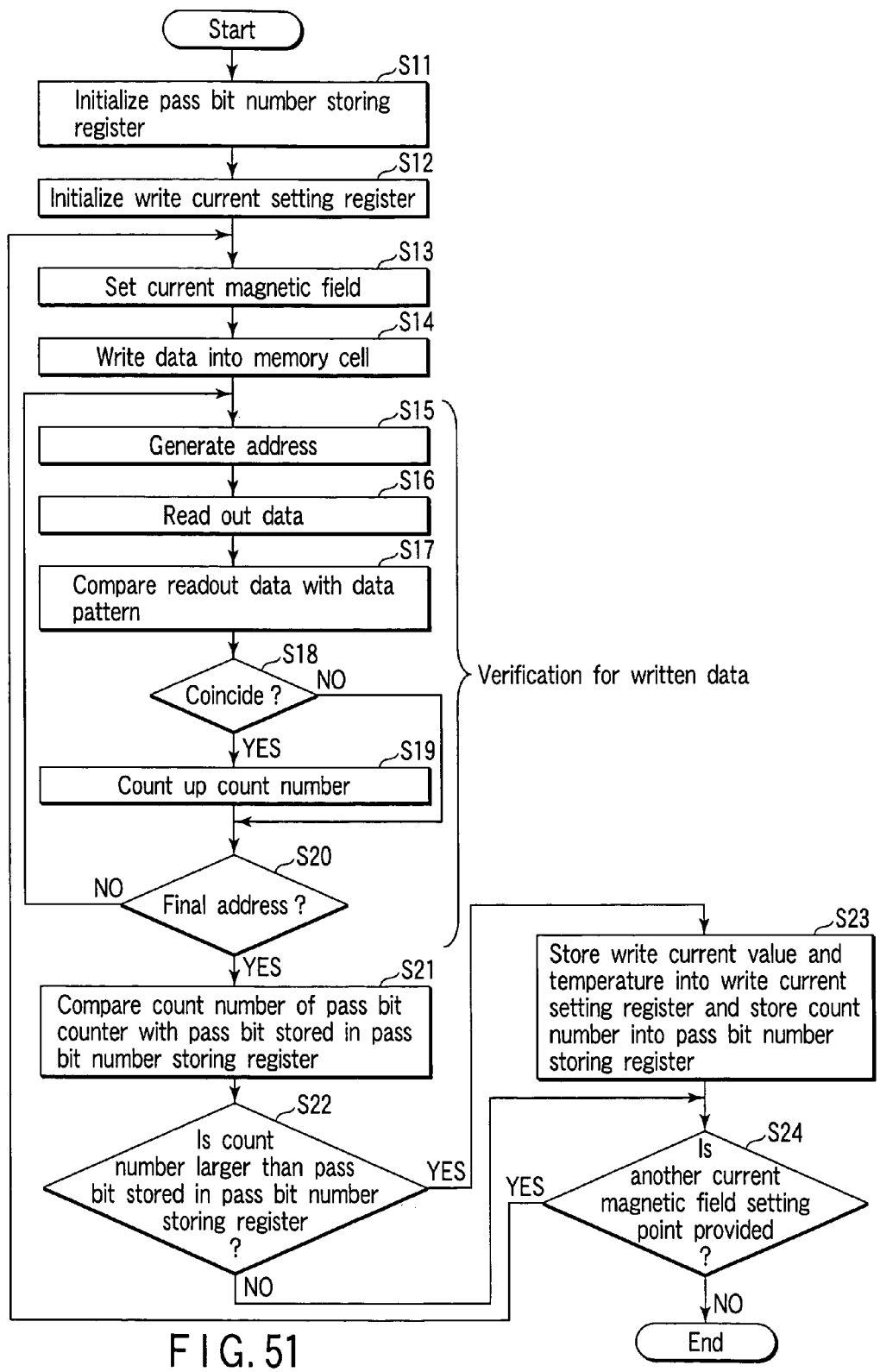
FIG. 51 is a flowchart showing a process for setting an optimum write current in the MRAM according to the ninth embodiment of this invention.

Next, a method for searching for the write current (the optimum write current at the evaluation temperature) as the representative value in step S2 is explained. In order to detect the optimum write current, whether the write operation is successfully performed or not is checked while the write currents I1, I2 are being changed. That is, the write current control block controls the digit line current source 15 and bit line current sources 18, 19 to measure the write characteristic of the memory cell while the write currents I1, I2 are being changed. At this time, as a data pattern written into the memory cell, a checker board pattern generated from the data pattern generator is used. The checker board pattern may be generated by use of a general memory tester. The method is explained in detail below with reference to FIG. 51. FIG. 51 is a flowchart showing a method for searching for an optimum write current.

First, the pass bit number storing register 640 is initialized and the write current setting register 660 is initialized (step S11). As described before, in order to detect the optimum write current, whether the write operation is successfully performed or not is checked while the write current is being changed. Therefore, it is necessary to perform the checking process by use of a plurality of write currents. However, the number of combinations of the write currents I1, I2 is limitless. Therefore, for example, a plurality of ratios I1/I2 are selected and several observation points are set for each ratio I1/I2. Specifically, the combinations of the write currents I1, I2 are selected as shown in FIG. 52. FIG. 52 is a graph showing the combinations of the write currents I1, I2. As shown in FIG. 52, the write currents I1, I2 which satisfy the relations of I1/I2=c1, c2, c3, c4 are selected. Then, 27 combinations of (I1, I2) which satisfy the relations of I1/I2 are selected on four lines extending from the origin (I1=I2=0). That is, the write operation into the memory cell is performed by use of the 27 combinations of (I1, I2). The combinations are referred to as observation points P1 to P27 as shown in FIG. 52. Initialization of the write current setting register 660 means that values of (I1, I2) used at the first write operation are stored in the write current setting register 660. For example, in FIG. 52, the currents (I1, I2) in the observation point P1 are stored in the write current setting register 660. Further, initialization of the pass bit number storing register 640 indicates the following matter. In order to detect the optimum write current, a data pattern is written into the memory cell array 11 by use of the write currents (I1, I2) at the observation points stored in the write current setting register 660. Then, the number of memory cells (pass bit) into which data is correctly written in the memory cell array 11 is counted and values of (I2, I2) corresponding to the largest count number are determined as the optimum write currents. In the initialization process of the write current setting register 660 in the step S1, the present pass bit number to be compared with the pass bit number obtained when the write operation is performed at the first observation point P1 is stored in the write current setting register 660 and the pass bit number may be zero, for example.

Next, in order to write data into the memory cell, a current magnetic field to be generated is set (step S13). That is, the selector 670 reads out write current setting values from the write current setting register 660. The readout write current setting values are values (I1, I2) at the observation point P1 in FIG. 52. The write current setting values are supplied to the digit line current source 15 and bit line current sources 18, 19. Further, the address counter 430 generates an address signal and the column address signal and row address signal from the multiplexer 460 are supplied to the column decoder 13 and row decoder 12. The data generator 440 generates a data pattern of the checker board pattern. The data pattern is a data write pattern containing different write data items for the adjacent memory cells.

Then, the data pattern is written into the memory cell array (step S14). That is, the digit line current source 15 supplies a write current I1 to the digit line DL based on the write current setting value. Further, one of the bit line current sources 18, 19 supplies a write current I2 based on the write current setting value to the bit line BL based on the data pattern. Thus, a magnetic field is formed around the magneto-resistive element of the memory cell and preset data is written into the memory cell.

The operation of writing a data pattern into the memory cell is explained with reference to FIGS. 53 and 54. FIG. 53 is a block diagram simply showing the configuration of the memory cell array 11 and FIG. 54 is a conceptual diagram of one example of the data pattern.

As shown in FIG. 53, for example, it is assumed that 5×5 memory cells MC are provided. The data writing operation in the step S14 is sequentially performed for all of the memory cells MC00 to MC44. A data pattern to be written into the memory cell array 11 is a checker board pattern as shown in FIG. 54. For example, FIG. 54 indicates that "1" data is written into the memory cell MC00 at the intersection between the bit line BL0 and the digit line DL0 and "0" data is written into the memory cell MC01 at the intersection between the bit line BL1 and the digit line DL0. Likewise, corresponding data items are written into the other memory cells.

After the write operation for all of the memory cells is terminated, verification for write data is performed. That is, the address counter 430 generates an address (step S15). Then, data is read out from the memory cell of the generated address (step S16) and readout data is amplified by the sense amplifier 20. Next, data read out from the memory cell is compared with the data pattern generated from the data pattern generator 440 by the comparator 610 (step S17). If the compared data items coincide with each other (step S18), the pass bit counter 620 counts up the count number by one (step S19). Then, if the thus obtained address is a final address of the memory cell array, the process is terminated. If not, the address counter 430 generates a next address and the process of steps S16 to S20 is repeatedly performed.

The write data verification method is concretely explained with reference to FIGS. 53 and 54. After the data pattern shown in FIG. 54 is written into the memory cell array shown in FIG. 53, the address counter 430 generates an address signal ADD00 corresponding to the memory cell MC00 in the step S15. Then, the column decoder 13 and row decoder 12 select the memory cell MC00 based on the address signal ADD00 and data is read out from the memory cell MC00 (step S16). After this, the readout data from the memory cell MC00 is compared with the data pattern generated from the data pattern generator (step S17). That is, as shown in FIG. 54, data to be written into the memory cell MC00 is "1". Therefore, if data "1" is written in the memory cell MC00, the result of comparison in the comparator 610 indicates coincidence (step S18). Therefore, the count of the pass bit counter 620 becomes "1" (step S19). If data "0" is written in the memory cell MC00, that is, data writing is a failure, the comparison result indicates non-coincidence (step S18), and therefore, the count of the pass bit counter 620 is kept at "0".

Next, the address counter 430 generates an address signal ADD01 corresponding to the memory cell MC01 (step S15). Then, data is read out from the memory cell MC01 (step S16). After this, the readout data from the memory cell MC01 is compared with the data pattern generated from the data pattern generator (step S17). As shown in FIG. 54, data to be written into the memory cell MC01 is "0". Therefore, if data "0" is written in the memory cell MC01, the comparison result indicates coincidence (step S18). Therefore, the pass bit counter counts up the count number. If the comparison result indicates non-coincidence, the pass bit counter does not count up the count number. For example, if data "1" is written in the memory cell MC00 and data "0" is written in the memory cell MC01, the count number in the pass bit counter 620 becomes "2". The above process is repeatedly performed for the 25 memory cells MC00 to MC44. After verification of data for the memory cell MC44 is terminated (step S20), a sequence of processes of steps S15 to S20 is terminated.

Next, the comparator 650 compares the count number of the pass bit counter 620 with the pass bit number stored in the pass bit number storing register (step S21). The count number of the pass bit counter 620 at this time point indicates the number of memory cells (pass bit) in which data is correctly written in the memory cell array 11. At this time, an initial setting value is stored in the pass bit number storing register. When the count number of the pass bit number counter 620 is larger than the pass bit number stored in the pass bit number storing register 640, the transfer gate 630 is made open and the count number of the pass bit counter 620 is overwritten on the pass bit number storing register 640. At the same time, the temperature and write currents I1, I2 when the write operation is performed are stored into the write current setting register 660. For example, in the examples of FIGS. 53, 54, it is assumed that the initial value of the pass bit number storing register 640 is zero, the number of memory cells into which data is successfully written is ten, the write current at the observation point P1 is P1(I1, I2), and the temperature is set in a range of T1 to T2. Then, since the pass bit number of the pass bit number storing register 640 is smaller than the count number of the pass bit counter 620, "10" is newly stored into the pass bit number storing register and the write current P1(I1, I2) at P1 and a code indicating that the temperature range is set in a range of T1 to T2 are stored in the write current setting register 660.

Next, if another current magnetic field setting point is provided (step S24), a process of steps S13 to S23 is repeatedly performed at the same temperature as in the preceding cycle. In the example of FIG. 52, a new current magnetic field is generated by a write current P2(I1, I2) at an observation point P2 (step S13). Then, a data pattern is written into the memory cell array 11 by the write current P2(I1, I2) (step S14) and then verification for the write data is performed by use of the above method. As the result of data verification, if it is detected that the number of memory cells into which data is successfully written is larger than that in the case of the observation point P1, data items of the pass bit number storing register 640 and write current setting register 660 are rewritten into data items obtained at the observation point P2. If it is not detected, data items of the registers 640, 660 are kept unchanged. The above process is repeatedly performed for the observation points P1 to P27. Then, finally, data of the write current corresponding to the largest number of memory cells into which data is successfully written is stored in the write current setting register 660 and the pass bit number obtained at this time is stored in the pass bit number storing register 640. That is, the write current held in the write current setting register 660 at this time point is an optimum write current at the temperature. This state is shown in FIG. 55.

Figure 55:
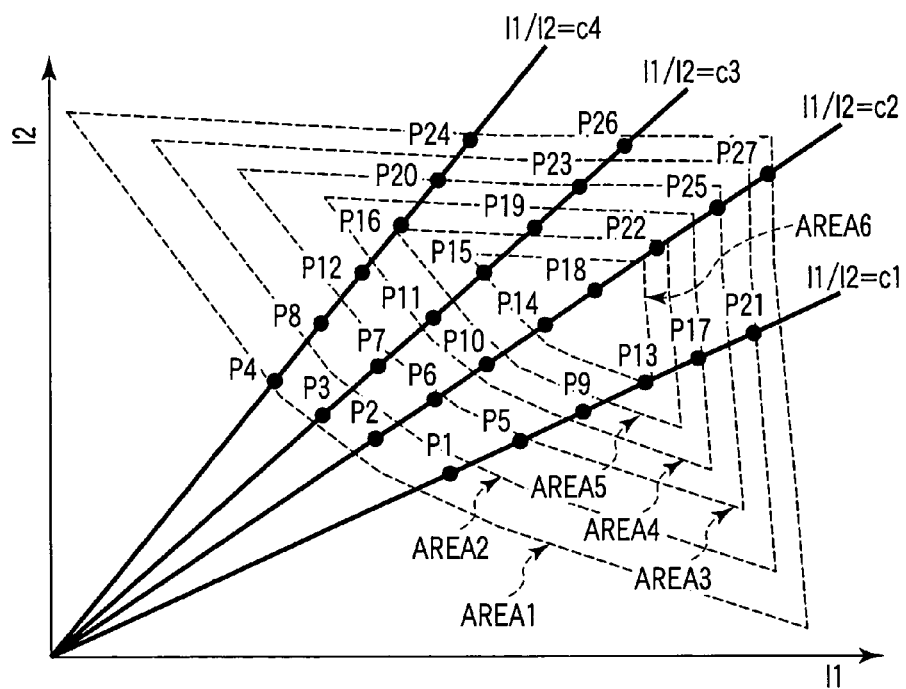
FIG. 55 is a graph showing the relation between write currents supplied to a digit line and a bit line and the number of memory cells in which data is correctly written in the MRAM according to the ninth embodiment of this invention.

FIG. 55 is a graph which shows the observation points P1 to P27 and in which the write current I1 is plotted on the abscissa and the write current I2 is plotted-on the ordinate. Further, the numbers of pass bits in the respective observation points P1 to P27 are shown. Areas AREA1 to AREA6 surrounded by broken lines in FIG. 55 indicate areas of preset pulse numbers and the pass bit number increases in a direction from AREA1 to AREA6. That is, since the observation points P14, P18 lie in the area AREA6, it indicates that the number of memory cells in which data is successfully written is set to a maximum. Further, since the observation points P1 to P4, P24, P26, P27 lie in the area AREA1, it indicates that the number of memory cells in which data is successfully written is set to a minimum. The reason why data cannot be successfully written in the observation points P1 to P4 is that the write current is excessively small and the intensity of the current magnetic field does not reach the threshold value. Further, the reason why data cannot be successfully written in the observation points P24, P26, P27 is that the write current is excessively large and data is erroneously written into an adjacent cell due to the leakage magnetic field.

Figure 56:
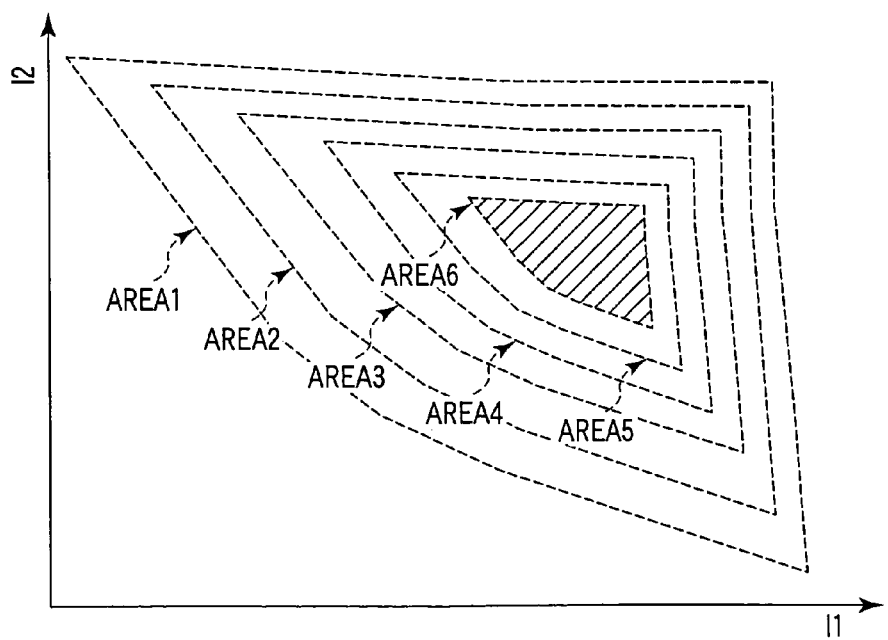
FIG. 56 is a graph showing the relation between write currents supplied to a digit line and a bit line and the number of memory cells in which data is correctly written in the MRAM according to the ninth embodiment of this invention.

FIG. 56 is a graph in which the observation points are omitted for simplicity of the drawing. The write currents I1, I2 corresponding to the area AREA6 in which the pass bit number is set to a maximum are the optimum write currents at the corresponding temperature. The area corresponds to a central portion of the hatched range in FIG. 12 explained in the first embodiment. Data items of the write currents I1, I2 corresponding to the area AREA6 in FIG. 56 are stored in the write current setting register as the result of the process explained in the steps S11 to S24.

Referring to FIG. 46 again, the operation for searching for the write currents I1, I2 in step S2 is terminated by the process of steps S11 to S24. Next, whether another temperature at which the write currents are set is present or not is determined (step S3). That is, as is also explained in the third embodiment, the asteroid curve varies with a temperature change. In other words, values of optimum write currents also vary with a temperature change. This state is shown in FIG. 57. The broken lines in FIG. 57 indicate areas (corresponding to the area AREA6 in FIGS. 55, 56) indicating the optimum write currents in the respective temperature ranges. As shown in the drawing, the optimum write current becomes low with a temperature rise. Therefore, it is necessary to detect optimum write current values at the respective temperatures.

Thus, if it is necessary to set the write current at another temperature (step S4), the temperature is newly set (step S1) and the process shown in the flow of FIG. 51 is performed to detect an optimum write current at the thus set temperature. When write currents at every necessary temperature are detected (step S4), the process is terminated.

As a result, data items as shown in FIGS. 47 to 50 are stored into the write current setting register 660. That is, the optimum write currents I1, I2 at each temperature are held in the write current setting register 660.

Next, the normal write operation is briefly explained with reference to FIG. 58. FIG. 58 is a flowchart at the write operation time.

By the flow explained in FIGS. 46, 51, data items relating to the optimum write currents I1, I2 are held in the write current setting register 660 (step S30). In this case, it is assumed that data shown in FIG. 47 is stored in the write current setting register 660.

First, a write mode signal is input via the control signal pin. Then, the mode selector 470 selects a write mode and the sequencer 480 causes the respective circuit blocks to perform the write operations.

The sequencer sets the data input receiver 410 and address input receiver 420 into the enable state. Then, the data input receiver 410 receives a data signal via the data input pin and the address input receiver 420 receives an address signal. The digit line selector 14 selects one of the digit lines according to the row address signal obtained by the row decoder 12 and the bit line selector 17 selects one of the bit lines according to the column-address signal obtained by the column decoder 13 (step S31). The digit line current source 15 supplies a current I1 to the selected digit line and one of the bit line current sources 18, 19 supplies a current I2 to the selected bit line according to the data signal.

That is, the digit line current source 15 and bit line current sources 18, 19 control the write currents I1, I2 to be supplied according to data given from the write current setting register 660. The selector 670 includes a temperature sensor and detects the ambient temperature (step S32). The selector 670 reads out values of the optimum write currents I1, I2 corresponding to the temperature from the write current setting register 660 and supplies the same to the digit line current source 15 and bit line current sources 18, 19 (step S33). For example, data items of I1=Iw1 and I2=Ib1 are read out from the write current setting register 660 in the temperature range of T1 to T2. The digit line current source 15 supplies I1=Iw1 to the digit line DL and one of the bit line current sources 18, 19 supplies I2=Ib1 to the bit line BL according to the readout data (step S34). As a result, data can be written into a selected memory cell according to the optimum write currents.

In the MRAM of the present embodiment, the optimum write currents I1, I2 at each temperature are searched for and held. Then, values of the optimum write currents I1, I2 are read out according to the temperature and the write operation is performed. Therefore, even when the asteroid curve varies with a temperature change, the effect as explained in the first and second embodiments can be attained.

Further, in the present embodiment, since the digit line current source 15 and bit line current sources 18, 19 are dealt with to contain the current supply circuit 70 shown in the third to seventh embodiments, the current supply circuit 70 is not shown in FIG. 45. When the currents of the current sources 15, 18, 19 are controlled, for example, a current supplied from the current source 74 of the current supply circuit 70 may be directly controlled. Further, when the current sources 15, 18, 19 have the configuration (refer to FIG. 38) explained in the seventh embodiment, each control switch may be controlled.

In the present embodiment, a case wherein the optimum write current linearly varies with a temperature change is explained with reference to FIG. 57. However, since the optimum write current is detected for each temperature, the optimum write operation can always be performed even if the asteroid curve varies into any form with a temperature change.

Further, when the current supply circuit 70 has the configuration explained in the fourth to sixth embodiments, that is, when the supply current of the current source 74 varies with a temperature change according to the asteroid curve, it is sufficient to perform the process of step S2 in the present embodiment at one temperature.

In the present embodiment, a case wherein the process of steps S14 to S20 in FIG. 51 is performed for all of the memory cells in the memory cell array 11 is explained as an example. However, when it can be assumed that the memory cell characteristics are randomly distributed in the memory cell array, it is sufficient to perform the process of steps S14 to S20 only for a memory cell group in a specified area. Further, it is desirable to perform the above process after the die sort test is made and faulty cells are replaced by redundancy cells from the viewpoint that a write current can be detected with higher precision.

As described above, according to the semiconductor memory devices of the first to ninth embodiments of this invention, the digit line current source and bit line current source supply the currents to the digit line and bit line to maintain the preset relation between the magnetic field in the hard axis direction and the magnetic field in the easy axis direction. The above preset relation is a relation which can cause the operation margin at the write time to become maximum.

That is, in the first embodiment, in a memory cell having an ideal-asteroid curve, the digit line current source and bit line current source supply the currents to the digit line and bit line so as to make the magnetic field in the hard axis direction and the magnetic field in the easy axis direction equal to each other.

Further, in the second embodiment, if the asteroid curve deviates from the ideal curve, the digit line current source and bit line current source supply the currents to the digit line and bit line to always maintain the ratio of the magnetic field in the hard axis direction to the magnetic field in the easy axis direction when the minimum threshold value of the magnetic field in the hard axis direction and the minimum threshold value of the magnetic field in the easy axis direction are equal to each other when a variation in the magnetic field is taken into consideration. More specifically, the magnetic field Hx in the hard axis direction and the magnetic field Hy in the easy axis direction are maintained to always hold the ratio of the minimum write threshold values of the magnetic fields Hx, Hy when the minimum write threshold value of the magnetic field Hx in the hard axis direction in a first adjacent memory cell which is adjacent to a selected cell in the hard axis direction coincides with the minimum write threshold value of the magnetic field Hx in the hard axis direction in a second adjacent memory cell which is adjacent to the selected cell in the easy axis direction and the minimum write threshold value of the magnetic field Hy in the easy axis direction in the first adjacent memory cell coincides with the minimum write threshold value of the magnetic field Hy in the easy axis direction in the second adjacent memory cell.

Further, the configuration according to the first, second embodiments is realized by the third embodiment. In the third embodiment, the bit line write current I1 is changed according to write data. Therefore, the reliability of data writing can be enhanced even when the asteroid curve deviates in the easy axis direction.

The first and second embodiments can be realized by use of the configurations according to the fourth to eighth embodiments. In the above embodiments, values of the write currents I1, I2 are changed with a temperature change. In this case, the variation rate is the same as the variation rate of the asteroid curve of the magneto-resistive element with a temperature change. Therefore, even when the write threshold value of the memory cell is changed with a temperature change, the relation between the write currents I1, I2 explained in the first and second embodiments can be realized.

Further, in the ninth embodiment, a method for detecting optimum write currents I1, I2 is disclosed. That is, the relation between the write currents I1, I2 explained in the first and second embodiments can be realized by use of the configuration explained in the ninth embodiment.

The values of Hx/Hy and I1/I2 are not necessarily constants and may be expressed by some types of functions. The asteroid curve is changed not only with a temperature change but also with time in some cases. Therefore, it is desirable to set the optimum write currents according to time elapsed after manufacturing.

Figure 59:
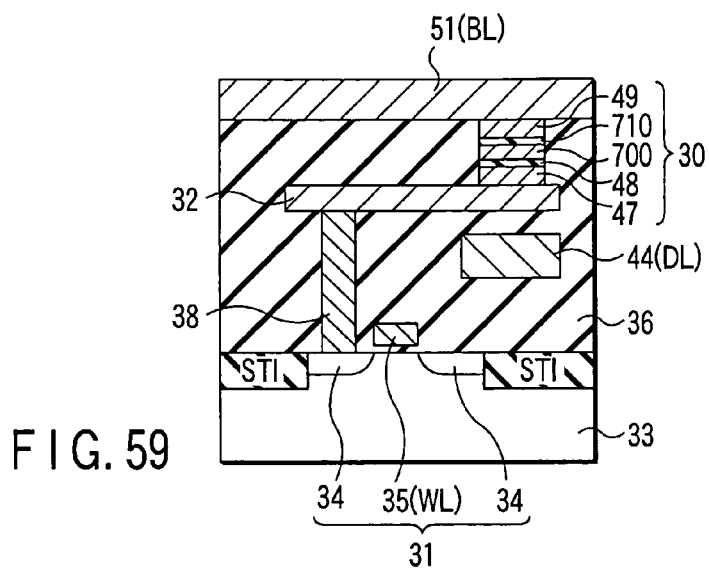
FIG. 59 is a cross-sectional view of a memory cell provided in an MRAM according to a first modification of the first to ninth embodiments of this invention.

FIG. 59 is a cross-sectional view of a memory cell of a semiconductor memory device according to a first modification of the first to ninth embodiments. As shown in FIG. 59, in the structure of FIG. 4, a magnetic film 700 is formed on the insulating film 48, an insulating film 710 is formed on the magnetic film 700 and a magnetic film 49 is formed on the insulating film 710. Thus, a so-called double-junction structure is provided. The spin directions of the magnetic films 47, 49 are previously set in a preset direction so as to be made equal to each other. Then, "0" data or "1" data is written by setting the spin direction of the magnetic film 700 in parallel or anti-parallel to the magnetic films 47, 48. With the structure shown in FIG. 59, an MR ratio which is higher than that of the structure of FIG. 4 can be attained and the reliability is excellent in view of the data holding characteristic. The MR ratio is the ratio of resistances of the magneto-resistive element in the "0" data write state and "1" data write state.

Figure 60:
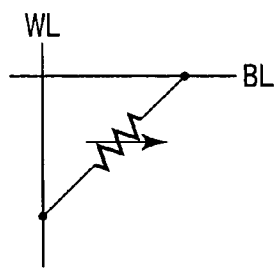
FIG. 60 is an equivalent circuit diagram of a memory cell provided in an MRAM according to a second modification of the first to ninth embodiments of this invention.
Figure 61:
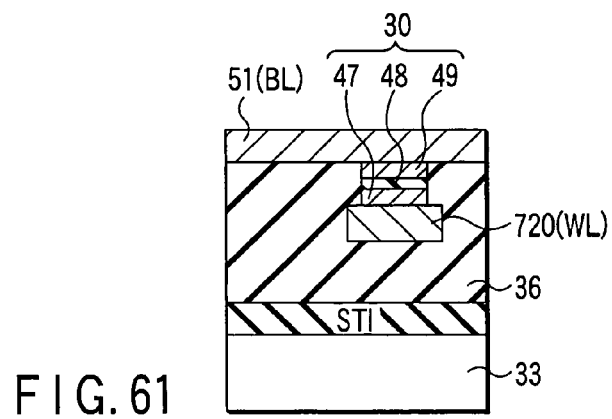
FIGS. 61 and 62 are cross-sectional views of memory cells provided in the MRAM according to the second modification of the first to ninth embodiments of this invention.
Figure 62:
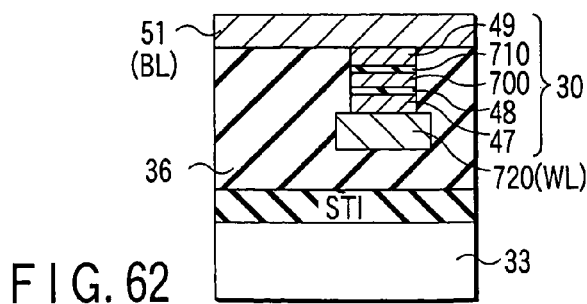

FIGS. 60, 61 show memory cells of a semiconductor memory device according to a second modification of the first to ninth embodiments, FIG. 60 being an equivalent circuit diagram and FIG. 61 being a cross-sectional view. As shown in the drawing, the MRAM cell is configured only by a magneto-resistive element. That is, a metal wiring layer 720 used as the word line WL is formed in the inter-level insulating film 36 formed on the silicon substrate 33. A magneto-resistive element having a structure which has an insulating film 48 sandwiched between the magnetic films 47 and 49 is disposed on the metal wiring layer 720. Further, a metal wiring layer 51 used as the bit line BL is formed on the magnetic film 49 to extend in a direction perpendicular to the word lines WL. In the case of such a cross-point type memory cell, the double-junction structure can be used as shown in the cross-sectional view of FIG. 62.

Figure 63:
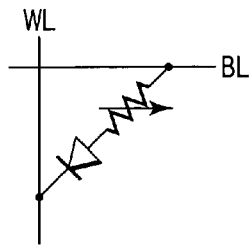
FIG. 63 is an equivalent circuit diagram of a memory cell provided in an MRAM according to a third modification of the first to ninth embodiments of this invention.
Figure 65:
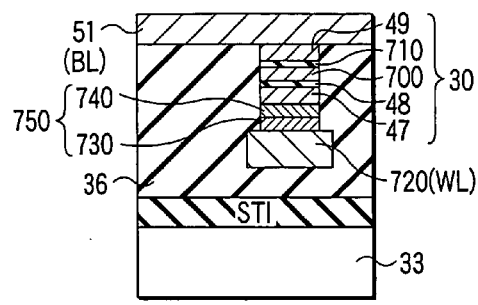
FIGS. 64 and 65 are cross-sectional views of memory cells provided in the MRAM according to the third modification of the first to ninth embodiments of this invention.
Figure 64:
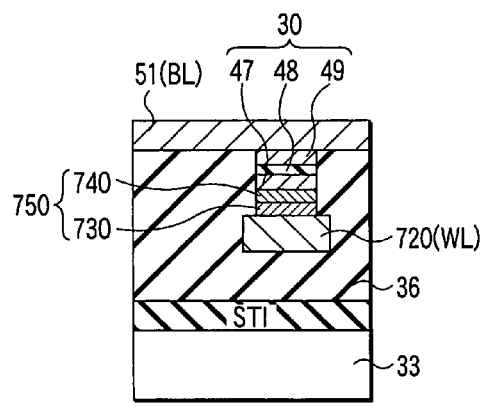

FIGS. 63, 64 show memory cells of a semiconductor memory device according to a third modification of the first to ninth embodiments, FIG. 63 being an equivalent circuit diagram and FIG. 64 being a cross-sectional view. As shown in the drawing, a memory cell is formed of a combination of a magneto-resistive element and a rectifier element (diode). That is, in the structure shown in FIG. 61, a diode 65 is inserted in series with the magneto-resistive element between the word line WL and the bit line BL by forming an n-type semiconductor layer 730 and p-type semiconductor layer 740 between the metal wiring layer 720 used as the word lines WL and the magnetic film 47. Thus, even when the memory cell is formed of the magneto-resistive element and the rectifier element, the double-junction structure can be used as shown in the cross-sectional view of FIG. 65.

Figure 67:
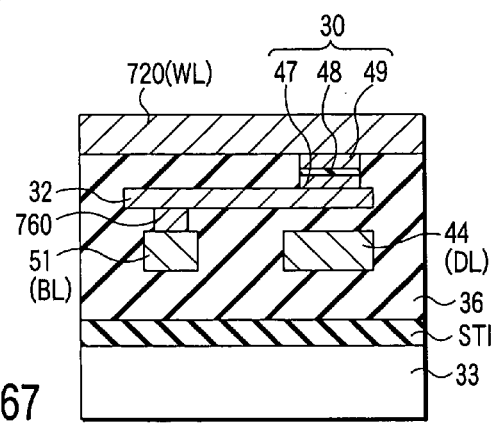
FIGS. 67 and 68 are cross-sectional views of memory cells provided in the MRAM according to the fourth modification of the first to ninth embodiments of this invention.
Figure 66:
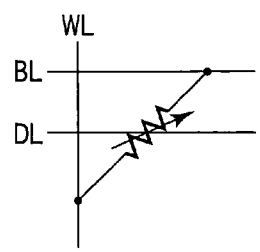
FIG. 66 is an equivalent circuit diagram of a memory cell provided in an MRAM according to a fourth modification of the first to ninth embodiments of this invention.
Figure 68:
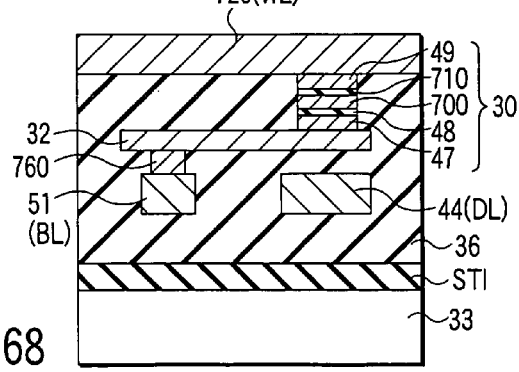

FIGS. 66, 67 show memory cells of a semiconductor memory device according to a fourth modification of the first to ninth embodiments, FIG. 66 being an equivalent circuit diagram and FIG. 67 being a cross-sectional view. As shown in the drawing, a memory cell is of a cross-point type and has a digit line DL. That is, a metal wiring layer 51 used as the bit line BL is formed in the inter-level insulating film 36 formed on the silicon substrate 33. Further, a metal wiring layer 44 used as the digit line DL is formed in the same level as that of the bit line BL and disposed parallel to the bit line BL. Further, in the inter-level insulating film 36, a magneto-resistive element 30 is connected to the bit line BL via the metal wiring layers 760, 32 and formed close to the digit line DL. The magneto-resistive element 30 includes a magnetic film 47 formed on the metal wiring layer 32, an insulating film 48 formed on the magnetic film 47, and a magnetic film 49 formed on the insulating film 48. The metal wiring layer 720 used as the word line WL is formed on the inter-level insulating film 36 so as to be electrically connected to the magnetic film 49 and is disposed to extend in a direction perpendicular to the digit line DL. Of course, with the above structure, the double-junction structure can be used as shown in FIG. 68.

Figure 69:
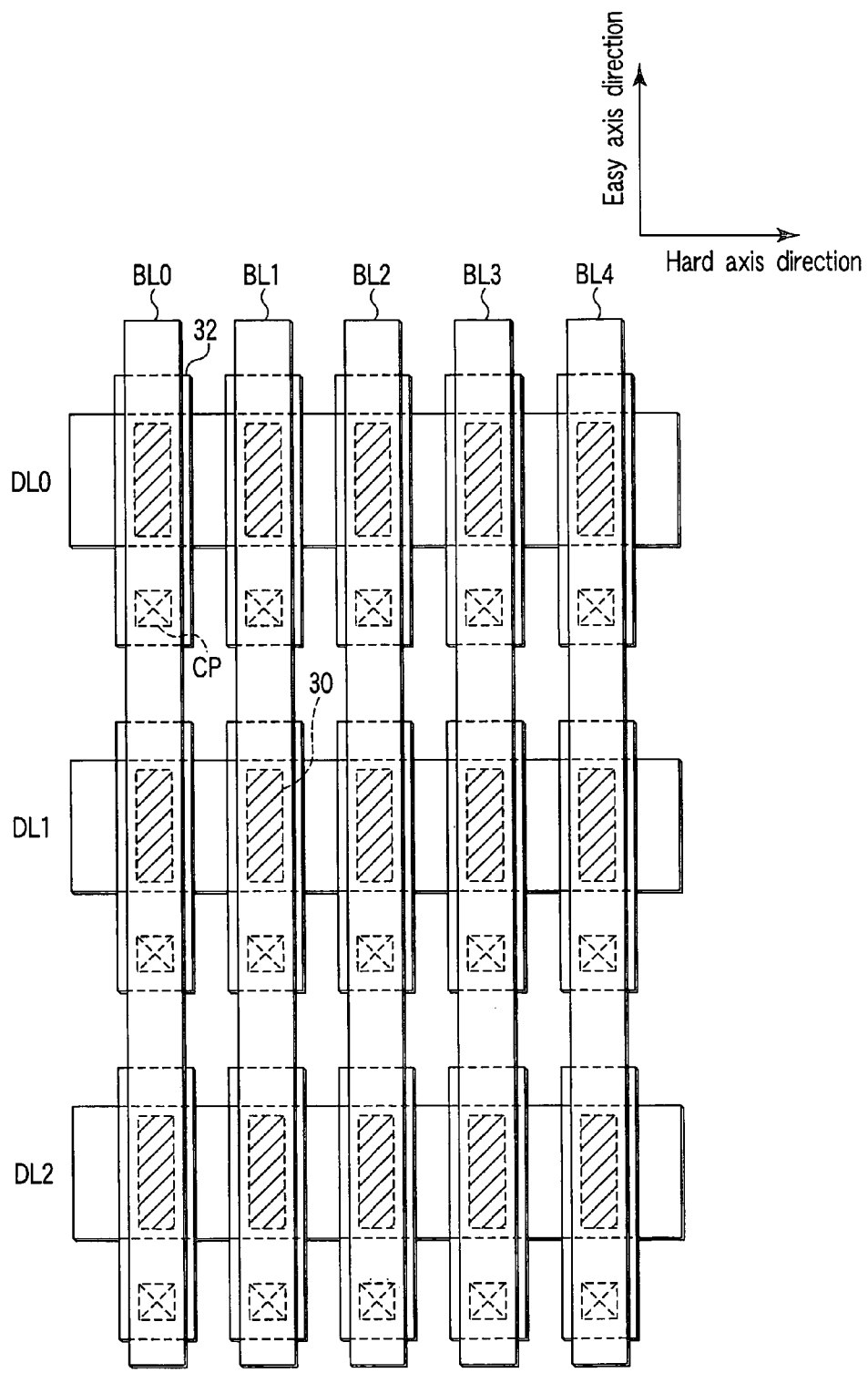
FIG. 69 is a plan view of a memory cell array provided in the MRAM according to a fifth modification of the first to ninth embodiments of this invention.

FIG. 69 is a plan view of a semiconductor memory device according to a fifth modification of the first to ninth embodiments. In the first to ninth embodiments, a case wherein the bit lines BL are formed in the hard axis direction and the digit lines DL are formed in the easy axis direction is explained. Therefore, data written into the memory cell is controlled according to the direction of a current flowing in the bit line BL. However, as shown in FIG. 69, the bit lines BL can be formed in the easy axis direction and the digit lines DL can be formed in the hard axis direction. In this case, data written into the memory cell is controlled according to the direction of a current flowing in the digit line DL.

Figure 70:
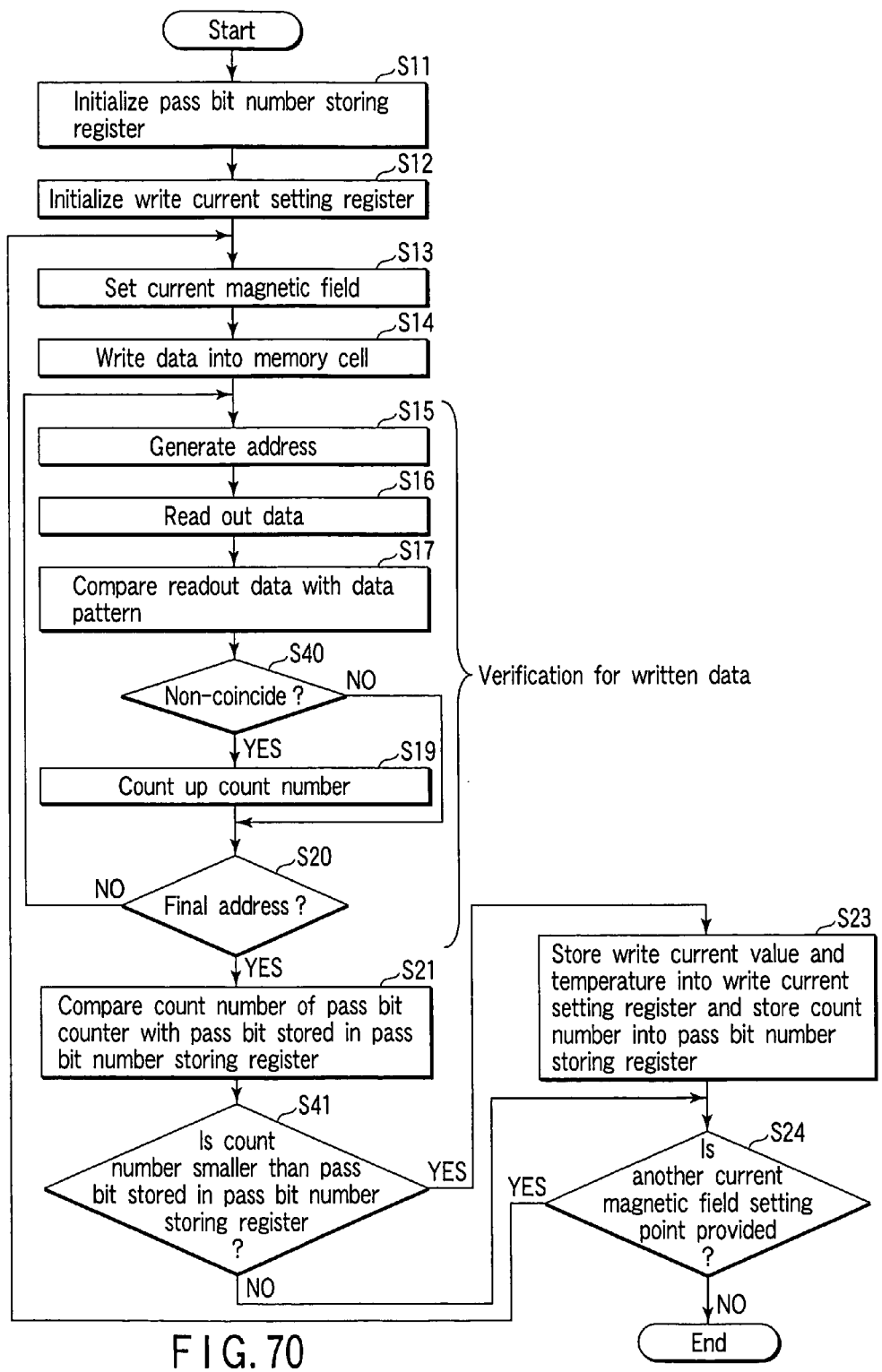
FIG. 70 is a flowchart showing a process for setting an optimum write current in an MRAM according to a modification of the ninth embodiment of this invention.

FIG. 70 is a flowchart showing a process for setting an optimum write current in an MRAM according to the modification of the ninth embodiment. In the ninth embodiment, the number of memory cells into which data is successfully written is counted and a write current corresponding to the maximum count number is set as an optimum current value. However, as shown in FIG. 70, it is also possible to count the number of memory cells in which data writing fails and set a write current corresponding to the minimum count number as an optimum current value.

In FIG. 45, the MRAM 10 may include a plurality of the memory cell blocks 300.

The above embodiments of the present invention have many different implementations. A few of these implementations are shown in FIGS. 71–79.

Figure 71:
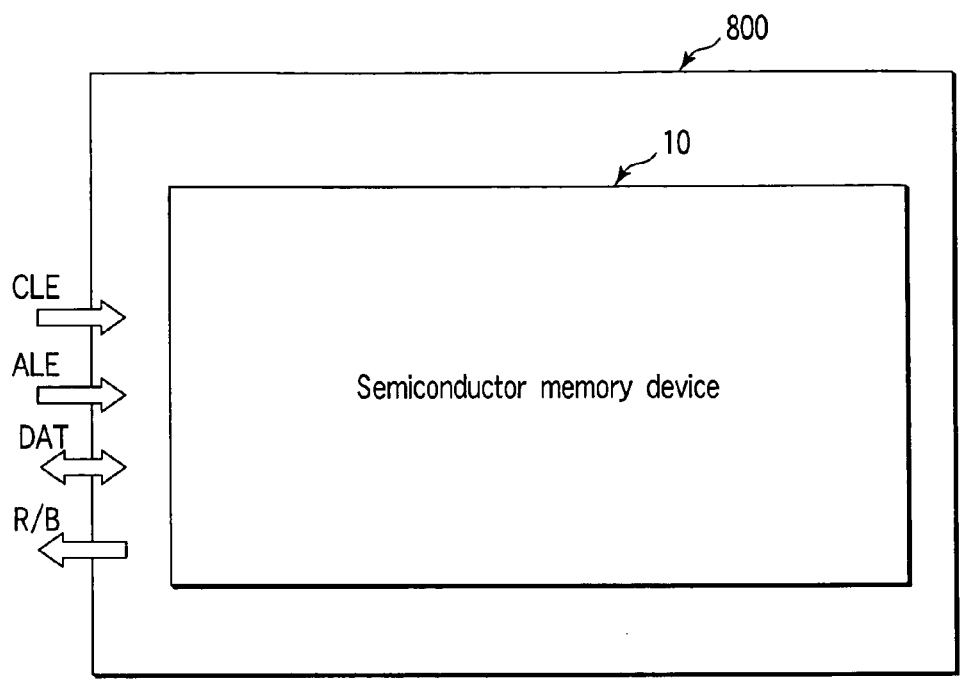
FIG. 71 and FIG. 72 are block diagram showing an illustrative internal structure of a memory card in accordance with an embodiment of the present invention.

In one example, shown in FIG. 71, a memory card 800 includes the semiconductor memory device 10 as disclosed in, for example FIG. 45. As shown in FIG. 800, the memory card 800 is operable to receive/output predetermined signals and data from/to an external device (not shown).

A signal line (DAT), a command line enable signal line (CLE), an address line enable signal line (ALE) and a ready/busy signal line (R/B) are connected to the memory card 800 having the semiconductor memory device 10. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device 10 is ready, or not.

Figure 72:
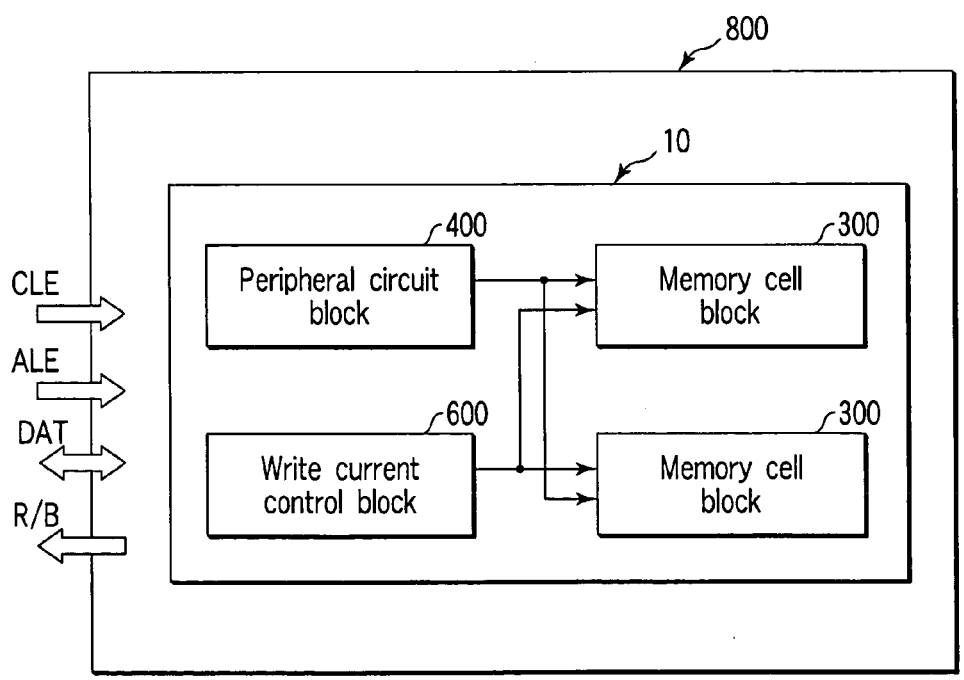

Of course, the memory card may comprise a plurality of the memory cell blocks, as shown in FIG. 72. The peripheral block 400 and write current control block control the plurality of the memory cell blocks.

Figure 73:
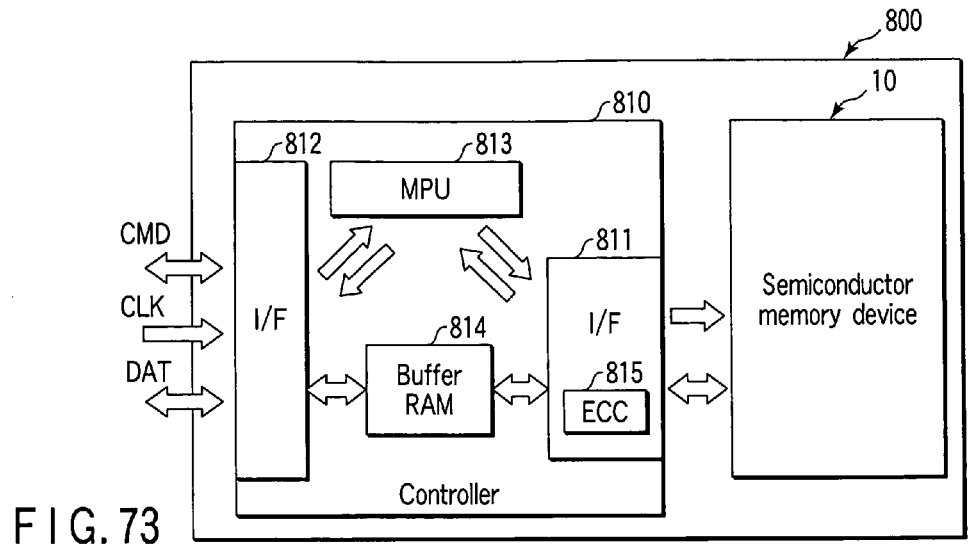
FIG. 73 and FIG. 74 are block diagram showing an illustrative internal structure of a memory card in accordance with an embodiment of the present invention.

Another exemplary implementation is shown in FIG. 73. The memory card shown in FIG. 73 differs from the memory card presented in FIG. 70 in that the memory card 800 of FIG. 73 includes, in addition to the memory device 10, a controller 810 which controls the semiconductor memory device 800 and receives/transfers predetermined signals from/to an external device (not shown).

Figure 74:
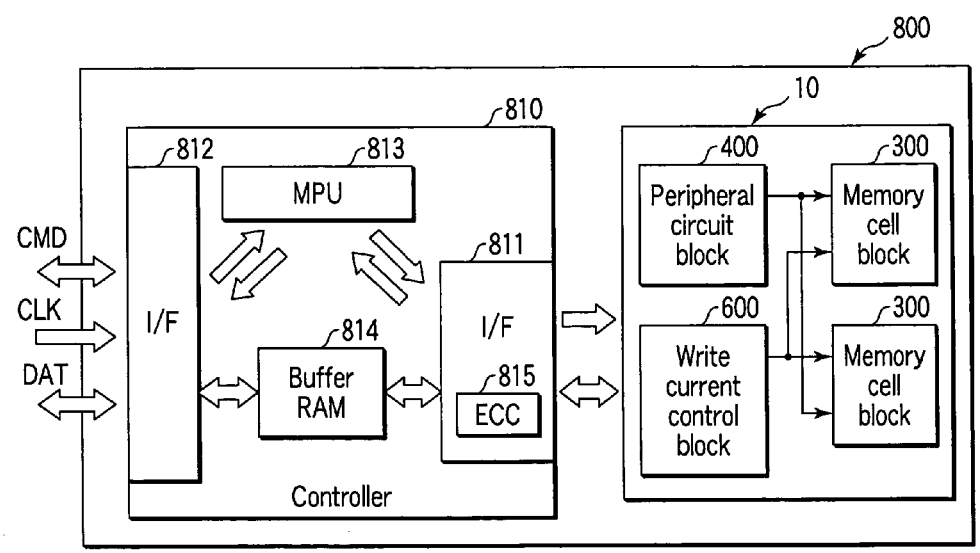

The controller 810 includes an interface unit (I/F) 811, 812, a microprocessor unit (MPU) 813, a buffer RAM 814 and an error correction code unit (ECC) 815. The interface unit (I/F) 811, 812 receives/outputs predetermined signals from/to an external device (not shown) and the semiconductor memory device 800, respectively. The microprocessor unit 813 converts a logical address into a physical address. The buffer RAM 814 stores data temporarily. The error correction code unit 815 generates an error correction code. A command signal line (CMD), a clock signal line (CLK) and a signal line (DAT) are connected to the memory card 800. It should be noted that the number of the control signal lines, bit width of the signal line (DAT) and a circuit construction of the controller 810 could be modified suitably. As shown in FIG. 74, the memory card 800 may includes a plurality of the memory cell blocks 300. The peripheral circuit block 400 and write current control block both control a plurality of the memory cell blocks 300.

Figure 75:
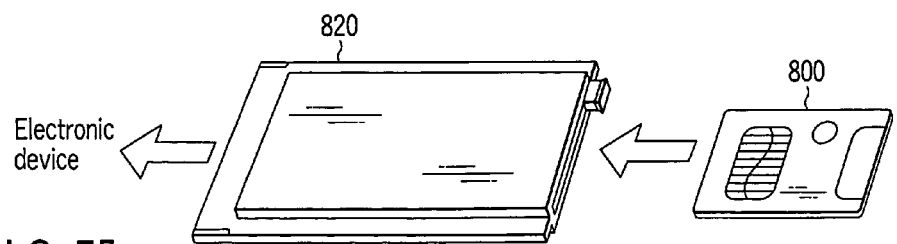
FIG. 75 is an illustrative example of cardholder and a memory card in accordance with an embodiment of the present invention.

Another exemplary implementation is shown in FIG. 75. As can be seen from FIG. 75, a memory cardholder 820 is provided for receiving a memory card 800 having a memory device 10. The cardholder 820 is connected to an electronic device (not shown) and is operable as an interface between the card 800 and the electronic device. The cardholder 820 may perform one or more of the functions of the controller 810 described in connection with FIG. 73.

Another exemplary implementation will be explained with reference to FIG. 76. FIG. 76 shows a connecting apparatus operable to receive a memory card or a cardholder, either of which includes the memory device. The memory card or cardholder is insertable in the connecting apparatus 900 and is electrically connectable to the apparatus. The connecting apparatus 900 is connected to a board 930 via a connecting wire 910 and an interface circuit 920. The board 930 contains a CPU (Central Processing Unit) 940 and a bus 950.

Another exemplary implementation is shown in FIG. 77. As shown in FIG. 77, a memory card 800 or a cardholder 820, either of which includes the memory device 10, is inserted and electrically connectable to a connecting apparatus 900. The connecting apparatus 900 is connected to a PC (Personal Computer) 1000 via connecting wire 910.

Figure 78:
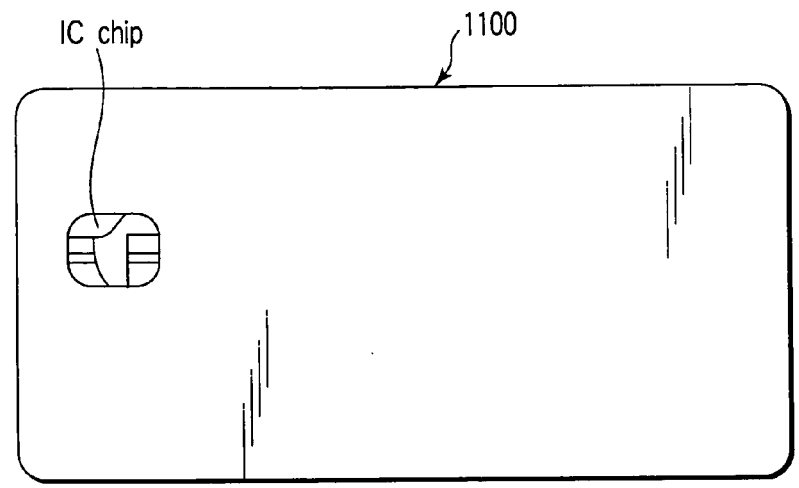
FIG. 78 shows an IC card in accordance with an embodiment of the present invention.
Figure 79:
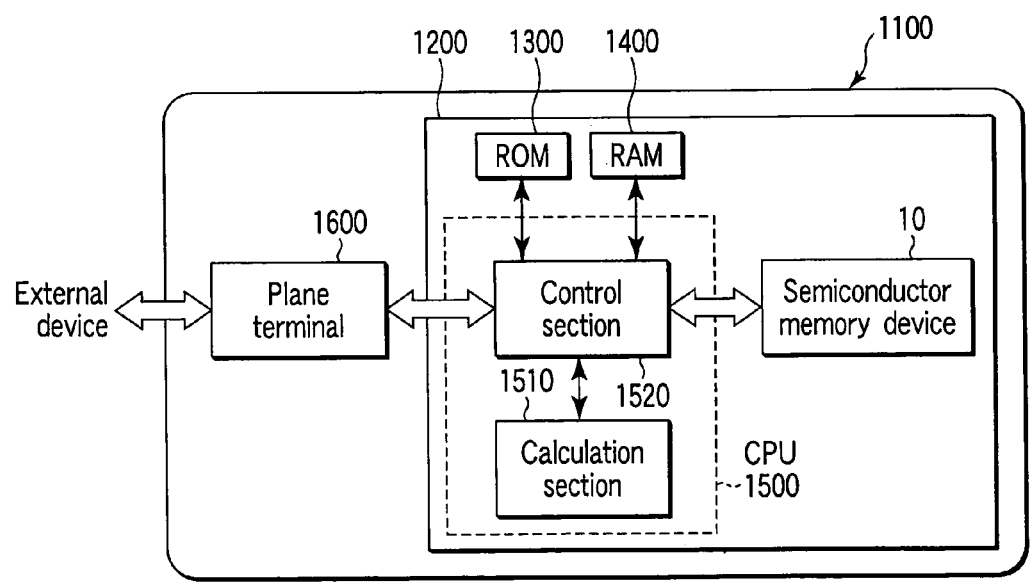
FIG. 79 is a block diagram of an IC card in accordance with an embodiment of the present invention.

Another exemplary implementation is shown in FIGS. 78 and 79. As shown in FIGS. 78 and 79, a semiconductor memory device 10 as shown in, for example FIG. 45 and other circuits such as ROM (read only memory) 1300, RAM (random access memory) 1400 and CPU (central processing unit) 1500 are included in an IC (interface circuit) card 1100. The IC card 1100 is connectable to an external device via a plane terminal 1600 that is coupled to an MPU (microprocessing unit) portion 1200 of the card 1100. The CPU 1500 contains a calculation section 1510 and a control section 1520, the control section 1520 being coupled to the memory device 10, the ROM 1300 and the RAM 1400. Preferably, the MPU 1200 is molded on one surface of the card 1100 and the plane connecting terminal 1600 is formed on the other surface. The memory device 10 in the card 1100 may comprise a plurality of the memory cell blocks.

Further, in the first, second embodiments and the modifications thereof, a case of the memory cell using the MTJ element is explained as an example, but it is also possible to use a memory cell using a GMR (Giant Magneto Resistive) element, CMR (Colossal Magneto Resistive) element, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   word lines formed along a first direction;
   bit lines formed along a second direction which intersects the first direction;
   memory cells including magneto-resistive elements and arranged at intersections of the word lines and the bit lines;
   a row decoder which selects at least one of the word lines;
   a column decoder which selects at least one of the bit lines; and
   a write circuit which supplies first and second write currents to a selected word line and selected bit line selected by the row decoder and column decoder respectively and writes data into a selected memory cell arranged at the intersection of the selected word line and the selected bit line, the write circuit including first and second current sources whose supply currents have different temperature dependencies, the first and second current sources being set to be one of an enable state and a disable state in accordance with an ambient temperature, at least one of current values of the first and second write currents being controlled in accordance with the supply currents of the first and second current sources.

2. The device according to claim 1, further comprising a write current setting circuit which searches for optimum current values of the first and second write currents according to a temperature;
a holding circuit which holds information relating to the current values of the first and second write currents obtained by the write current setting circuit together with temperature data; and
a readout circuit which reads out information held in the holding circuit according to a temperature,
wherein the write circuit supplies the first and second write currents based on the information read out from the holding circuit by the readout circuit.

3. The device according to claim 2, further comprising a data pattern generator which generates a data pattern to be written into the memory cell when optimum current values of the first and second write currents are searched for according to the temperature,
wherein the current setting circuit includes: a comparator circuit which compares the data pattern generated from the data pattern generator with readout data read out from the memory cell; and
a count circuit which counts the number of times which the result of comparison by the comparator circuit has indicated coincidence, and
the holding circuit holds information relating to current values of the first and second write currents obtained when the count number in the count circuit becomes maximum.

4. The device according to claim 1, wherein the current values of the first and second write currents are different from each other.

5. The device according to claim 1, wherein the write circuit changes a ratio of the current values of the first and second write currents according to a temperature.

6. A semiconductor memory device comprising:
word lines formed along a first direction;
bit lines formed along a second direction which intersects the first direction;
memory cells including magneto-resistive elements and arranged at intersections of the word lines and the bit lines;
a row decoder which selects at least one of the word lines;
a column decoder which selects at least one of the bit lines; and
a write circuit which respectively supplies first and second write currents to a selected word line and selected bit line selected by the row decoder and column decoder and writes data into a selected memory cell arranged at the intersection of the selected word line and the selected bit line; the write circuit including a plurality of first MOS transistors which generate the first write current and a plurality of second MOS transistors which generate the second write current, the number of transistors to be set in an ON state being changed in accordance with an ambient temperature at least in one of the first and second MOS transistors.

7. The device according to claim 6, wherein the write circuit
includes first and second current sources whose supply currents have different temperature dependencies, the first and second current sources are set to be one of an enable state and a disable state in accordance with an ambient temperature, and at least one of current values of the first and second write currents is controlled in accordance with the supply currents of the first and second current sources.

8. The device according to claim 6, further comprising a holding circuit which holds information of MOS transistors to be set in the ON state in the first and second MOS transistors for respective temperatures; and
a readout circuit which reads out information from the holding circuit according to a temperature to control ON/OFF states of the MOS transistors in the first and second MOS transistors.

9. The device according to claim 6, wherein the write circuit
further includes a plurality of third MOS transistors which supply the second write current from one end of the selected bit line,
the second MOS transistors supply the second write current from the other end of the selected bit line, and
the number of MOS transistors which are set in an ON state in the first to third MOS transistors decreases with a temperature rise.

10. The device according to claim 9, further comprising a holding circuit which holds information of MOS transistors to be set in the ON state in the first to third MOS transistors for respective temperatures; and
a readout circuit which reads out information from the holding circuit according to a temperature to control ON/OFF states of the MOS transistors in the first to third MOS transistors.

11. The device according to claim 9, further comprising a write current setting circuit which searches for optimum current values of the first and second write currents according to a temperature; and
a holding circuit which holds information relating to the current values of the first and second write currents obtained by the write current setting circuit together with temperature data, and a readout circuit which reads out information held in the holding circuit according to a temperature,
wherein the write circuit supplies the first and second write currents based on the information read out from the holding circuit by the readout circuit.

12. The device according to claim 11, further comprising a data pattern generator which generates a data pattern to be written into the memory cell when optimum current values of the first and second write currents are searched for according to the temperature,
wherein the current setting circuit includes a comparator circuit which compares the data pattern generated from the data pattern generator with readout data read out from the memory cell and
a count circuit which counts the number of times which the result of comparison by the comparator circuit has indicated coincidence, and
the holding circuit holds information relating to current values of the first and second write currents obtained when the count number in the count circuit becomes maximum.

13. The device according to claim 6, wherein the current values of the first and second write currents are different from each other.

14. The device according to claim 6, wherein the write circuit changes a ratio of the current values of the first and second write currents according to a temperature.

15. A control method of a semiconductor memory device comprising:
   holding data relating to optimum values of first and second write currents respectively supplied to one of a plurality of word lines formed along a first direction and one of a plurality of bit lines formed along a second direction which intersects the first direction to write data into one of memory cells which includes magneto-resistive elements and are respectively arranged at intersections of the word lines and the bit lines in a holding section according to temperatures;
   detecting a temperature at a write time;
   reading out data corresponding to the detected temperature from the holding section; and
   writing data into the memory cell by causing a word line current source and bit line current source to respectively supply first and second write currents of optimum values to the word line and bit line according to the data read out from the holding section.

16. The method according to claim 15, wherein the holding the data relating to the optimum values of the first and second write currents in the holding section according to temperatures includes:
   writing a data pattern generated from a data pattern generator into a memory cell array by use of a plurality of the first and second write currents;
   verifying data written into the memory cell and holding current values of the first and second write currents obtained when the number of memory cells into which data is correctly written becomes maximum in a first register together with temperature data; and
   changing a temperature and returning a process to the writing the data pattern into the memory cell array.

17. The method according to claim 16, further comprising initializing values of the first register and a second register before writing the data pattern into the memory cell array,
   wherein the word line current source and bit line current source generate the first and second write currents based on the value held in the first register in the writing the data pattern into the memory cell array and
   the verifying data written in the memory cell and holding the current values in the first register includes:
   reading out data from a memory cell included in the memory cell array;
   comparing data read out from the memory cell with the data pattern;
   causing a counter to count up a count number thereof when data read out from the memory cell coincides with the data pattern;
   comparing the count number of the counter with the value held in the second register after the comparing data and causing the counter to count up for a preset number of memory cells included in the memory cell array are terminated;
   rewriting the value of the second register into the count number of the counter and rewriting the value of the first register to a value corresponding to the current values of the first and second write currents used for the writing of the data pattern when the count number of the counter is larger than the value held in the second register; and
   changing the current values of the first and second write currents and returning a process to the writing the data pattern.

18. A memory card comprising at least one semiconductor memory cell block,
   the semiconductor memory cell block including:
   word lines formed along a first direction;
   bit lines formed along a second direction which intersects the first direction;
   memory cells including magneto-resistive elements and arranged at intersections of the word lines and the bit lines;
   a row decoder which selects at least one of the word lines;
   a column decoder which selects at least one of the bit lines; and
   a write circuit which supplies first and second write currents to a selected word line and selected bit line selected by the row decoder and column decoder respectively and writes data into a selected memory cell arranged at the intersection of the selected word line and the selected bit line, the write circuit including first and second current sources whose supply currents have different temperature dependencies, the first and second current sources being set to be one of an enable state and a disable state in accordance with an ambient temperature, at least one of current values of the first and second write currents being controlled in accordance with supply currents of the first and second current sources.

19. The card according to claim 18, further comprising a write current setting circuit which searches for optimum current values of the first and second write currents according to a temperature;
   a holding circuit which holds information relating to the current values of the first and second write currents obtained by the write current setting circuit together with temperature data;
   a readout circuit which reads out information held in the holding circuit according to a temperature; and
   a data pattern generator which generates a data pattern to be written into the memory cell when optimum current values of the first and second write currents are searched for according to the temperature,
   wherein the write circuit supplies the first and second write currents based on the information read out from the holding circuit by the readout circuit,
   the current setting circuit includes a comparator circuit which compares the data pattern generated from the data pattern generator with readout data read out from the memory cell; and
   a count circuit which counts the number of times which the result of comparison by
   the comparator circuit has indicated coincidence, and
   the holding circuit holds information relating to current values of the first and second write currents obtained when the count number in the count circuit becomes maximum.

20. A memory card comprising at least one semiconductor memory cell block,
   the semiconductor memory cell block including:
   word lines formed along a first direction;
   bit lines formed along a second direction which intersects the first direction;
   memory cells including magneto-resistive elements and arranged at intersections of the word lines and the bit lines;
   a row decoder which selects at least one of the word lines;

a column decoder which selects at least one of the bit lines; and a write circuit which respectively supplies first and second write currents to a selected word line and selected bit line selected by the row decoder and column decoder and writes data into a selected memory cell arranged at the intersection of the selected word line and the selected bit line; the write circuit including a plurality of first MOS transistors which generate the first write current and a plurality of second MOS transistors which generate the second write current, the number of transistors to be set in an ON state being changed in accordance with an ambient temperature at least in one of the first and second MOS transistors.

21. The card according to claim 20, further comprising a write current setting circuit which searches for optimum current values of the first and second write currents according to a temperature;

a holding circuit which holds information relating to the current values of the first and second write currents obtained in the current setting circuit together with temperature data;

a readout circuit which reads out the information held in the holding circuit according to a temperature; and a data pattern generator which generates a data pattern to be written into the memory cell when optimum current values of the first and second write currents are searched for according to the temperature;

wherein the write circuit supplies the first and second write currents based on the information read out from the holding circuit by the readout circuit, the current setting circuit includes a comparator circuit which compares the data pattern generated from the data pattern generator with readout data read out from the memory cell; and a count circuit which counts the number of times which the result of comparison by the comparator circuit has indicated coincidence, and the holding circuit holds information relating to current values of the first and second write currents obtained when the count number in the count circuit becomes maximum.

* * * * *